US008252663B2

(12) United States Patent
Fournel

(10) Patent No.: US 8,252,663 B2
(45) Date of Patent: Aug. 28, 2012

(54) METHOD OF TRANSFERRING A THIN LAYER ONTO A TARGET SUBSTRATE HAVING A COEFFICIENT OF THERMAL EXPANSION DIFFERENT FROM THAT OF THE THIN LAYER

(75) Inventor: Franck Fournel, Villard-Bonnot (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 64 days.

(21) Appl. No.: 12/817,784

(22) Filed: Jun. 17, 2010

(65) Prior Publication Data
US 2010/0323497 A1    Dec. 23, 2010

(30) Foreign Application Priority Data
Jun. 18, 2009    (FR) .................................... 09 54126

(51) Int. Cl.
H01L 21/30    (2006.01)
(52) U.S. Cl. ................................ 438/458; 257/E21.211
(58) Field of Classification Search .................. 438/455, 438/458; 257/E21.211
See application file for complete search history.

(56) References Cited

U.S. PATENT DOCUMENTS

| | | |
|---|---|---|
| 3,901,423 A | 8/1975 | Hillberry et al. |
| 3,915,757 A | 10/1975 | Engel |
| 3,957,107 A | 5/1976 | Altoz et al. |
| 3,993,909 A | 11/1976 | Drews et al. |
| 4,006,340 A | 2/1977 | Gorinas |
| 4,028,149 A | 6/1977 | Deines et al. |
| 4,039,416 A | 8/1977 | White |

(Continued)

FOREIGN PATENT DOCUMENTS
DE    101 53 319 A1    5/2003
(Continued)

OTHER PUBLICATIONS

Agarwal et al, "Efficient Production of Silicon-On-Insulator Films by Co-Implantation of HE+ with H+", Applied Physics Letters, vol. 72, No. 9, 1998, pp. 1086-1088.

(Continued)

Primary Examiner — Charles Garber
Assistant Examiner — Reema Patel
(74) Attorney, Agent, or Firm — Brinks Hofer Gilson & Lione

(57) ABSTRACT

A method of transferring a thin layer from a source substrate having a surface layer of a first material along a free surface thereof to a target substrate having at least one surface layer of a second material along a free surface thereof, where the first material differs from the second material, includes forming within the surface layer of the source substrate a weakened zone delimiting a thin layer with respect to the free surface, and assembling the free surface of the source substrate to the free surface of the target substrate in a stack of alternating layers comprising the first and second materials, so that there are, on either side of an interface formed by bringing the free surfaces into intimate contact. The cumulative thicknesses of the layers of the first material are substantially equal to the cumulative thickness of the layers of the second material, the layers having thicknesses at least equal to 50 microns and at least 1000 times the depth at which the weakened zone is formed. The thin layer is detached by applying at least partially thermal energy to fracture the weakened zone.

10 Claims, 5 Drawing Sheets

U.S. PATENT DOCUMENTS

| | | | |
|---|---|---|---|
| 4,074,139 A | 2/1978 | Pankove | |
| 4,107,350 A | 8/1978 | Berg et al. | |
| 4,108,751 A | 8/1978 | King | |
| 4,121,334 A | 10/1978 | Wallis | |
| 4,170,662 A | 10/1979 | Weiss et al. | |
| 4,179,324 A | 12/1979 | Kirkpatrick | |
| 4,244,348 A | 1/1981 | Wilkes | |
| 4,252,837 A | 2/1981 | Auton | |
| 4,254,590 A | 3/1981 | Eisele et al. | |
| 4,274,004 A | 6/1981 | Kanai | |
| 4,342,631 A | 8/1982 | White et al. | |
| 4,346,123 A | 8/1982 | Kaufmann | |
| 4,361,600 A | 11/1982 | Brown | |
| 4,368,083 A | 1/1983 | Bruel et al. | |
| 4,412,868 A | 11/1983 | Brown et al. | |
| 4,452,644 A | 6/1984 | Bruel et al. | |
| 4,468,309 A | 8/1984 | White | |
| 4,471,003 A | 9/1984 | Cann | |
| 4,486,247 A | 12/1984 | Ecer et al. | |
| 4,490,190 A | 12/1984 | Speri | |
| 4,500,563 A | 2/1985 | Ellenberger et al. | |
| 4,508,056 A | 4/1985 | Bruel et al. | |
| 4,536,657 A | 8/1985 | Bruel | |
| 4,539,050 A | 9/1985 | Kramler et al. | |
| 4,542,863 A | 9/1985 | Larson | |
| 4,566,403 A | 1/1986 | Fournier | |
| 4,567,505 A | 1/1986 | Pease | |
| 4,568,563 A | 2/1986 | Jackson et al. | |
| 4,585,945 A | 4/1986 | Bruel et al. | |
| 4,630,093 A | 12/1986 | Yamaguchi et al. | |
| 4,684,535 A | 8/1987 | Heinecke et al. | |
| 4,704,302 A | 11/1987 | Bruel et al. | |
| 4,717,683 A | 1/1988 | Parrillo et al. | |
| 4,764,394 A | 8/1988 | Conrad | |
| 4,832,253 A | 5/1989 | Kloucek et al. | |
| 4,837,172 A | 6/1989 | Mizuno et al. | |
| 4,846,928 A | 7/1989 | Dolins et al. | |
| 4,847,792 A | 7/1989 | Barna et al. | |
| 4,853,250 A | 8/1989 | Boulos et al. | |
| 4,887,005 A | 12/1989 | Rough et al. | |
| 4,891,329 A | 1/1990 | Reisman et al. | |
| 4,894,709 A | 1/1990 | Phillips et al. | |
| 4,904,610 A | 2/1990 | Shyr | |
| 4,920,396 A | 4/1990 | Shinohara et al. | |
| 4,929,566 A | 5/1990 | Beitman | |
| 4,931,405 A | 6/1990 | Kamijo et al. | |
| 4,948,458 A | 8/1990 | Ogle | |
| 4,952,273 A | 8/1990 | Popov | |
| 4,956,698 A | 9/1990 | Wang | |
| 4,960,073 A | 10/1990 | Suzuki et al. | |
| 4,975,126 A | 12/1990 | Margail et al. | |
| 4,982,090 A | 1/1991 | Wittmaack | |
| 4,996,077 A | 2/1991 | Moslehi et al. | |
| 5,013,681 A * | 5/1991 | Godbey et al. | 438/459 |
| 5,015,353 A | 5/1991 | Hubler et al. | |
| 5,034,343 A | 7/1991 | Rouse et al. | |
| 5,036,023 A | 7/1991 | Dautremont-Smith et al. | |
| 5,110,748 A | 5/1992 | Sarma | |
| 5,120,666 A | 6/1992 | Gotou | |
| 5,131,968 A | 7/1992 | Wells et al. | |
| 5,138,422 A | 8/1992 | Fujii et al. | |
| 5,198,371 A | 3/1993 | Li | |
| 5,200,805 A | 4/1993 | Parsons et al. | |
| 5,232,870 A | 8/1993 | Ito et al. | |
| 5,234,535 A * | 8/1993 | Beyer et al. | 438/459 |
| 5,242,863 A | 9/1993 | Xiang-Zheng et al. | |
| 5,250,446 A | 10/1993 | Osawa et al. | |
| 5,256,581 A | 10/1993 | Foerstner et al. | |
| 5,259,247 A | 11/1993 | Bantien | |
| 5,280,819 A | 1/1994 | Newkirk et al. | |
| 5,300,788 A | 4/1994 | Fan et al. | |
| 5,310,446 A | 5/1994 | Konishi et al. | |
| 5,374,564 A | 12/1994 | Bruel | |
| 5,400,458 A | 3/1995 | Rambosek | |
| 5,405,802 A * | 4/1995 | Yamagata et al. | 438/459 |
| 5,413,951 A * | 5/1995 | Ohori et al. | 438/479 |
| 5,442,205 A | 8/1995 | Brasen et al. | |
| 5,494,835 A | 2/1996 | Bruel | |
| 5,524,339 A | 6/1996 | Gorowitz et al. | |
| 5,539,241 A | 7/1996 | Abidi et al. | |
| 5,559,043 A | 9/1996 | Bruel | |
| 5,567,654 A | 10/1996 | Beilstein, Jr. et al. | |
| 5,611,316 A | 3/1997 | Oshima et al. | |
| 5,618,739 A | 4/1997 | Takahashi et al. | |
| 5,622,896 A | 4/1997 | Knotter et al. | |
| 5,633,174 A | 5/1997 | Li | |
| 5,661,333 A | 8/1997 | Bruel et al. | |
| 5,714,395 A * | 2/1998 | Bruel | 438/528 |
| 5,741,733 A | 4/1998 | Bertagnolli et al. | |
| 5,753,038 A | 5/1998 | Vichr et al. | |
| 5,804,086 A | 9/1998 | Bruel | |
| 5,811,348 A * | 9/1998 | Matsushita et al. | 438/455 |
| 5,817,368 A | 10/1998 | Hashimoto | |
| 5,854,123 A | 12/1998 | Sato et al. | |
| 5,863,830 A | 1/1999 | Bruel et al. | |
| 5,863,832 A | 1/1999 | Doyle et al. | |
| 5,877,070 A | 3/1999 | Goesele et al. | |
| 5,880,010 A | 3/1999 | Davidson | |
| 5,882,987 A * | 3/1999 | Srikrishnan | 438/458 |
| 5,897,331 A | 4/1999 | Sopori | |
| 5,909,627 A | 6/1999 | Egloff | |
| 5,920,764 A | 7/1999 | Hanson et al. | |
| 5,953,622 A | 9/1999 | Lee et al. | |
| 5,966,620 A * | 10/1999 | Sakaguchi et al. | 438/455 |
| 5,981,400 A | 11/1999 | Lo | |
| 5,985,412 A | 11/1999 | Gösele | |
| 5,993,677 A | 11/1999 | Biasse et al. | |
| 5,994,207 A | 11/1999 | Henley et al. | |
| 6,010,591 A | 1/2000 | Gösele | |
| 6,013,563 A | 1/2000 | Henley et al. | |
| 6,013,954 A | 1/2000 | Hamajima | |
| 6,020,252 A | 2/2000 | Aspar et al. | |
| 6,033,974 A | 3/2000 | Henley et al. | |
| 6,048,411 A | 4/2000 | Henley et al. | |
| 6,054,363 A * | 4/2000 | Sakaguchi et al. | 438/406 |
| 6,054,370 A | 4/2000 | Doyle | |
| 6,057,212 A | 5/2000 | Chan et al. | |
| 6,071,795 A | 6/2000 | Cheung et al. | |
| 6,080,640 A | 6/2000 | Gardner et al. | |
| 6,096,433 A | 8/2000 | Kikuchi et al. | |
| 6,103,597 A | 8/2000 | Aspar et al. | |
| 6,103,599 A | 8/2000 | Henley et al. | |
| 6,118,181 A | 9/2000 | Merchant et al. | |
| 6,127,199 A | 10/2000 | Inoue | |
| 6,146,979 A | 11/2000 | Henley et al. | |
| 6,150,239 A | 11/2000 | Goesele et al. | |
| 6,156,215 A | 12/2000 | Shimada et al. | |
| 6,159,323 A | 12/2000 | Joly et al. | |
| 6,190,998 B1 | 2/2001 | Bruel et al. | |
| 6,197,695 B1 | 3/2001 | Joly et al. | |
| 6,198,159 B1 | 3/2001 | Hosoma et al. | |
| 6,200,878 B1 | 3/2001 | Yamagata et al. | |
| 6,204,079 B1 | 3/2001 | Aspar et al. | |
| 6,225,190 B1 | 5/2001 | Bruel et al. | |
| 6,225,192 B1 | 5/2001 | Aspar et al. | |
| 6,251,754 B1 | 6/2001 | Ohshima et al. | |
| 6,256,864 B1 | 7/2001 | Gaud et al. | |
| 6,271,101 B1 | 8/2001 | Fukunaga | |
| 6,276,345 B1 | 8/2001 | Nelson et al. | |
| 6,287,940 B1 | 9/2001 | Cole et al. | |
| 6,294,478 B1 | 9/2001 | Sakaguchi et al. | |
| 6,303,468 B1 | 10/2001 | Aspar et al. | |
| 6,306,720 B1 | 10/2001 | Ding | |
| 6,310,387 B1 | 10/2001 | Seefeldt et al. | |
| 6,316,333 B1 | 11/2001 | Bruel et al. | |
| 6,323,108 B1 | 11/2001 | Kub et al. | |
| 6,323,109 B1 * | 11/2001 | Okonogi | 438/459 |
| 6,346,458 B1 | 2/2002 | Bower | |
| 6,362,077 B1 | 3/2002 | Aspar et al. | |
| 6,362,082 B1 | 3/2002 | Doyle et al. | |
| 6,407,929 B1 | 6/2002 | Hale et al. | |
| 6,417,075 B1 | 7/2002 | Haberger et al. | |
| 6,429,094 B1 | 8/2002 | Maleville et al. | |
| 6,429,104 B1 | 8/2002 | Auberton-Herve | |
| 6,465,892 B1 | 10/2002 | Suga | |
| 6,485,533 B1 | 11/2002 | Ishizaki et al. | |
| 6,504,235 B2 | 1/2003 | Schmitz et al. | |

| | | |
|---|---|---|
| 6,513,564 B2 | 2/2003 | Bryan et al. |
| 6,529,646 B1 | 3/2003 | Wight et al. |
| 6,534,380 B1 * | 3/2003 | Yamauchi et al. ............ 438/455 |
| 6,548,375 B1 | 4/2003 | De Los Santos et al. |
| 6,593,212 B1 * | 7/2003 | Kub et al. ..................... 438/458 |
| 6,596,569 B1 | 7/2003 | Bao et al. |
| 6,607,969 B1 | 8/2003 | Kub et al. |
| 6,632,082 B1 | 10/2003 | Smith |
| 6,645,831 B1 | 11/2003 | Shaheen et al. |
| 6,645,833 B2 | 11/2003 | Brendel |
| 6,653,207 B2 | 11/2003 | Ohya et al. |
| 6,727,549 B1 | 4/2004 | Doyle |
| 6,756,285 B1 | 6/2004 | Moriceau et al. |
| 6,756,286 B1 * | 6/2004 | Aspar et al. .................. 438/459 |
| 6,762,076 B2 | 7/2004 | Kim et al. |
| 6,764,936 B2 | 7/2004 | Daneman et al. |
| 6,770,507 B2 * | 8/2004 | Abe et al. ........................ 438/64 |
| 6,774,010 B2 | 8/2004 | Chu et al. |
| 6,809,009 B2 | 10/2004 | Aspar et al. |
| 6,828,214 B2 * | 12/2004 | Notsu et al. ................... 438/455 |
| 6,846,690 B2 | 1/2005 | Farcy et al. |
| 6,887,769 B2 | 5/2005 | Kellar et al. |
| 6,893,936 B1 | 5/2005 | Chen et al. |
| 6,902,987 B1 | 6/2005 | Tong et al. |
| 6,927,147 B2 | 8/2005 | Fitzgerald et al. |
| 6,946,365 B2 | 9/2005 | Aspar et al. |
| 6,947,365 B2 | 9/2005 | Lai et al. |
| 6,974,759 B2 | 12/2005 | Moriceau et al. |
| 6,991,956 B2 * | 1/2006 | Ghyselen et al. ............... 438/46 |
| 7,018,909 B2 | 3/2006 | Ghyselen et al. |
| 7,029,548 B2 | 4/2006 | Aspar et al. |
| 7,029,980 B2 | 4/2006 | Liu et al. |
| 7,052,978 B2 | 5/2006 | Shaheen et al. |
| 7,067,396 B2 | 6/2006 | Aspar et al. |
| 7,078,811 B2 | 7/2006 | Suga |
| RE39,484 E | 2/2007 | Bruel |
| 7,256,075 B2 | 8/2007 | Ghyselen et al. |
| 7,348,260 B2 | 3/2008 | Ghyselen |
| 7,416,957 B2 | 8/2008 | Ponomarev |
| 7,459,374 B2 | 12/2008 | Aulnette et al. |
| 7,465,646 B2 * | 12/2008 | Le Vaillant .................... 438/458 |
| 7,476,596 B2 | 1/2009 | Lieber et al. |
| 7,494,897 B2 | 2/2009 | Fournel et al. |
| 7,498,234 B2 | 3/2009 | Aspar et al. |
| 7,521,292 B2 | 4/2009 | Rogers et al. |
| 7,534,701 B2 | 5/2009 | Ghyselen et al. |
| 7,550,052 B2 | 6/2009 | Fournel et al. |
| 7,615,463 B2 | 11/2009 | Aspar et al. |
| 7,670,930 B2 | 3/2010 | Tauzin et al. |
| 7,713,369 B2 | 5/2010 | Aspar et al. |
| 7,772,087 B2 | 8/2010 | Nguyen et al. |
| 7,883,994 B2 | 2/2011 | Moriceau et al. |
| 7,902,038 B2 | 3/2011 | Aspar et al. |
| 2001/0007367 A1 | 7/2001 | Ohkubo |
| 2001/0007789 A1 | 7/2001 | Aspar et al. |
| 2002/0000646 A1 | 1/2002 | Gooch et al. |
| 2002/0025604 A1 | 2/2002 | Tiwari |
| 2002/0048948 A1 | 4/2002 | Gang |
| 2002/0081861 A1 | 6/2002 | Robinson et al. |
| 2002/0083387 A1 | 6/2002 | Miner et al. |
| 2002/0145489 A1 | 10/2002 | Cornett et al. |
| 2002/0153563 A1 | 10/2002 | Ogura |
| 2002/0185469 A1 | 12/2002 | Podlesnik et al. |
| 2002/0185684 A1 | 12/2002 | Campbell et al. |
| 2003/0001221 A1 | 1/2003 | Fischer et al. |
| 2003/0077885 A1 | 4/2003 | Aspar et al. |
| 2003/0119279 A1 | 6/2003 | Enquist |
| 2003/0119280 A1 | 6/2003 | Lee et al. |
| 2003/0134488 A1 | 7/2003 | Yamazaki et al. |
| 2003/0134489 A1 | 7/2003 | Schwarzenbach et al. |
| 2003/0162367 A1 | 8/2003 | Roche |
| 2003/0199105 A1 | 10/2003 | Kub et al. |
| 2003/0234075 A1 | 12/2003 | Aspar et al. |
| 2004/0009649 A1 | 1/2004 | Kub et al. |
| 2004/0029358 A1 | 2/2004 | Park et al. |
| 2004/0126708 A1 | 7/2004 | Jing et al. |
| 2004/0144487 A1 | 7/2004 | Martinez et al. |
| 2004/0150006 A1 | 8/2004 | Aulnette et al. |
| 2004/0157409 A1 | 8/2004 | Ghyselen et al. |
| 2004/0171232 A1 | 9/2004 | Cayrefoureq et al. |
| 2004/0209441 A1 | 10/2004 | Maleville et al. |
| 2004/0222500 A1 | 11/2004 | Aspar et al. |
| 2004/0235266 A1 | 11/2004 | Tong |
| 2004/0262686 A1 | 12/2004 | Shaheen et al. |
| 2005/0029224 A1 | 2/2005 | Aspar et al. |
| 2005/0042842 A1 | 2/2005 | Lei et al. |
| 2005/0067377 A1 | 3/2005 | Lei et al. |
| 2005/0112845 A1 | 5/2005 | Ghyselen et al. |
| 2005/0148122 A1 | 7/2005 | Yonehara |
| 2005/0148163 A1 | 7/2005 | Nguyen et al. |
| 2005/0183882 A1 * | 8/2005 | Yun et al. ....................... 174/250 |
| 2005/0215071 A1 | 9/2005 | Moriceau et al. |
| 2005/0250294 A1 | 11/2005 | Ghyselen |
| 2005/0269671 A1 | 12/2005 | Faure et al. |
| 2006/0128117 A1 | 6/2006 | Ghyselen et al. |
| 2006/0191627 A1 | 8/2006 | Aspar et al. |
| 2006/0205179 A1 | 9/2006 | Fournel et al. |
| 2006/0252229 A1 | 11/2006 | Joly et al. |
| 2006/0281212 A1 | 12/2006 | Moriceau et al. |
| 2007/0017438 A1 | 1/2007 | Xie et al. |
| 2007/0020895 A1 | 1/2007 | Moriceau et al. |
| 2007/0037363 A1 | 2/2007 | Aspar et al. |
| 2007/0087525 A1 * | 4/2007 | Chen et al. .................... 438/429 |
| 2007/0087526 A1 | 4/2007 | Chhaimi et al. |
| 2007/0087528 A1 | 4/2007 | Kim et al. |
| 2007/0128840 A1 | 6/2007 | Chen et al. |
| 2007/0202660 A1 | 8/2007 | Moriceau et al. |
| 2007/0231931 A1 | 10/2007 | Ecarnot et al. |
| 2007/0259528 A1 | 11/2007 | Moriceau et al. |
| 2007/0281445 A1 | 12/2007 | Nguyen et al. |
| 2008/0017306 A1 | 1/2008 | Liu et al. |
| 2008/0020547 A1 | 1/2008 | Kostrzewa et al. |
| 2008/0254591 A1 | 10/2008 | Deguet et al. |
| 2009/0120568 A1 * | 5/2009 | Deguet et al. ................. 156/250 |
| 2009/0130392 A1 | 5/2009 | Aspar et al. |
| 2009/0156016 A1 | 6/2009 | Di Cioccio |
| 2010/0025228 A1 | 2/2010 | Tauzin et al. |
| 2010/0167499 A1 | 7/2010 | Fournel et al. |
| 2010/0216294 A1 | 8/2010 | Rabarot et al. |
| 2011/0129988 A1 * | 6/2011 | Signamarcheix et al. .... 438/458 |

FOREIGN PATENT DOCUMENTS

| | | |
|---|---|---|
| EP | 0 355 913 A1 | 2/1990 |
| EP | 0 383 391 A1 | 8/1990 |
| EP | 0 410 679 A1 | 1/1991 |
| EP | 0 504 714 A2 | 9/1992 |
| EP | 0 533 551 A1 | 3/1993 |
| EP | 0 293 049 B1 | 9/1993 |
| EP | 0 660 140 A1 | 6/1995 |
| EP | 0 665 588 A1 | 8/1995 |
| EP | 0 703 609 A1 | 3/1996 |
| EP | 0 754 953 B1 | 1/1997 |
| EP | 0 786 801 A1 | 7/1997 |
| EP | 0 793 263 A2 | 9/1997 |
| EP | 0 801 419 A1 | 10/1997 |
| EP | 0 807 970 A1 | 11/1997 |
| EP | 0 849 788 A2 | 6/1998 |
| EP | 0 889 509 A2 | 1/1999 |
| EP | 0 895 282 A2 | 2/1999 |
| EP | 0 898 307 A1 | 2/1999 |
| EP | 0 917 193 A1 | 5/1999 |
| EP | 0 938 129 A1 | 8/1999 |
| EP | 0 902 843 B1 | 3/2000 |
| EP | 0 989 593 A2 | 3/2000 |
| EP | 0 994 503 A1 | 4/2000 |
| EP | 1 050 901 A2 | 11/2000 |
| EP | 1 059 663 A2 | 12/2000 |
| EP | 1 096 259 A1 | 5/2001 |
| EP | 0 717 437 B1 | 4/2002 |
| EP | 0 767 486 B1 | 1/2004 |
| EP | 1 403 684 A1 | 3/2004 |
| EP | 0 925 888 B1 | 11/2004 |
| EP | 1 014 452 B1 | 5/2006 |
| FR | 2 558 263 A1 | 7/1985 |
| FR | 2 681 472 | 9/1991 |
| FR | 2 725 074 A1 | 3/1996 |
| FR | 95 08882 | 6/1996 |
| FR | 2 736 934 A1 | 1/1997 |

| | | |
|---|---|---|
| FR | 2 748 850 A1 | 11/1997 |
| FR | 2 748 851 A1 | 11/1997 |
| FR | 2 758 907 A1 | 7/1998 |
| FR | 2 767 416 A1 | 2/1999 |
| FR | 2 767 604 A1 | 2/1999 |
| FR | 2 771 852 A1 | 6/1999 |
| FR | 2 773 261 A1 | 7/1999 |
| FR | 2 774 510 A1 | 8/1999 |
| FR | 2 781 925 A1 | 2/2000 |
| FR | 2 789 518 A1 | 8/2000 |
| FR | 2 796 491 A1 | 1/2001 |
| FR | 2 797 347 A1 | 2/2001 |
| FR | 2 809 867 A1 | 12/2001 |
| FR | 2 819 099 A1 | 7/2002 |
| FR | 2 848 336 | 12/2002 |
| FR | 2 847 075 A1 | 5/2004 |
| FR | 2 848 337 | 6/2004 |
| FR | 2 861 497 A1 | 4/2005 |
| FR | 2 888 400 | 1/2007 |
| GB | 2 211 991 A | 7/1989 |
| JP | 53-104156 A | 9/1978 |
| JP | 58-031519 A | 2/1983 |
| JP | 59-054217 A | 3/1984 |
| JP | 61-129872 A | 6/1986 |
| JP | 62-265717 A | 11/1987 |
| JP | 101004013 | 1/1989 |
| JP | 01-128570 A | 5/1989 |
| JP | 01-169917 A | 7/1989 |
| JP | 08-017777 A | 1/1990 |
| JP | 04-199504 A | 7/1992 |
| JP | 07-254690 A | 10/1995 |
| JP | 07-302889 A | 11/1995 |
| JP | 08-133878 A | 5/1996 |
| JP | 09-213594 A | 8/1997 |
| JP | 09-307719 A | 11/1997 |
| JP | 10-163166 A | 6/1998 |
| JP | 10-233352 A | 9/1998 |
| JP | 11-045862 A | 2/1999 |
| JP | 11-074208 A | 3/1999 |
| JP | 11-087668 A | 3/1999 |
| JP | 11-145436 A | 5/1999 |
| JP | 11-233449 A | 8/1999 |
| JP | 11-317577 A | 11/1999 |
| RU | 128757 A1 | 6/2000 |
| WO | WO 95/20824 A1 | 8/1995 |
| WO | WO 99/08316 A1 | 2/1999 |
| WO | WO 99/35674 A1 | 7/1999 |
| WO | WO 99/39378 A1 | 8/1999 |
| WO | WO 00/48238 A1 | 8/2000 |
| WO | WO 00/63965 A1 | 10/2000 |
| WO | WO 01/11930 A2 | 2/2001 |
| WO | WO 01/43168 A2 | 6/2001 |
| WO | WO 02/05344 A1 | 1/2002 |
| WO | WO 02/47156 A1 | 6/2002 |
| WO | WO 02/083387 A1 | 10/2002 |
| WO | WO 02/084721 A1 | 10/2002 |
| WO | WO 02/084722 A1 | 10/2002 |
| WO | WO 03/013815 A1 | 2/2003 |
| WO | WO 03/021667 A2 | 3/2003 |
| WO | WO 03/032384 A1 | 4/2003 |
| WO | WO 03/063213 A2 | 7/2003 |
| WO | WO 2004/001810 A2 | 12/2003 |
| WO | WO 2004/042779 A2 | 5/2004 |
| WO | WO 2004/044976 A1 | 5/2004 |
| WO | WO 2004/059711 A1 | 7/2004 |
| WO | WO 2004/061944 A1 | 7/2004 |
| WO | WO 2004/064146 A1 | 7/2004 |
| WO | WO 2005/000733 A2 | 1/2005 |
| WO | WO 2005/001915 A2 | 1/2005 |
| WO | WO 2005/013318 A2 | 2/2005 |
| WO | WO 2005/019094 A1 | 3/2005 |
| WO | WO 2005/043615 A1 | 5/2005 |
| WO | WO 2005/043616 A1 | 5/2005 |
| WO | WO 2007/020351 A1 | 2/2007 |
| WO | WO 2007/036631 A1 | 4/2007 |
| WO | WO 2007/110515 A2 | 10/2007 |
| WO | WO 2008/093008 A2 | 8/2008 |
| WO | WO 2009/087290 A1 | 7/2009 |

OTHER PUBLICATIONS

Agarwal, Aditya et al. "Efficient Production of Silicon-On-Insulator Films by Co-Implantation of He$^+$ with H$^+$"—Proceedings 1997 IEEE International SOI Conference, Oct. 1997—pp. 44-45.

Ahn, K. Y., et al., "Growth, Shrinkage, and Stability of Interfacial Oxide Layers Between Directly Bonded Silicon Wafers", *Applied Physics A.*, vol. 50, 1990, pp. 85-94.

Alley et al., "Surface Roughness Modification of Interfacial Contacts in Polysilicon Microstructures", Proceedings of the 7$^{th}$ International Conference on Solid-State Sensors and Actuators, *Transducers '93*, Pacifico, Yokohama Japan. Jun. 7-10, 1993, pp. 288-291.

Almedia et al. "Bond formation in ion beam synthesized amorphous gallium nitride", *Elsevier, This Solid Films*, 343-344 1999, pp. 632-636.

Ascheron, C., "A Comparative Study of Swelling, Radiation, Strain and Radiation Damage of High-Energy Proton-bombarded GaAs, GaP, InP, Sl and Ge Single Crystals, Nuclear Instruments and Methods in Physics Research", *Nuclear Instruments and Methods in Physics Research* B36, (1989), 163-172.

Ascheron, C., "A Study of Proton Bombardment Induced Swelling of GaP Single Crystals", *Phys. stat. sol.* (a) 92, (1985), pp. 169-176.

Ascheron, C., "Gettering a Copper in Proton-and Helium-Bombarded Buried Regions of Gallium Phosphide", *Phys. stat. sol.* (a), vol. 106, 1988, pp. 73-79.

Ascheron, C., "Investigations of Hydrogen Implanted GaP Single Crystals by Means of Particle Induced 7-Spectroscopy, Infrared Spectroscopy, and Turyherford Backscattering Channeling Technique" *Phys. stat. sol.* (a) 89, (1985), pp. 549-557.

Ascheron, C., "Proton Beam Modification of Selected AIIIBV Compounds", *Phys. stat. sol.* (a) 124, (1991), pp. 11.

Ascheron, C., "Swelling, Strain, and Radiation Damage of He+ Implanted GaP", *Phys. stat. sol.* (a) 96, 1986, pp. 555-562. (1986).

Asheron, C., "The Effect of Hydrogen Implantation Induced Stress on GaP Single Crystals", *Nuclear Instruments and Methods in Physics Research*, B28 (1987), pp. 350-359.

Aspar et al., "The Generic Nature of the Smart-Cut © Process for Thin-Film Transfer", *Journal of Electronic Materials*, vol. 30, No. 7, Mar. 2001, pp. 834-840.

Aspar et al., Smart-Cut®: The basic fabrication process for UNIBOND® SOI wafers, *SEMI* 1996, pp. 37-46.

Aspar, B. "Basic Mechanisms Involved in the Smart-Cut Process", 1997, pp. 223-240.

Aspar, B. et al, "Characterization of SOI substrates: Application to Recent SIMOX and UNIBOND Wafers," *Electrochemical Society Proceedings*, vol. 96-3, pp. 99-111.

Aspar, B. et al, "Transfer of Structured and Patterned Thin Silicon Films Using the Smart-Cut Process", 1996, pp. 1985-1986.

Aspar, B. Et al., "Ultra Thin Buried Oxide Layers Formed by Low Dose SIMOX Processes", Proc. 6$^{th}$ International Conference on SOI Technology and Devices, *Electro. Soc.*, vol. 94, No. 11, 1994, pp. 62.

Aspar, B. et al., "Smart Cut—Process Using Metallic Bonding: Application to Transfer of Si, GaAs, InP Thin Films", Electronic Letters—Jun. 10, 1999, vol. 35, No. 12, pp. 1024-1025.

Ashurst et al., "Water Level Anti-Stiction Coatings for MEMS", Sensors and Actuators A104, Apr. 23, 2003, pp. 213-221.

Auberton-Herve, A. J. et al, "A New Sal Material: Smart-Cut", 1996, pp. 214-219.

Auberton-Herve, A.J. et al, "SOI Materials for ULSI Applications", *Semiconductor International*, Oct. 1995, 5 pps.

A. J. Auberton-Hervé, Silicon-On-Insulator, *European Semiconductor*, Mar. 1997, pp. 17 and 18.

A. J. Auberton-Hervé, "Why Can Smart Cut® Change the Future of Microelectronics?," Published in International Journal of High Speed Electronics and Systems, vol. 10, No. 1 (2000) pp. 131-146.

Ayguavives et al., "Physical Properties of (Ba,Sr) TiO$_3$ Thin Films Used for Integrated Capacitors in Microwave Applications", IEEE 2001.

Blanchard-Lagahe C. et al., "Hydrogen and Helium Implantation to Achieve Layer Transfer" vol. 19, pp. 346-358, Apr. 2003, *Semiconductor Wafer Bonding VII: Science, Technology, and Applications—Proceedings of the International Symposium*.

Blöchl P.E. et al., First-Principles Calculations of Diffusion Coefficients: Hydrogen in Silicon, *Physical Review Letters*, vol. 64, No. 12, 1990, pp. 1401-1404.

Borgati, Stephen P., "The Root-Mean-Square", Boston College, Nov. 16, 1998, Obtained from the Internet at: <http://www.analytictech.com/mb313/rootmean.htm>.

Bruel, M. et al., (vol. 99-1) Meeting Abstract No. 333, "Single Crystal Semiconductor Layer Delamination and Transfer Through Hydrogen Implantation", The 195th Meeting of the Electrochemical Society, May 2-6, 1999, Seattle, Washington.

Bruel, Michel, "Application of Hydrogen Ion Beams to Silicon on Insulator Material Technology", *Nuclear Instruments and Methods in Physics Research*, B108, 1996, pp. 313-319.

Bruel, M. et al., "Smart-Cut: A New Silicon on Insulator Material Technology Based on Hydrogen Implantation and Wafer Bonding", 1997, pp. 1636-164, Col. 36, Part 1, No. 3B.

Bruel, M. et al, "Smart-Cut": A Promising New SOI material technology, *Proceedings 1994 IEEE, International Sal Conference*, Oct. 1995, pp. 178-179.

Bruel, M. et al, "Smart-Cut—a new SOI Material Technology based on hydrogen Implantation and wafer bonding," *CEA*, 1996, 26 pages.

Camperi-Ginestet et al., "Alignable Epitaxial Liftoff of GaAs Materials With Selective Deposition Using Polyimide Diaphragms", *IEEE Transactions Photonics Technology Letters*, vol. 3, No. 12, 1991, pp. 1123-1126.

Canham et al. "Radiative Recombination Channels due to Hydrogen in Crystalline Silicon", *Materials Science and Engineering*, B4 (1989) pp. 41-45.

Carter et al., "Applications of Ion Beams to Materials", *Inst. Phys. Conf. Ser.*, No. 28, Chapter 1, 1976, pp. 30-36.

Carter, G. et al., The Collection of Ions Implanted in Semiconductors: II Range Distributions Derived From Collection and Sputter-Etch Curves, *Radiation Effects*, 1972, vol. 16, pp. 107-114.

Cassidy, Victor M., "Ion Implantation Process Toughens Metalworking Tools," *Modern Metals*, 1984, pp. 65-67.

Caymax et al., High-Mobility Group-IV Materials and Devices, Materials Research Society, Symposium Proceedings, vol. 809, 2004.

Cerofolini et al., "Hydrogen-Related Complexes as the Stressing Species in High-Fluence, Hydrogen-Implanted, Single-Crystal Silicon" *Physical Review B*, vol. 46, No. 4, 1992, pp. 2061-2070.

Cerofini et al., "Ultradense Gas Bubbles in Hydrogen-or-Helium-Implanted (or Co-Implanted) Silicon", *Materials Science and Engineering*, B71, 2000, pp. 196-202.

Cerofolini et al., "Hydrogen and Helium Bubbles in Silicon", *Material Science and Engineering 2000*—Reports: A Review Journal, Published by Elsevier Science S.A. 2000, pp. 1-52.

Chu et al, "Radiation Damage of 50-250 keV Hydrogen Ions in Silicon", *Ion Implantation in Semiconductors*, eds. F. Chernob et al., Plenum New York 1976, pp. 483-492.

Chu, et al. "Ion Implantation in Semiconductors", Chernow, Borders and Brice, Pirnum Press, New York and London. Radiation Damage of 50-250 keV Hydrogen Ions in Silicon, 1976, pp. 483-491.

Chu, P.K. et al., "Plasma Immersion Ion Implantation—A Fledgling Technique for Semiconductor Processing", Materials Science and Engineering Reports, *A Review Journal*, vol. R17, Nos. 6-7, Nov. 30, 1996, pp. 207-280.

Cowern, N. et al., "Transport Diffusion of Ion-Implanted B in Si: Dose, Time, and Matrix Dependence of Atomic and Electrical Profiles", *J. Appl. Phys.*, vol. 68, No. 12, 1990, pp. 6191-6198.

Cristoloveanu, S. et al, "Electrical Properties of Unibond Material", *Electrochemical Society Proceedings*, vol. 96-3, pp. 142-147.

Csepregi, L. et al. "Regrowth Behavior of Ion-Implanted Amorphous Layers on <111> Silicon", *Applied Physics Letters*, vol. 2, 1976, pp. 92-93.

Cullis, A.G. et al. Comparative study of annealed neon-, argon-, and krypton-ion implantation damage in silicon, *J. Appl. Phys.*, 49(10), Oct. 1978, pp. 5188-5198.

Dhara et al, "Mechanism of nanoblister formation in Ga+ self-ion implanted GaN nanowires", *Applied Physics Letters*, vol. 86, No. 20, 2005, p. 203199.

Deguet, C. et al., "*200 MM Germanium-On-Insulator (GEOI) Structures Realized From Epitaxial Wafers Using The Smart Cut™ Technology*", ECS 2005, Quebec, vol. 2005-05, 11 pgs.

Demeester, et al., "Epitaxial Lift-Off and Its Applications", *Semicond. Sci. Technol.*, vol. 8, 1993, pp. 1124-1135.

Denteneer, P. et al., Hydrogen Diffusion and Passivation of Shallow Impurities in Crystalline Silicon, *Materials Science Forum*, Trans Tech Publications, Switzerland, vols. 38-41, 1989, pp. 979-984.

Denteneer, P. et al., "Structure and Properties of Hydrogen-Impurity Pairs in Elemental Semiconductors", *Physical Review Letters*, vol. 62, No. 16, 1989, pp. 1884-1888.

Di Cioccio, L. et al., "*Silicon Carbide on Insulator Formation by the Smart Cut® Process*".—Materials Science and Engineering B46 (1997)—(pp. 349-356).

DiCioccio et al., "III-V Layer Transfer Onto Silicon and Applications", *Phys. Stat. Sol. (a)*, vol. 202, No. 4, 2005 pp. 509-515.

DiCioccio, et al.,"Silicon carbide on Insulator formation using the Smart Cut process", *Electronics Letters*, vol. 32, No. 12, Jun. 6, 1996, pp. 144-145.

Diem et al., "SOI 'SIMOX': From Bulk to Surface Micromachining, A New Age for Silicon Sensors and Actuators", *Sensors and Actuators*, vol. A 46-47, 1995, pp. 8-16.

Dirks, A. G. et al., "Columnar Microstructure in Vapor DEuroposited Thin Films ", *Thin Solid Films*, vol. 47, 1977, pp. 219-233.

Donohue et al., "Pulse-Extended Excimer Laser Annealing of Lead Zirconate Titanate Thin Films", Proceedings of the 12th International Symposium on Integrated Ferroelectrics, Aachen, Germany, Mar. 2000, *Integrated Ferroelectics*, vol. 31, pp. 285 to 296, 2000.

Duo, et al., "Comparison Between the different Implantation orders in H+ and He+ Co-implantation", *J. Phys. D. Appl. Phys.* vol. 34, 2001, pp. 477-482.

Duo, et al., "Evolution of Hydrogen and Helium Co-Implanted Single-Crystal Silicon During Annealing", 2001 American Institute Physics—Journal of Applied Physics, vol. 90, No. 8, Oct. 15, 2001, pp. 3780-3786.

Eaglesham, White, Feldman, Moriya and Jacobson, "Equilibrium Shape of Si," *Physical Review Letters*, vol. 70, No. 11, Mar. 15, 1993, pp. 1643-1646.

EerNisse, E., "Compaction of ion-implanted fused silica", *Journal of Applied Physics*, vol. 45, No. 1, Jan. 1974.

EerNisse, E.P., "Role of Integrated Lateral Stress in Surface Deformation of He-Implanted Surfaces" *Journal of Applied Physics*, vol. 48, No. 1, Jan. 1977, pp. 9-17.

Evans, J.H., "An Interbubble Fracture Mechanism of Blister Formation on Helium-Irradiated Metals" *Journal of Nuclear Materials*, 68, 1977, pp. 129-140.

Fujitsuka et al., "A New processing Technique to Prevent Stiction Using Silicon Selective Etching for SOT-MEMS", *Sensors and Actruators*, A97-98, Apr. 2002, pp. 716-719.

Garnier, D. M., "The Fabrication of a Partial Soi Substrate", Proceedings of the 9th International Symposium on Silicon on Isolator Technology and Devices, vol. 99, Chap. 54, 1990, 73-78.

Gerasimenko, N., "Infrared Absorption of Silicon Irradiated by Protons", *Phys. stat.sol. (b)* 90, (1978), pp. 689-695.

Ghandi, Sorab, "VLSI Fabrication Princiles-Silicon and Gallium Arsenide", *Rensselaer Polytechnic Institute*, 1983, John Wiley & Sons publishers, pp. 135.

Goesele et al., "Semiconductor Wafer Bonding", Science and Technology, ECS Series, *Annual Review of Material Science*, vol. 28, New Jersey, 1999, pp. 215-241.

Greenwald, A.C., "Pulsed-electron-beam annealing of ion-implantation damage", *J. Appl. Phys.* 50(2), Feb. 1978, pp. 783-786.

Grovenor, C.R.M., *Microelectronic Materials*, pp. 73-75 (1989).

Guilhalmenc, C. et al, "Characterization by Atomic Force Microscopy of the SOI Layer Topography in Low Dose SIMOX Materials", *Materials Science and Engineering*, B46, 1997, pp. 29-32.

Haisma et al., Silicon-on-Insulator Wafer Bonding-Wafer Thinning Technological Evaluations, *JAPANese Journal of Applied Physics*, 28, Aug. 1989, No. 8, Part 1, Tokyo, Japan, pp. 1426-1443.

Hamaguchi et al., "Device Layer Transfer Technique using Chemi-Mechanical Polishing", *JAPANese Journal of Applied Physics*, 23, Oct. 1984, No. 10, Part 2, Tokyo, Japan, pp. L815-L817.

Hamaguchi et al., "Novel LSI/SOI Wafer Fabrication Using Device Layer Transfer Technique", *Proc. IEDM*, 1985, pp. 688-691.

Hartmann, et al., "Reduced pressure-chemical vapor deposition of intrinsic and doped Ge layers on Si(001) for microelectronics and optoelectronics purposes", Journal of Crystal growth 274, Jan. 2005, 90-99.

Heistand et al., "Advances in Passive Integration for C/RC Arrays & Networks with Novel Thin & Thick Film Materials", 36$^{th}$ Nordic IMAPS Conference, Helsinki, 1999.

Hendrix et al., "Low-Temperature Process for High-Density Thin-Film Integrated Capacitors", International Conference on High-Density Interconnect and Systems Packaging, 2000.

Henttinen et al., "Mechanically Induced Si Layer Transfer if Hydrogen-Implanted Si-Wafers", *American Institute of Physics*, vol. 76, No. 17, 2000, pp. 2370-2372.

Huang, et al., Calculation of critical layer thickness considering thermal strain in $Si_{1-x}Ge_x$/Si strained-layer heterostructures, J. Appl. Phys. 83 (1), Jan. 1, 1998.

Hulett, D.M. et al., "Ion Nitriding and Ion Implantation: A Comparison," *Metal Progress*, 1985, pp. 18-21.

IBM Technical Disclosure Bulletin, *Isolation by Inert Ion Implantation*, 1986, vol. 29 No. 3, pp. 1416.

IBM Technical Disclosure Bulletin, *SOI Interposer Structure XP 000627972*, Jul. 1996, vol. 39 No. 7, pp. 1-5.

Jalaguier, E. et al., "*Transfer of Thin InP Films Onto Silicon Substrate by Proton Implantation Process*".—11$^{th}$ International Conference on Indium Phosphide and Related Materials May 16-20, 1999—Davos, Switzerland. (pp. 26-27).

Jalaguier, E. et al., "*Transfer of 3in GaAs Film on Silicon Substrate by Proton Implantation Process*". Feb. 1998, pp. 408-409.

Jaussaud, C. et al., Microstructure of Silicon Implanted With High Dose Oxygen Ions, *Appl. Phys. Lett.*, vol. 48, No. 11, 1985, pp. 1064-1066.

Jenei et al., "High-Q Inductors and Capacitors on Si Substrate", IEEE 2001.

Johnson, "High Fluence Deuteron Bombardment of Silicon", *Radiation Effects*, 1977, vol. 32, pp. 159-167.

Jones, K. S. et al., "A Systematic Analysis of Defects in Ion Implanted Silicon", *Applied Physics A.*, vol. 45, 1988 pp. 1-34.

Jones et al., "Enhanced elimination of implantation damage upon exceeding the solid solubility", *J. App. Phys.*, vol. 62, No. 10, 1987, pp. 4114-4117.

Kamada et al, Observation of Blistering and Amorphization on Germanium Surface After 450 keV Ar+ION Bombardment, *Radiation Effects*, vol. 28, 1976, pp. 43-48.

Kim et al., "A Porous-Si-based Novel Isolation Technology for Mixed-Signal Integrated Circuits", Symposium on VLSI Technology, 2000.

Klem, J.F., "Characteristics of Lift-Off Fabricated AlGaAs/InGaAs Single-Strained-Quantum Well Structures on Glass and Silicon Substrates", *Inst. Phys. Conf.* Ser. No. 96: Chapter 6, (1989), pp. 387-392.

Komarov et al., Crystallographic Nature and Formation Mechanisms of Highly Irregular Structure in Implanted and Annealed S1, Layers*Radiation Effects*, vol. 42, 1979, pp. 169-178.

Kucheyev et al., "Ion Implantation Into GaN", *Materials Science and Engineering*, vol. 33, 2001, pp. 51-107.

Laporte A. et al., "Charged Defects at the Interface Between Directly Bonded Silicon Wafers"—Applied Physics, vol. 36 (Sep. 1997) pp. 5502-5506-Part 1, No. 9A.

Letertre F. et al., "*Germanium-On-Insulator (GeOI) Structure Realized by the Smart Cut™ Technology*".—Mat. Res. Soc. Symp. Pros vol. 809 © 2004 Materials Research Society. (pp. 153-158).

Li, J., "Novel Semiconductor Substrate Formed by Hydrogen Ion Implantation into Silicon," Appl. Phys. Lett., vol. 55, No. 21, Nov. 20, 1989, pp. 2223-2224.

Ligeon, E., "Hydrogen Implantation in Silicon Between 1.5 and 60 KeV", *Radiation Effects 1976*, vol. 27, pp. 129-137.

Liu et al., "Investigation of Interface in Silicon-On-Insulator by Fractual Analysis", *Applied Surface Science*, vol. 187, Feb 28, 2002, pp. 187-191.

Liu et al. "Ion Implantation in GaN at Liquid-Nitoigen Temperature: Structural Characteristics and Amorphization", *Physical Review B of The American Physical Society*, vol. 57, No. 4, 1988, pp. 2530-2535.

Liu et al., "Integrated Thin Film Capacitor Arrays", International Conference on High Density Packaging and MCMs, 1999.

Lu, X., et al., "SOI Material Technology Using Plasma Immersion ION Implantation", Proceedings 1996 IEEE International SOI Conference, Oct. 1996, pp. 48-49.

Maleville, C. et al, "Physical Phenomena involved in the Smart-Cut Process", *Electrochemical Society Proceeding*, vol. 96-3, 1996—pp. 34-46.

Maleville, C. et al, "Wafer Bonding and Hi-Implantation Mechanisms Involved in The Smart-Cut Technology", 1997, pp. 14-19.

Manuaba, A., "Comparative Study on Fe32Ni36CrI4P12B 6 Metallic Glass and its Polycrystalline Modification bombarded by 2000 keV Helium Ions with High Fluence" *Nuclear Instruments and Methods*, (1982) pp. 409-419.

Mastrangelo, C. et al., "Suppression of Stiction in MEMS", *Proceedings of the Materials Research Society Seminar*, vol. 605, 2000, pp. 1-12.

Matsuda et al., "Large Diameter Ion Beam Implantation System," *Nuclear Instruments and Methods*, vol. B21, 1987, pp. 314-316.

Matsuo et al., "Abnormal solid solution and activation behavior in GA-implanted Si(100)", *Appl. Phys. Lett.*, vol. 51, No. 24, 1987, pp. 2037-2039.

Materne, A. et al., "Changes in Stress and Coercivity After Annealing of Amorphous Co (Zr, Nb) Thin Films DEuropesited by R. F. Sputtering", donloaded on Apr. 24, 2009, pp. 1752-1754.

Mishima, Y. and T. Yagishita, T. "Investigation of the bubble formation mechanism in a-Si:H films by Fourier-transform infrared microspectroscopy" *J. Appl. Phys.*, vol. 64, No. 8, Oct. 15, 1988, pp. 3972-3974.

Miyagawa, S. et al, "Helium Reemission During Implantation of Silicon Carbide", *J. Appl. Phys.*, 54 (5), May 1983, pp. 2302-2306.

Miyagawa, S., "Surface structure of silicon carbide Irradiated with helium ions with mono energy and continuous energy distributions" *J. Appl. Phys.* 53(12), Dec. 1982, pp. 8697-8705.

Monemar, B. "Shallow Impurities in Semiconductors 1998", Proceedings of the Third International Conference in Sweden, Aug. 10-12, 1988, No. 95, pp. 493-499.

Moreau, Wayne M., "Semiconductor Lithography, Principles, Practices, and Materials," Plenum Press, 1988. Table of Contents only.

Moriceau, H. et al, A New Characterization Process Used to Qualify SOI Films 1991 pp. 173-178.

Moriceau, H. et al, "A New Characterization Process Used to Qualify SOI Films", 1991 pp. 173-178.

Moriceau, H. et al. "Cleaning and Polishing as Key Steps for Smart-Cut SOI Process", Proceedings 1996 IEEE SOI Conference, Oct. 1996.

Moriceau, H. et al, "The Smart-Cut Process as a Way to Achieve Specific Film Thickness in Sal Structures", 1997, pages unknown.

Moriceau et al., (vol. 99-1) Meeting Abstract No. 405, "A New Characterization Process Used to Qualify SOI Films", The 195$^{th}$ Meeting of the Electrochemical Society, May 2-6, 1999, Seattle, Washington.

Motohiro et al. "*Geometrical Factors of Argon Incorporation in $SiO_2$ Films Deposited by ION Beam Sputtering*"—Thin Solid Films, Elsevier-Sequoia S.A. Lausanne, CH, vol. 120, No. 4—Oct. 1, 1984, pp. 313-327.

Munteanu, D. et al, "Detailed Characterization of Unibond Material", 1997, pp. 395-398.

Myers, D. R., "The effects of Ion-Implantation damage on the first order Raman spectra GaPa)" *J. Appl. Phys.* 54(9), Sep. 1977.

Nethling. J. et al, "Identification of Hydrogen Platelets in ProtonBombarded GaAs", 1985, pp. 941-945.

Nichols C. S et al., "Properties of Hydrogen in Crystalline Silicon Under Compression and Tension", *Physical Review Letters*, vol. 63, No. 10, 1989, pp. 1090-1093.

Nicoletti, S. et al., "Bi-Epitaxial YBCO Grain Boundry Josephson Junctions on SrTiO3 and Sapphire Substrates", *Physics C269*, 1996, pp. 255-267.

Ono et al., "Orientation Dependence of Flaking of Ion Irradiated Aluminum Single Crystals", *Japanese Journal of Applied Physics*, vol. 25, No. 10, 1986, pp. 1475-1480.

Paszti, E, "Flaking and Wave-Like Structure on Metallic Glasses Induced by MeV-Energy Helium Ions", *Nuclear Instruments and Methods*, vol. 209/210, (1983), pp. 273-280.

Picraux, S. Thomas et al., "Ion Implantation of Surfaces," *Scientific American*, vol. 252, No. 3, pp. 102-113 1985.

Pollentier, et al., "Fabrication of High-Radiance LEDs by Epitaxial Lift-Off", *SPIE*, vol. 1361, 1990, pp. 1056-1062.

Popov, V.P. et al., "Blistering on a Silicon Surface in the Process of Sequential Hydrogen/Helium ION Co-(plantation)"—Optoelectronics Instrumentation and Data Processing, No. 3, Apr. 5, 2001—pp. 90-98—2001.

Primak, W., "Impurity Effect in the Ionization Dilation of Vitreous Silica" *J. Appl. Phys.* 39(13) 1968.

Raineri, V. et al., "Silicon-on-insulator produced by helium implantation and thermal oxidation," Applied Phys. Lett., vol. 66 (26), Jun. 1995, pp. 3654-3656.

Ray et al. "*Effect of Reactive-Ion Bombardment on the Properties of Silicon Nitride and Oxynitride Films Deposited by Ion-Beam Sputtering*"—Journal of Applied Physics, vol. 75, No. 12, Jun. 15, 1994—pp. 8145-8152.

Renier, M. et al., "A New Low-Energy Ion Implanter for Bombardment of Cylindrical Surfaces," *Vacuum*, vol. 35, No. 12, pp. 577-578, 1985.

Roozeboom et al., "High-Value MOS Capacitor Arrays in Ultradeep Trenches in Silicon", *Microelectronic Engineering*, vol. 53, pp. 581 to 584, Elsevier Science 2000.

Roth, J., "Blistering and Bubble Formation" *Inst. Phys. Conf. Ser.* No. 28, 1976: Chapter 7, pp. 280-293.

Sah, Chih-Tang et al., "Deactivation of the Boron Acceptor in Silicon by Hydrogen," *Appl. Phys. Lett.* 43, (2), Jul. 1983, pp. 204-206.

Saint-Jacques R. G., "La Formation des Cloques", *Nuclear Instruments and Methods*, No. 209/210, North Holland Publishing Co., 1983, pp. 333-343.

Schnell et al., "Plasma Surface Texturization for Multicrystaline Silicon Solar Cells", *IEEE*, XXVIII, Photovoltaic Conference, 2000, pp. 367-370.

Shintani, A. et al., "Temperature dependence of stresses in chemical deposited vitreous films", *J. Appl. Phys.*, vol. 51, No. 8, 1980, pp. 4197.

Sioshansi, Piran, "Ion Beam Modification of Materials for Industry," *Thin Solid Film*, vol. 118, 1984, pp. 61-71.

Snyman, H. C., "Transmission Electron Microscopy of Extended Crystal Defects in Proton Bombarded and Annealed GaAs", *Radiation Effects*, 1983, vol. 69, pp. 199-230.

Snyman, H. C. et al, "Void Formation in Annealed Proton-Bombarded GaAs", 1981, pp. 243-245.

Stein, Myers and Follstaedt, "Infrared Spectroscopy of chemically bonded hydrogen at voids and defects in silicon", *J. Appl. Phys.* 73(b6), Mar. 15, 1993, pp. 2755-2764.

Stephen, D., "Investigation of Lattice Strain in Proton-Irradiated GaP by a Modified Auleytner Technique" *Phys. stat. sol.* (a) 87, 1985, pp. 589-596.

Sunkara et al., "Bulk synthesis of silicon nanowires using a low-temperature vapor-liquid-solid solution", *Applied Physics Letters*, vol. 79, No. 10, Sep. 3, 2001, pp. 1546-1548.

Suzuki et al., "High-Speed and Low Power n+-p+ Double-Gate SOI CMOS", *IEICE Trans. Electron.*, vol. E78-C, No. 4, 1995, pp. 360-367.

Sze, S.M., VLSI Technology, 2.sup.nd Ed., 1988, pp. 9-10.

Tan, T. Y. et al., "On Oxygen Precipitation Retardation/Recovery Phenomena, Nucleation Incubation Phenomena and the Exigent-Accomodation-Volume Factor of Precipitation", Proceedings of the 5th International Symposium on Silicon Materials Science and Technology, *Semiconductor Silicon 198 Electrochem. Soc.*, New Jersey, 1986, pp. 864-873.

Terada, K. et al., "A New Dram Cell With a Transistor on a Lateral Epitaxial Silicon Layer (Tole Cell)", *IEEE Transactions on Electron Device*, vol. 37, No. 9, 1990, pp. 2052-2057.

Terreault, Bernard, "Hydrogen Blistering of Silicon: Progress in Fundamental Understanding", *Phys. Stat. Sol.* (a) 204, No. 7, 2007, pp. 2129-2184.

Theodore, N. David et al., TFSOI With Improved Oxidation Resistance (To Reduce Isolation Induced Stresses and Leakage), Motorola Bulletin XP 000691920, *Technical Developments*, Nov. 1996, pp. 158-159.

Tillman et al., "Zero-Level Packaging for MEMS or MST Devices: The IRS Method", MEMS/Sensors, Advancing Microelectronics, pp. 37-39, Nov./Dec. 2000.

Timoshenko, S. et al., "Analysis of Bi-Metal Thermostats", *J. Opt. Soc. Am.*, vol. 11, 1925, pp. 233-256.

Tomisaka et al., "Electroplating Cu Fillings for Through-Vias for Three-Dimensional Chip Stacking" (Electronic Components and Technology Conference, Aug. 2002).

Tong et al., "Low Temperature SI Layer Splitting", Proceedings 1997 IEEE International SOI Conference, Oct. 1997, pp. 126-127.

Tonini, Monelli, Cornl, Ottaviani, Frabboni, Canteri, Queirolo, "Hydrogen Interaction with phosphorus ion implantated silicon", *Ion Implantation Technology-94*, (1995) pp. 801-804.

Tzeng, J.C., "A Novel Self-Aligned Oxgyen (Salox) Implanted SOI Mosfet Device Structure" *Nuclear Instruments and Methods in Physics Research* B2, 1987, pp. 112-115.

U.S. Dept. of Energy, "The Fusion Connection: Contributions to Industry, Defense, and Basic Science Resulting From Scientific Advances Made in the Magnetic Fusion Energy Program", *Plasma Coating*, pp. 6-7, 1985.

Van de Walle, C. "Structural Identification of Hydrogen and Muonium Centers in Silicon First Principles Calculations of Hyperfine Parameters", *Physical Review Letters*, vol. 60, No. 26, 1988, pp. 2761-2764.

Van de Walle, C. "Theoretical Aspects of Hydrogen in Crystalline Semiconductors", *Physica B*, Holland, vol. 170, No. 15, 1991, pp. 21-32.

Van de Walle, C. "Theory of Hydrogen Diffusion and Reactions in Crystalline Silicon", *Physical Review Letters*, vol. 64, No. 6, 1980, pp. 669-672.

Van de Walle, C. "Theory of Hydrogen Diffusion and Reactions in Crystalline Silicon", *Physical Review B*, vol. 39, No. 15, 1989, pp. 10 791-10 808, plus diagrams.

Van Swijgenhoven et al. "Helium Bubble and Blister Formation for Nickel and an AMorphous Fe—Ni—Mo—B Alloy During 5 kev He-+-Irradiation at Temperatures Between 200 K and 600", *Nuclear Instruments and Methods*, 209/210, 1983, pp. 461-468.

Veldkamp, W.B. et al., "Binary Optics," *Scientific American*, 1992, pp. 50-55.

Venezia et al., "The Role of Implantation Damage in the Production of Silicon-On-Insulator Films by Co-Implantation of He+ and H+", Electrochemical Society Proceedings vol. 98-1, 1998—pp. 1384-1395.

Weldon et al., "Mechanism of Silicon Exfoliation Induced by Hydrogen/Hekium Co-implantation", *Applied Physics Letters*, vol. 73, No. 25, pp. 3721-3723, Dec. 21, 1998.

Wemple, S.H., "Optical and channeling studies of ion-bombarded GaP", *J. Appl. Phys.*, vol. 45, No. 4, Apr. 1974, pp. 1578-1588.

Whitton, J. L. et al., "The Collection of Ions Implanted in Semiconductors: 1 Saturations Effects", *Radiation Effects*, Scotland, vol. 16, 1972, pp. 101-105.

Wiegand, M. et al., "Wafer Bonding of Silicon Wafers Covered With Various Surface Layers", *Sensors and Actuators*, Elsevier Science B.V., vol. 86, 2000, pp. 91-95.

Williams J. et al., "Annealing behaviour of high-dose rare-gas implantations into silicon", from Application of Ion Beans to Materials, 1975, Chap. 1, *Inst. Phys. Conf. Ser. No. 28*, 1976, pp. 30-36.

Wittmaack et al., "High Fluence Retention of Noble Gases Implanted in Silicon" *Radiation Effects*, vol. 39, 1978, pp. 81-95.

Wolf, Stanley Ph.D., Silicon Processing for the VLSI Era (vol. 2), Lattice Press, 1990, pp. 66-79.

Wong et al., "Integration of GaN Thin Films With Dissimilar Substrate Materials by Pd-In Metal Bonding and Laser Lift-Off", Journal of Electronic Materials, vol. 28, No. 12, 1999, pp. 1409-1413.

Wu, et al. "*Effect of the Working Gas of the Ion-Assisted Source on the Optical and Mechanical Properties of SI02 Films Deposited by Dual Ion Beam Sputtering with SI and SI02 as the Starting Materials*"—Applied Optics, OSA, Optical Society of America Washington, DC., vol. 45, No. 15, May 20, 2006—pp. 3510-3515.

Yamaguchi H. et al., "Intelligent Power IC With Partial Soi Structure", *Jpn. J. Appl. Phys.*, vol. 34, 1995, pp. 864-868.

Yee et al., "Polysilicon Surface-Modification Technique to Reduce Sticking of Microstructures", *Sensors and Actuators* A 52, 1996, pp. 145-150.

Yun et al., "Fractional Implantation Area Effects on Patterned Ion-Cut Silicon Layer Transfer", Dept. of Electrical Eng, and Computer Sciences, University of California, Berkley, CA, 94720, USA, 1999 IEEE International SOI Conference, Oct. 1999, pp. 129-130.

Yun et al., "Thermal and Mechanical Separations of Silicon Layers From Hydrogen Pattern-Implanted Wafers", *Journal of Electronic Materials*, vol. 36, No. 8, Apr. 24, 2001, pp. 960-964.

Yun, H. et al., "Transfer of Patterned Ion-Cut Silicon Layers", *Applied Physics Letters*, vol. 73, No. 19, 1998, pp. 2772-2774.

International Search Report for International Application No. PCT/FR1998/002904, dated Apr. 16, 1999, 2 pages.

International Search Report for International Application No. PCT/FR2002/001266, dated Feb. 7, 2003, 4 pages.

International Search Report for International Application No. PCT/FR2002/001268, dated Feb. 6, 2003, 4 pages.

International Search Report for International Application No. PCT/FR2002/003422, dated Jan. 22, 2003, 3 pages.

International Search Report for International Application No. PCT/FR2003/003256, dated Mar. 19, 2004, 6 pages.

International Search Report for International Application No. PCT/FR2003/003867, dated May 28, 2004, 3 pages.

International Search Report for International Application No. PCT/FR2003/003622, dated Jun. 3, 2004, 3 pages.

International Search Report for International Application No. PCT/FR2004/001858, dated Dec. 28, 2004, 3 pages.

International Search Report for International Application No. PCT/FR2004/002779, dated Apr. 5, 2005, 3 pages.

International Search Report for International Application No. PCT/FR2004/002781, dated Apr. 5, 2005, 3 pages.

International Search Report for International Application No. PCT/FR2004/001565, dated Jul. 6, 2005, 3 pages.

International Search Report for International Application No. PCT/FR2006/001945, dated Jan. 8, 2007, 3 pages.

International Search Report for International Application No. PCT/FR2006/002184, dated Jan. 24, 2007, 2 pages.

International Search Report for International Application No. PCT/FR2007/000534, dated Nov. 22, 2007, 3 pages.

International Search Report for International Application No. PCT/FR2007/002100, dated Feb. 4, 2009, 3 pages.

International Search Report for International Application No. PCT/FR2008/001427, dated Jul. 1, 2009, 3 pages.

Office Action from U.S. Appl. No. 12/063,808, dated Apr. 6, 2010, 9 pages.

Office Action from U.S. Appl. No. 12/063,808, dated Sep. 22, 2010, 9 pages.

Office Action from U.S. Appl. No. 10/534,199, dated Feb. 19, 2009, 8 pages.

Office Action from U.S. Appl. No. 10/534,199, dated Aug. 5, 2009, 10 pages.

Office Action from U.S. Appl. No. 10/534,199, dated Jan. 20, 2010, 8 pages.

Office Action from U.S. Appl. No. 10/534,199, dated Aug. 4, 2010, 8 pages.

Office Action from U.S. Appl. No. 10/577,175, dated Jun. 22, 2009, 13 pages.

Office Action from U.S. Appl. No. 10/577,175, dated Apr. 13, 2010, 14 pages.

Office Action from U.S. Appl. No. 11/480,250, dated May 22, 2008, 10 pages.

Office Action from U.S. Appl. No. 11/480,250, dated Dec. 3, 2008, 16 pages.

Office Action from U.S. Appl. No. 11/480,250, dated Jan. 26, 2010, 14 pages.

Office Action from U.S. Appl. No. 11/480,250, dated Aug. 3, 2010, 15 pages.

Office Action from U.S. Appl. No. 12/088,047, dated Sep. 25, 2009, 9 pages.

Office Action from U.S. Appl. No. 12/088,047, dated Mar. 10, 2010, 9 pages.

Office Action from U.S. Appl. No. 10/561,299, dated Mar. 26, 2008, 9 pages.

Office Action from U.S. Appl. No. 10/561,299, dated Dec. 9, 2008, 11 pages.

Office Action from U.S. Appl. No. 10/561,299, dated May 11, 2009, 12 pages.

Office Action from U.S. Appl. No. 10/561,299, dated Nov. 16, 2009, 11 pages.

Office Action from U.S. Appl. No. 10/561,299, dated Nov. 27, 2009, 10 pages.

Office Action from U.S. Appl. No. 10/561,299, dated May 11, 2010, 11 pages.

Office Action from U.S. Appl. No. 10/565,621, dated May 15, 2007, 13 pages.

Office Action from U.S. Appl. No. 10/565,621, dated Feb. 11, 2008, 11 pages.

Office Action from U.S. Appl. No. 10/565,621, dated Sep. 12, 2008, 9 pages.

Office Action from U.S. Appl. No. 10/565,621, dated Mar. 12, 2009, 6 pages.

Office Action from U.S. Appl. No. 10/565,621, dated Jan. 7, 2010, 8 pages.

Office Action from U.S. Appl. No. 10/565,621, dated Nov. 23, 2010, 11 pages.

Office Action from U.S. Appl. No. 12/628,772, dated Oct. 7, 2010, 12 pages.

Office Action from U.S. Appl. No. 12/682,522, dated Mar. 29, 2011, 10 pages.

Notice of Allowance from U.S. Appl. No. 12/336,229, dated Sep. 29, 2010, 7 pages.

Notice of Allowance from U.S. Appl. No. 12/336,229, dated Jan. 10, 2011, 4 pages.

Office Action from U.S. Appl. No. 10/468,223, dated Oct. 5, 2005, 7 pages.

Office Action from U.S. Appl. No. 10/468,223, dated May 3, 2006, 11 pages.

Office Action from U.S. Appl. No. 10/468,223, dated Jan. 10, 2007, 11 pages.

Office Action from U.S. Appl. No. 10/468,223, dated Jul. 20, 2007, 11 pages.

Office Action from U.S. Appl. No. 10/468,223, dated Feb. 11, 2008, 11 pages.

Office Action from U.S. Appl. No. 10/468,223, dated Oct. 29, 2008, 11 pages.

Office Action from U.S. Appl. No. 10/468,223, dated Jun. 25, 2009, 8 pages.

Notice of Allowance from U.S. Appl. No. 10/468,223, dated Dec. 28, 2009, 4 pages.

Office Action from U.S. Appl. No. 10/474,984, dated Sep. 24, 2004, 6 pages.

Office Action from U.S. Appl. No. 10/474,984, dated Jun. 6, 2005, 5 pages.

Office Action from U.S. Appl. No. 10/474,984, dated Nov. 16, 2005, 5 pages.

Office Action from U.S. Appl. No. 10/474,984, dated May 17, 2006, 5 pages.

Office Action from U.S. Appl. No. 10/474,984, dated May 7, 2007, 9 pages.

Office Action from U.S. Appl. No. 10/474,984, dated Feb. 6, 2008, 10 pages.

Office Action from U.S. Appl. No. 10/474,984, dated Oct. 17, 2008, 11 pages.

Office Action from U.S. Appl. No. 10/474,984, dated Jul. 7, 2009, 10 pages.

Office Action from U.S. Appl. No. 10/474,984, dated Mar. 11, 2010, 13 pages.

Notice of Allowance from U.S. Appl. No. 10/474,984, dated Oct. 28, 2010, 6 pages.

Office Action from U.S. Appl. No. 10/540,303, dated Dec. 18, 2007, 6 pages.

Notice of Allowance from U.S. Appl. No. 10/540,303, dated Oct. 7, 2008, 9 pages.
Office Action from U.S. Appl. No. 11/327,906, dated Oct. 1, 2007, 5 pages.
Office Action from U.S. Appl. No. 11/327,906, dated Feb. 11, 2008, 5 pages.
Notice of Allowance from U.S. Appl. No. 11/327,906, dated Sep. 15, 2008, 6 pages.
Office Action from U.S. Appl. No. 10/975,826, dated May 5, 2006, 14 pages.
Office Action from U.S. Appl. No. 10/975,826, dated Nov. 28, 2006, 20 pages.
Office Action from U.S. Appl. No. 10/975,826, dated Jul. 17, 2007, 21 pages.
Office Action from U.S. Appl. No. 10/975,826, dated Apr. 1, 2008, 27 pages.
Office Action from U.S. Appl. No. 10/975,826, dated Dec. 10, 2008, 28 pages.
Office Action from U.S. Appl. No. 10/975,826, dated Sep. 2, 2009, 24 pages.
Notice of Allowance from U.S. Appl. No. 10/975,826, dated Apr. 28, 2010, 8 pages.
Office Action from U.S. Appl. No. 10/492,343, dated Oct. 17, 2005, 6 pages.
Office Action from U.S. Appl. No. 10/492,343, dated Jun. 6, 2006, 13 pages.
Office Action from U.S. Appl. No. 10/492,343, dated Nov. 14, 2006, 13 pages.
Office Action from U.S. Appl. No. 10/492,343, dated May 29, 2007, 15 pages.
Office Action from U.S. Appl. No. 10/492,343, dated Feb. 7, 2008, 18 pages.
Office Action from U.S. Appl. No. 10/492,343, dated Aug. 18, 2008, 12 pages.
Office Action from U.S. Appl. No. 10/492,343, dated Dec. 22, 2008, 9 pages.
Notice of Allowance from U.S. Appl. No. 10/492,343, dated Jun. 26, 2009, 6 pages.
Office Action from U.S. Appl. No. 11/747,733, dated Mar. 16, 2009, 9 pages.
Office Action from U.S. Appl. No. 11/747,733, dated Mar. 23, 2010, 5 pages.
Notice of Allowance from U.S. Appl. No. 11/747,733, dated Sep. 29, 2010, 8 pages.
Notice of Allowance from U.S. Appl. No. 12/293,193, dated Oct. 8, 2009, 10 pages.
Expert Report of Marcus Weldon, Ph.D. dated Nov. 1, 2000.
Expert Report of Jean-Pierre Colinge dated Nov. 1, 2000.
Expert Report of Chris Van de Walle, Ph.D. dated Nov. 1, 2000.
Memorandum in Support of Defendant Silicon Genesis Corporation's Motion for Summary Judgment of Invalidity for Lack of Enablement dated Mar. 19, 2001.
Memorandum of Points and Authorities in Support of Soitec's Motion for Summary Judgment on Sigen's Enablement Invalidity Claim (Redacted) dated Mar. 27, 2001.
Soitec's Memorandum of Points and Authorities in Opposition to Silicon Genesis Corporation's Motion for Summary Judgment of Invalidity for Lack of Enablement dated Apr. 11, 2001.
Memorandum in Support of Defendant Silicon Genesis Corporation's Opposition to Soitec's Motion for Summary Judgment on SiGen's Defense of Enablement dated Apr. 20, 2001.
Reply Memorandum in Support of Defendant Silicon Genesis Corporation's Motion for Summary Judgment of Invalidity for Lack of Enablement dated Apr. 30, 2001.
Expert Report of Marcus Weldon, Ph.D. dated Aug. 24, 2001.
Report of Jean-Pierre Colinge in Response to SiGen Enablement and Indefiniteness Expert Reports of Aug. 24, 2001.
Expert Report of Chris Van de Walle, Ph.D. dated Aug. 24, 2001.
Memorandum and Order re: Summary Judgment [denied] dated Feb. 5, 2002.
Plaintiff's Memorandum in Support of Their Motion for Judgment as a Matter of Law and a New Trial dated May 10, 2002.
Silicon Genesis Corporation's Opposition to Plaintiff's Motion for Judgment as a Matter of Law and a New Trial dated Jun. 17, 2002.
Memorandum of Law in Support of Plaintiff's Motion for Judgment on SiGen's Indefiniteness Defense dated Jun. 20, 2002.
Plaintiff's Reply Memorandum in Support of Their Motion for Judgment as a Matter of Law and a New Trial dated Jul. 18, 2002.
Defendant Silicon Genesis Corporation's Opposition to Soitec's Motion for Judgment Re Indefiniteness and Cross-Motion for Judgment of Indefiniteness dated Jul. 19, 2002.
Plaintiff's Reply in Support of their Motion for Judgment on SiGen's Indefiniteness Defense dated Jul. 25, 2002.
Memorandum and Order re: Post-Trial Motions dated Aug. 23, 2002.
Judgment dated Oct. 21, 2002.
Brief of Plaintiffs—Appellants Soitec, S.A. and Commissariat a L'Energie Atomique dated Jan. 28, 2003.
Brief for Defendant—Cross Appellant Silicon Genesis Corporation dated Mar. 22, 2003.
Reply Brief of Plaintiffs—Appellants Soitec, S.A. and Commissariat a L'Energie Atomique dated May 5, 2003.
Reply Brief for Defendant—Cross Appellant Silicon Genesis Corporation dated May 19, 2003.
Plaintiff/Appellants Supplemental Authority Letter [dated Nov. 17, 2003].
Defendant—Cross Appellant's Response to Appellants' Submission of *CFMT, Inc.* v. *Yieldup Int'l*, [dated Nov. 24, 2003].
Decision from the United States Court of Appeals for the Federal Circuit dated Nov. 26, 2003.
Combined Petition for Panel Rehearing and for Rehearing En Banc by Plaintiffs-Appellant's Soitec, S.A. and Commissariat A L'Energie Atomique, dated Dec. 10, 2003.
Order [dated Jan. 7, 2004 denying Appellants' petition for panel rehearing and Appellant's petition for rehearing en band].
Judgment Mandate [dated Jan. 14, 2004].
Complaint filed with Jury Demand against MEMC Electronic Materials Inc.—Magistrate Consent Notice to Pltf. ( Filing fee $ 350, receipt No. 152004.)—filed by SOITEC Silicon on Insulator Technologies SA, Commissariat a LEnergie Atomique. (Attachments: # 1 Exhibit 1, # 2 Exhibit 2, # 3 Exhibit 3, # 4 Civil Cover Sheet, # 5 Acknowledgement of Consent Form) (sns. ) (Entered: May 20, 2008) (47 pgs).
Disclosure Statement pursuant to Rule 7.1 filed by SOITEC Silicon on Insulator Technologies SA, Commissariat a LEnergie Atomique. (Attachments: # 1 Certificate of Service)(Kraft, Denise) (Entered: Jun. 16, 2008) (3 pgs).
Motion to Dismiss Based upon or, in the Alternative, Motion for a More Definite Statement—filed by MEMC Electronic Materials Inc. (Rogowski, Patricia) (Entered: Jul. 9, 2008) (4 pgs).
Opening Brief in Support re 10 Motion to Dismiss Based upon or, in the Alternative, Motion for a More Definite Statement filed by MEMC Electronic Materials Inc..Answering Brief/Response due date per Local Rules is Jul. 28, 2008. (Rogowski, Patricia) (Entered: Jul. 9, 2008) (15 pgs).
Disclosure Statement pursuant to Rule 7.1 filed by MEMC Electronic Materials Inc.(Rogowski, Patricia) (Entered: Jul. 9, 2008) (3 pgs).
Answering Brief in Opposition re 10 Motion to Dismiss Based upon or, in the Alternative, Motion for a More Definite Statement filed by Commissariat a L'Energie Atomique. Reply Brief due date per Local Rules is Aug. 7, 2008. (Attachments: # 6 Exhibit A, # 7 Exhibit B, # Certificate of Service) (Kraft, Denise) (Modified on Jul. 29, 2008 (lid). (Entered: Jul. 28, 2008) (29 pgs).
Redacted Reply Brief re 14—re 10 Motion to Dismiss Based upon or, in the Alternative, Motion for a More Definite Statement filed by MEMC Electronic Materials Inc. (Attachments: # 1 Exhibit 2, # 2 Exhibit 3, # 3 Exhibit 4, # 4 Exhibit 5, # 5 Unreported Cases, # 6 Certificate of Service) (Rogowski, Patricia) Modified on Aug. 8, 2008 (lid). (Entered: Aug. 7, 2008) (98 pgs).
Memorandum Order denying 10 Motion to Dismiss Based upon or, in the Alternative, Motion for a More Definite Statement filed by MEMC Electronic Materials Inc., Order, Setting Hearings Telephonic Scheduling Conference set for Mar. 12, 2009 at 9:00 A.M. Signed by Judge Sue L. Robinson on Feb. 20, 2009. (nmf) (Entered: Feb. 20, 2009) (6 pgs).

Answer to 1 Complaint, with Jury Trial Demanded, Counterclaim against all plaintiffs by MEMC Electronic Materials Inc.. (Attachments: # 1 Exhibit A)(Rogowski, Patricia) (Entered: Mar. 6, 2009) (55 pgs).
Motion to Dismiss Based upon Fed. R. Civ. P. 12(b)(1) and (6) and Article III of the United States Constitution—filed by SOITEC Silicon on Insulator Technologies SA, Commissariat a LEnergie Atomique. (Attachments: # 1 Text of Proposed Order, # 2 Certificate of Service)(Kraft, Denise) (Entered: Apr. 7, 2009) (5 pgs).
Opening Brief in Support re 30 Motion to Dismiss Based upon Fed. R. Civ. P. 12(b)(1) and (6) and Article III of the United States Constitution Motion to Dismiss Based upon Fed. R. Civ. P. 12(b)(1) and (6) and Article III of the United States Constitution filed by SOITEC Silicon on Insulator Technologies SA, Commissariat a L'Energie Atomique Answering Brief/Response due date per Local Rules is Apr. 27, 2009. (Attachments: # 1 Certificate of Service)(Kraft, Denise) (Entered: Apr. 7, 2009) (13 pgs).
Answer to 19 Answer to Complaint, Counterclaim Partial Answer to Defendant's Counterclaims, Affirmative Defenses and Soitec Counterclaims, Counterclaim against MEMC Electronic Materials Inc. by SOITEC Silicon on Insulator Technologies SA, Commissariat a LEnergie Atomique. (Attachments: # 1 Certificate of Service)(Kraft, Denise) (Entered: Apr. 7, 2009) (18 pgs).
Answer to 32 Answer to Counterclaim,,, of S.O.I. TEC Silicon on Insulator Technologies, S.A. and SOITEC U.S.A., Inc. by MEMC Electronic Materials Inc. (Rogowski, Patricia) (Entered: Apr. 23, 2009) (4 pgs).
Notice of by SOITEC Silicon on Insulator Technologies SA, Commissariat a L'Energie Atomique re 30 Motion to Dismiss Based upon Fed. R. Civ. P. 12(b)(1) and (6) and Article III of the United States Constitution Motion to Dismiss Based upon Fed. R. Civ. P. 12(b)(1) and (6) and Article III of the United States Constitution *Notice of Withdrawal of Plaintiffs' Partial Motion to Dismiss Counterclaim Counts II, III, IV, V, and VIII* (Attachments: # 1 Certificate of Service)(Kraft, Denise) (Entered: Jul. 2, 2009).
Stipulation and [Proposed] Order to File an Amended Complaint by SOITEC Silicon on Insulator Technologies SA, Commissariat a LEnergie Atomique. (Attachments: # 1 Exhibit A, # 2 Certificate of Service)(Kraft, Denise) (Entered: Jul. 16, 2009).
Notice of Service of Soitec's Objections and Responses to MEMC's Second Request for Production of Documents and Things Directed to Soitec re 46 Notice of Service by SOITEC Silicon on Insulator Technologies SA, Commissariat a LEnergie Atomique. Related document: 46 Notice of Service filed by MEMC Electronic Materials Inc. (Attachments: # 1 Certificate of Service)(Kraft, Denise) (Entered: Jul. 16, 2009).
First Amended Complaint *for Patent Infringement* against MEMC Electronic Materials Inc.—filed by SOITEC Silicon on Insulator Technologies SA, Commissariat a L'Energie Atomique. (Attachments: # 1 Exhibit Exhibit 1, # 2 Exhibit Exhibit 2, # 3 Exhibit Exhibit 3, # 4 Exhibit Exhibit 4, # 5 Certificate of Service)(Kraft, Denise) (Entered: Jul. 21, 2009).
Answer to Amended Complaint Answer to 57 Amended Complaint, with Under Federal Rule of Civil Procedure 38, MEMC demands a trial by jury on all issues so triable., Counterclaim against all plaintiffs by MEMC Electronic Materials Inc.. (Attachments: # 1 Exhibit A, # 2 Certificate of Service)(Rogowski, Patricia) (Entered: Aug. 3, 2009).
Answer to 60 Answer to Amended Complaint, Counterclaim,,, Counterclaim *Reply to Defendant's Amended Counterclaims, Counterclaims and Affirmative Defenses* against MEMC Electronic Materials Inc. by SOITEC Silicon on Insulator Technologies SA, Commissariat a L'Energie Atomique, SOITEC U.S.A., Inc.. (Attachments: # 1 Certificate of Service)(Kraft, Denise) (Entered: Aug. 31, 2009).
Notice of Service of MEMC's Third Set of Interrogatories Directed to S.O.I.TEC Silicon on Insulator Technologies, S.A., SOITEC USA, Inc., and Commissariat a L'Energie Atomique by MEMC Electronic Materials Inc. (Rogowski, Patricia) (Entered: Sep. 1, 2009).
Answer to 68 Answer to Counterclaim,,, by MEMC Electronic Materials Inc..(Rogowski, Patricia) (Entered: Sep. 14, 2009). Minute Entry for proceedings held before Judge Sue L. Robinson—Discovery Conference held on Sep. 16, 2009. (Court Reporter V. Gunning.) (nmf) (Entered: Sep. 16, 2009).

Motion to Bifurcate *the Issues of Willfulness and Damages for Purposes of Discovery and Trial and proposed Form of Order*—filed by MEMC Electronic Materials Inc.. (Rogowski, Patricia) (Entered: Oct. 20, 2009). Correcting Entry: Docket clerk deleted D.I. 78 (opening brief) due to document being filed improperly. Counsel is advised to re-file document using the Opening Brief event code rather than the combined opening and answering brief event code. (lid) (Entered: Oct. 21, 2009).
Opening Brief in Support re 77 Motion to Bifurcate *the Issues of Willfulness and Damages for Purposes of Discovery and Trial and proposed Form of Order* filed by MEMC Electronic Materials Inc.. Answering Brief/Response due date per Local Rules is Nov. 9, 2009. (Attachments: # 1 Exhibit A, # 2 Exhibit B, # 3 Exhibit C)(Rogowski, Patricia) (Entered: Oct. 21, 2009).
Cross Motion to Bifurcate *all Collateral Issues*—filed by SOITEC Silicon on Insulator Technologies SA, SOITEC U.S.A., Inc., Commissariat a LEnergie Atomique. (Attachments: # 1 Text of Proposed Order, # 2 Certificate of Service)(Kraft, Denise) (Entered: Nov. 9, 2009).
Answering Brief in Opposition re 85 Cross Motion to Bifurcate *all Collateral Issues*, 77 Motion to Bifurcate *the Issues of Willfulness and Damages for Purposes of Discovery and Trial and proposed Form of Order* filed by SOITEC Silicon on Insulator Technologies SA, Commissariat a LEnergie Atomique.Reply Brief due date per Local Rules is Nov. 20, 2009. (Attachments: # 1 Exhibit, # 2 Exhibit, # 3 Exhibit, # 4 Exhibit, # 5 Exhibit, # 6 Exhibit, # 7 Exhibit, # 8 Exhibit, # 9 Exhibit, # 10 Exhibit, # 11 Exhibit, # 12 Declaration, # 13 Certificate of Service)(Kraft, Denise) (Entered: Nov. 9, 2009).
Reply Brief re 77 Motion to Bifurcate *the Issues of Willfulness and Damages for Purposes of Discovery and Trial and proposed Form of Order* filed by MEMC Electronic Materials Inc.. (Attachments: # 1 Exhibit 1, # 2 Exhibit 2, # 3 Exhibit 3)(Rogowski, Patricia) (Entered: Nov. 17, 2009).
Answering Brief in Opposition re 85 Cross Motion to Bifurcate *all Collateral Issues* filed by MEMC Electronic Materials Inc..Reply Brief due date per Local Rules is Dec. 3, 2009. (Rogowski, Patricia) (Entered: Nov. 19, 2009).
Reply Brief re 85 Cross Motion to Bifurcate *all Collateral Issues* filed by Commissariat a LEnergie Atomique, SOITEC Silicon on Insulator Technologies SA, SOITEC U.S.A., Inc.. (Attachments: # 1 Exhibit Declaration of Marcus T. Hall in Support of Plaintiffs' Reply Re: Cross-Motion to Bifurcate all Collateral Issues)(Kraft, Denise) (Entered: Dec. 3, 2009).
Notice of Service of S.O.I.TEC Silicon on Insulator Technologies, S.A. and Commissariat a L'Energie Atomique's Production of Three Boxes of Wafer Samples by Commissariat a LEnergie Atomique, SOITEC Silicon on Insulator Technologies SA, SOITEC U.S.A., Inc.. (Attachments: # 1 Certificate of Service)(Kraft, Denise) (Entered: Dec. 8, 2009). Set Hearings: Discovery Conference set for Dec. 21, 2009 04:00 PM in Courtroom 6B before Judge Sue L. Robinson. (nmf) (Entered: Dec. 9, 2009).
Motion for Leave to File *Stipulated Motion for Leave to File a Sur-Reply Brief in Support of MEMC's Motion to Bifurcate*—filed by MEMC Electronic Materials Inc.. (Attachments: # 1 Exhibit 1)(Rogowski, Patricia) (Entered: Dec. 14, 2009).
Sur-Reply Brief re 77 Motion to Bifurcate *the Issues of Willfulness and Damages for Purposes of Discovery and Trial and proposed Form of Order MEMC's Sur-Reply Brief in Support of Its Motion to Bifurcate the Issues of Willfulness and Damages for Purposes of Discovery and Trial* filed by MEMC Electronic Materials Inc.. (Rogowski, Patricia) (Entered: Dec. 16, 2009).
Motion for Discovery Motion for the Admission of the Expert Testimony of John T. Goolkasian Relating to the Certificate of Correction for U.S. Patent No. 7,067,396—filed by MEMC Electronic Materials Inc.. (Rogowski, Patricia) (Entered: May 7, 2010).
Opening Brief in Support re 141 Motion for Discovery *Motion for the Admission of the Expert Testimony of John T. Goolkasian Relating to the Certificate of Correction for U.S. Patent No. 7,067,396* filed by MEMC Electronic Materials Inc..Answering Brief/Response due date per Local Rules is May 24, 2010. (Attachments: # 1 Exhibit 1, # 2 Exhibit 2, # 3 Exhibit 3, # 4 Exhibit 4, # 5 Exhibit 5, # 6 Exhibit 6, # 7 Exhibit 7, # 8 Exhibit 8, # 9 Exhibit 9, # 10 Exhibit 10, # 11 Exhibit 11, # 12 Exhibit 12, # 13 Exhibit 13, # 14 Exhibit 14, # 15 Exhibit 15)(Rogowski, Patricia) (Entered: May 7, 2010).
Answering Brief in Opposition re 141 Motion for Discovery *Motion for the Admission of the Expert Testimony of John T. Goolkasian Relating to the Certificate of Correction for U.S. Patent No. 7,067,396 Plaintiff's Answering Brief in Opposition to Defendant's Motion for the Admission of Expert Testimony of John T. Goolkasian* filed by SOITEC Silicon on Insulator Technologies SA.Reply Brief due date per Local Rules is Jun. 4, 2010. (Attachments: # 1 Certificate of Service)(Kraft, Denise) (Entered: May 24, 2010).
Declaration re 145 Answering Brief in Opposition,, *Declaration of Marcus T. Hall in Support of Plaintiff's Answering Brief in Opposition to Defendant's Motion for the Admission of Expert Testimony of John T. Goolkasian* by SOITEC Silicon on Insulator Technologies SA. (Attachments: # 1 Exhibit A, # 2 Exhibit B, # 3 Exhibit C, # 4 Exhibit D, # 5 Exhibit E, # 6 Exhibit F, # 7 Exhibit G, # 8 Exhibit H, # 9 Exhibit I, # 10 Exhibit J, # 11 Exhibit K, # 12 Exhibit L, # 13 Exhibit M, # 14 Exhibit N, # 15 Certificate of Service)(Kraft, Denise) (Entered: May 24, 2010).
Reply Brief *in Support Admission of 141 Motion for Discovery Motion for the Admission of the Expert Testimony of John T. Goolkasian Relating to the Certificate of Correction for U.S. Patent No. 7,067,396* filed by MEMC Electronic Materials Inc.. (Attachments: # 1 Exhibit 1, # 2 Exhibit 2, # 3 Exhibit 3, # 4 Exhibit 4, # 5 Exhibit 5, # 6 Exhibit 6)(Rogowski, Patricia) Modified on Jun. 4, 2010 (lid). (Entered: Jun. 4, 2010).
Statement re 148 Stipulation *Joint Claim Construction Statement* by Commissariat a LEnergie Atomique, SOITEC Silicon on Insulator Technologies SA, SOITEC U.S.A., Inc.. (Attachments: # 1 Certificate of Service)(Kraft, Denise) (Entered: Jun. 14, 2010).
Claim Construction Chart by Commissariat a LEnergie Atomique, SOITEC Silicon on Insulator Technologies SA, SOITEC U.S.A., Inc.. (Attachments: # 1 Certificate of Service)(Kraft, Denise) (Entered: Jun. 14, 2010).
Sur-Reply Brief re 141 Motion for Discovery *Motion for the Admission of the Expert Testimony of John T. Goolkasian Relating to the Certificate of Correction for U.S. Patent No. 7,067,396 Surreply by Plaintiffs to Motion by Defendant for the Admission of Expert Testimony of John T. Goolkasian* filed by SOITEC Silicon on Insulator Technologies SA. (Attachments: # 1 Certificate of Service)(Kraft, Denise) (Entered: Jun. 15, 2010).
Declaration re 157 Sur-Reply Brief, *Declaration of Marcus T. Hall in Support of Surreply by Plaintiffs to Motion by Defendant for the Admission of Expert Testimony of John T. Goolkasian* by SOITEC Silicon on Insulator Technologies SA. (Attachments: # 1 Exhibit A, # 2 Exhibit B, # 3 Exhibit C, # 4 Exhibit D, # 5 Certificate of Service(Kraft, Denise) (Entered: Jun. 15, 2010).
Claim Construction Opening Brief filed by MEMC Electronic Materials Inc.. (Attachments: # 1 Appendix DA0001-DA0006, # 2 Appendix DA0007-DA0032, # 3 Appendix DA0033-DA0072, # 4 Appendix DA0073-DA0112, # 5 Appendix DA0113-DA0152, # 6 Appendix DA0153-DA0192, # 7 Appendix DA0193-DA0232, # 8 Appendix DA0233-DA0272, # 9 Appendix DA0273-DA0312, # 10 Appendix DA0313-DA0352, # 11 Appendix DA0353-DA0392, # 12 Appendix DA0393-DA0432, # 13 Appendix DA0433-DA0472, # 14 Appendix DA0473-DA0512, # 15 Appendix DA0513-DA0521, # 16 Appendix DA0522-DA0545, # 17 Appendix Sealed—DA0546-DA0551, # 18 Appendix DA0552-DA0563, # 19 Appendix Sealed—DA0564-DA0566, # 20 Appendix DA0567-DA0573, # 21 Appendix Sealed—DA0574-DA0599, # 22 Appendix DA0600-DA0604, # 23 Appendix DA0605-DA0609, # 24 Appendix DA0610-DA0625, # 25 Appendix DA0626-0634, # 26 Appendix DA0635, # 27 Appendix DA0636-DA0652, # 28 Appendix Sealed—DA0653- DA0657, # 29 Appendix DA0658-DA0667, # 30 Appendix DA0668-DA0670, # 31 Appendix DA0671-DA0678, # 32 Appendix DA0679-DA0687, # 33 Appendix DA0688-DA0696, # 34 Appendix Sealed—DA0697-DA0705, # 35 Appendix Sealed—DA0706-DA0711, # 36 Appendix Sealed—DA0712-DA0714, # 37 Appendix DA0715-DA0717, # 38 Appendix DA0718-DA0719, # 39 Appendix DA0720-DA0722, # 40 Appendix DA0723-DA0732, # 41 Appendix DA0733-DA0740, # 42 Appendix DA0741-DA0749, # 43 Appendix DA0750-DA0769, # 44 Appendix DA0770-DA0781)(Rogowski, Patricia) (Entered: Jun. 25, 2010).

Claim Construction Opening Brief *Plaintiffs S.O.I.TEC Silicon on Insulator Technologies, S.A. and Commissariat a L'Energie Atomique's Opening Claim Construction Brief* filed by Commissariat a LEnergie Atomique, SOITEC Silicon on Insulator Technologies SA. (Attachments: # 1 Certificate of Service)(Kraft, Denise) (Entered: Jun. 25, 2010).
Declaration re 168 Claim Construction Opening Brief, *Declaration of Marucs T. Hall in Support of Plaintiffs S.O.I.TEC Silicon on Insulator Technologies, S.A. and Commissariat a L'Energie Atomique's Opening Claim Construction Brief* by Commissariat a LEnergie Atomique, SOITEC Silicon on Insulator Technologies SA. (Attachments: # 1 Certificate of Service)(Kraft, Denise) (Entered: Jun. 25, 2010).
Appendix re 167 Claim Construciton Opening Brief,,,,,, by MEMC Electronic Materials Inc.. (Attachments: # 1 Appendix DA-001-DA-006, # Appendix DA-007-DA-0032, # 3 Appendix DA-0033-DA-0072, # 4 Appendix DA-0073-DA-0112, # 5 Appendix DA-0113-DA-0152, # 6 Appendix DA-0153-DA-0192, # 7 Appendix DA-0193-DA-0232, # 8 Appendix DA-0233-DA-0272, # 9 Appendix DA-0273-DA-0312, # 10 Appendix DA-0313-DA-0313-DA-0352, # 11 Appendix DA-0353-DA-0392, # 12 Appendix DA-0393-DA-0432, # 13 Appendix DA-0433-DA-0472, # 14 Appendix DA-0473-DA-0512, # 15 Appendix DA-0513-DA-0521)(Rogowski, Patricia) (Entered: Jun. 28, 2010).
Redacted Version of 175 Appendix by Memc Electronic Materials Inc.. (Attachments: # 1 Appendix DA0522-DA0545, # 2 Appendix DA0546-DA0551, # 3 Appendix DA0552-DA0563, # 4 Appendix DA0564-DA0566, # 5 Appendix DA0567- DA0573, # 6 Appendix DA0574-DA0599, # 7 Appendix DA0600-DA0604, # 8 Appendix DA0605-DA0609, # 9 Appendix DA0610-DA0625, # 10 Appendix DA0626- DA0634, # 11 Appendix DA0635, # 12 Appendix DA0636-DA0652, # 13 Appendix DA0653-DA0657, # 14 Appendix DA0658-DA0667, # 15 Appendix DA0668-DA0670, # 16 Appendix DA0671-DA0678, # 17 Appendix DA0679-DA0687, # 18 Appendix DA0688-DA0696, # 19 Appendix DA0697-DA0705, # 20 Appendix DA0706-Da-0711, # 21 Appendix DA0712-DA0714, # 22 Appendix DA0715-DA0717, # 23 Appendix DA0718-DA0719, # 24 Appendix DA0720-DA0722, # 25 Appendix DA0723-DA0732, # 26 Appendix DA0733-DA0740, # 27 Appendix DA0741-DA0749, # 28 Appendix DA0750-DA0769, # 29 Appendix DA0770-DA0781, # 30 Certificate of Service)(Rogowski, Patricia) (Entered: Jun. 28, 2010).
Notice of filing the following document(s) in paper format: Joint Appendix of Exhibits to Opening and Answering Claim Construction Briefs (1) vol. I—JA0001 to JA0533. Appendix vol. I. re 173 Notice of Filing Paper Documents(Oversized Document, Item on File in the Clerks Office). (lid) (Entered: Jun. 28, 2010).
Notice of filing the following document(s) in paper format: Joint Appendix of Exhibits to Opening and Answering Claim Construction Briefs (2) vol. II—JA0534 to JA0930. Appendix vol. II. re 173 Notice of Filing Paper Documents(Oversized Document, Item on File in the Clerks Office). (lid) (Entered: Jun. 28, 2010).
Notice of filing the following document(s) in paper format: Joint Appendix of Exhibits to Opening and Answering Claim Construction Briefs (3) vol. III—JA0931 to JA1502. Appendix vol. III. re 173 Notice of Filing Paper Documents(Oversized Document, Item on File in the Clerks Office) (lid) (Entered: Jun. 28, 2010) (2 parts).
Notice of filing the following document(s) in paper format: Joint Appendix of Exhibits to Opening and Answering Claim Construction Briefs (4) vol. IV—JA1503 to JA1510. Appendix vol. IV. re 173 Notice of Filing Paper Documents, (Oversized Document, Item on File in teh Clerks Office) (lid) (Entered: Jun. 28, 2010).
Notice of filing the following document(s) in paper format: Joint Appendix of Exhibits to Opening and Answering Claim Construction Briefs (5) vol. V—JA1511 to JA2089 (2 parts).
Vol. VI—JA2090 to JA2557. Original document(s) to be filed with the Clerk's Office. Notice filed by Denise Seastone Kraft on behalf of Commissariat a LEnergie Atomique, SOITEC Silicon on Insulator Technologies SA (Attachments: # 1 Certificate of Service)(Kraft, Denise) (Entered: Jun. 25, 2010).
Motion in Limine *SOITEC/CEA Parties' Motion to Exclude the Expert Report of Dr. Pascal Belton and Any Related Testimony*—filed by Commissariat a LEnergie Atomique, SOITEC Silicon on Insulator Technologies SA. (Attachments: # 1 Text of Proposed Order, # 2 Certificate of Service)(Kraft, Denise) (Entered: Jul. 2, 2010).
Motion for Partial Summary Judgment of *Invalidity of the Asserted Aspar Patent Claims*—filed by MEMC Electronic Materials Inc.. (Attachments: # 1 Text of Proposed Order, # 2 Certificate of Service)(Rogowski, Patricia) (Entered: Jul. 2, 2010).
Opening Brief in Support re 186 Motion in Limine *SOITEC/CEA Parties' Motion to Exclude the Expert Report of Dr. Pascal Bellon and Any Related Testimony* filed by Commissariat a LEnergie Atomique, SOITEC Silicon on Insulator Technologies SA Answering Brief/Response due date per Local Rules is Jul. 19, 2010. (Attachments: # 1 Certificate of Service)(Kraft, Denise) (Entered: Jul. 2, 2010).
Opening Brief in Support re 187 Motion for Partial Summary Judgment *of Invalidity of the Asserted Aspar Patent Claims* filed by MEMC Electronic Materials Inc..Answering Brief/Response due date per Local Rules is Jul. 19, 2010. (Rogowski, Patricia) (Entered: Jul. 2, 2010).
Appendix re 186 Motion in Limine *SOITEC/CEA Parties' Motion to Exclude the Expert Report of Dr. Pascal Belton and Any Related Testimony Plaintiffs' Omnibus Appendix to Daubert Motion and Motions for Partial Summary Judgment Filed on Jul. 2, 2010* by Commissariat a LEnergie Atomique, SOITEC Silicon on Insulator Technologies SA. (Attachments: # 1 Appendix vol. II of XIX, # 2 Appendix vol. III of XIX, # 3 Appendix vol. IV of XIX, # 4 Appendix vol. V of XIX, # 5 Appendix vol. VII of XIX, # 6 Appendix vol. IX of XIX, # 7 Appendix vol. XI of XIX, # 8 Appendix vol. XII of XIX, # 9 Appendix vol. XIII of XIX, # 10 Appendix vol. XIV of XIX, # 11 Appendix vol. XV of XIX, # 12 Appendix vol. XVI of XIX, # 13 Appendix vol. XVIII of XIX, # 14 Certificate of Service)(Kraft, Denise) (Entered: Jul. 2, 2010).
Motion for Summary Judgment *of Non-Infringement*—filed by MEMC Electronic Materials Inc.. (Attachments: # 1 Text of Proposed Order, # 2 Certificate of Service)(Rogowski, Patricia) (Entered: Jul. 2, 2010).
Motion for Partial Summary Judgment *SOITEC/CEA Parties Motion for Partial Summary Judgment That the Patents in Suit Satisfy the Written Description Requirement*—filed by Commissariat a LEnergie Atomique, SOITEC Silicon on Insulator Technologies SA. (Attachments: # 1 Certificate of Service)(Kraft, Denise) (Entered: Jul. 2, 2010).
Opening Brief in Support re 202 Motion for Partial Summary Judgment *SOITEC/CEA Parties Motion for Partial Summary Judgment that the Patents in Suit Satisfy the Written Description Requirement* filed by Commissariat a LEnergie Atomique, SOITEC Silicon on Insulator Technologies SA, SOITEC U.S.A., Inc..Answering Brief/Response due date per Local Rules is Jul. 19, 2010. (Attachments: # 1 Certificate of Service)(Kraft, Denise) (Entered: Jul. 2, 2010).
Motion for Partial Summary Judgment *Plaintiffs' Motion for Partial Summary Judgment That the Certificate of Correction for the '396 Patent is Valid*—filed by Commissariat a LEnergie Atomique, SOITEC Silicon on Insulator Technologies SA. (Attachments: # 1 Certificate of Service)(Kraft, Denise) (Entered: Jul. 2, 2010).
Opening Brief in Support re 204 Motion for Partial Summary Judgment *Plaintiffs' Motion for Partial Summary Judgment That the Certificate of Correction for the '396 Patent is Valid* filed by Commissariat a LEnergie Atomique, SOITEC Silicon on Insulator Technologies SA.Answering Brief/Response due date per Local Rules is Jul. 19, 2010. (Attachments: # 1 Certificate of Service)(Kraft, Denise) (Entered: Jul. 2, 2010).
Motion for Partial Summary Judgment *SOITEC/CEA Parties' Motion for Partial Summary Judgment That the Aspar Patents Are Not Invalid for Inequitable Conduct*—filed by Commissariat a LEnergie Atomique, SOITEC Silicon on Insulator Technologies SA, SOITEC U.S.A., Inc.. (Attachments: # 1 Text of Proposed Order, # 2 Certificate of Service)(Kraft, Denise) (Entered: Jul. 2, 2010).
Opening Brief in Support re 206 Motion for Partial Summary Judgment *SOITEC/CEA Parties' Motion for Partial Summary Judgment That the Aspar Patents Are Not Invalid for Inequitable Conduct* filed by Commissariat a LEnergie Atomique, SOITEC Silicon on Insulator Technologies SA, SOITEC U.S.A., Inc..Answering Brief/Response due date per Local Rules is Jul. 19, 2010. (Attachments: # 1 Certificate of Service)(Kraft, Denise) (Entered: Jul. 2, 2010).
Motion for Partial Summary Judgment *Plaintiffs' Motion for Partial Summary Judgment That the Bruel Patent Does Not Anticipate the Aspar Patents*—filed by Commissariat a LEnergie Atomique, SOITEC Silicon on Insulator Technologies SA. (Attachments: # 1 Text of Proposed Order, # 2 Certificate of Service)(Kraft, Denise) (Entered: Jul. 2, 2010).
Opening Brief in Support re 208 Motion for Partial Summary Judgment *Plaintiffs' Motion for Partial Summary Judgment That the Bruel Patent Does Not Anticipate the Aspar Patents* filed by Commissariat a LEnergie Atomique, SOITEC Silicon on Insulator Technologies SA.Answering Brief/Response due date per Local Rules is Jul. 19, 2010. (Attachments: # 1 Certificate of Service)(Kraft, Denise) (Entered: Jul. 2, 2010).
Motion for Partial Summary Judgment *SOITEC's Motion for Partial Summary Judgment of Invalidity of United States Patent No. 5,834,812 for Lack of Enablement*—filed by SOITEC Silicon on Insulator Technologies SA, SOITEC U.S.A., Inc.. (Attachments: # 1 Text of Proposed Order, # 2 Certificate of Service)(Kraft, Denise) (Entered: Jul. 2, 2010).
Opening Brief in Support re 210 Motion for Partial Summary Judgment *SOITEC's Motion for Partial Summary Judgment of Invalidity of United States Patent No. 5,834,812 for Lack of Enablement* filed by SOITEC Silicon on Insulator Technologies SA, SOITEC U.S.A., Inc..Answering Brief/Response due date per Local Rules is Jul. 19, 2010. (Attachments: #1 Certificate of Service)(Kraft, Denise) (Entered: Jul. 2, 2010).
Motion for Partial Summary Judgment *SOITEC's Motion for Partial Summary Judgment for Invalidity of Asserted Claims of United States Patent No. 5,834,812 in View of Prior Art*—filed by SOITEC Silicon on Insulator Technologies SA, SOITEC U.S.A., Inc.. (Attachments: # 1 Text of Proposed Order, # 2 Certificate of Service)(Kraft, Denise) (Entered: Jul. 2, 2010).
Motion for Partial Summary Judgment *That the Best Mode Requirement is Satisfied for the Claims of the '009 and '396 Patents*—filed by Commissariat a LEnergie Atomique, SOITEC Silicon on Insulator Technologies SA. (Attachments: # 1 Text of Proposed Order, # 2 Certificate of Service)(Reed, John) (Entered: Jul. 2, 2010).
Opening Brief in Support re 212 Motion for Partial Summary Judgment *SOITEC's Motion for Partial Summary Judgment for Invalidity of Asserted Claims of United States Patent No. 5,834,812 in View of Prior Art* filed by SOITEC Silicon on Insulator Technologies SA, SOITEC U.S.A., Inc..Answering Brief/Response due date per Local Rules is Jul. 19, 2010. (Attachments: # 1 Certificate of Service)(Kraft, Denise) (Entered: Jul. 2, 2010).
Opening Brief in Support re 213 Motion for Partial Summary Judgment *That the Best Mode Requirement is Satisfied for the Claims of the '009 and '396 Patents* filed by SOITEC Silicon on Insulator Technologies SA.Answering Brief/Response due date per Local Rules is Jul. 19, 2010. (Attachments: # 1 Certificate of Service)(Reed, John) (Entered: Jul. 2, 2010).
Redacted Version of 200 Opening Brief in Support, by MEMC Electronic Materials Inc.. (Attachments: # 1 Certificate of Service)(Rogowski, Patricia) (Entered: Jul. 7, 2010).
Redacted Version of 201 Appendix by MEMC Electronic Materials Inc.. (Attachments: # 1 Appendix MA0001-MA0004, # 2 Appendix MA0005-MA0010, # 3 Appendix MA0011-MA0016, # 4 Appendix MA0017-MA0020, # 5 Appendix MA0021-MA0029, # 6 Appendix MA0030-MA0045, # 7 Appendix MA0046-MA0052, # 8 Appendix MA0053-MA0078, # 9 Appendix MA0079-MA0092, # 10 Appendix MA0093-MA0129, # 11 Appendix MA0130-MA0148, # 12 Appendix MA0149-MA0160, # 13 Appendix MA0161-MA0163, # 14 Appendix MA0164-MA0167, # 15 Appendix MA0168-MA0172, # 16 Appendix MA0173-MA0183, # 11 7 Appendix MA0184-MA0196, # 18 Appendix MA0197-MA0207, # 19 Appendix MA0208-MA0241, # 20 Appendix MA0242-MA0245, # 21 Appendix MA0246-MA0249, # 22 Appendix MA0250-MA0252, # 23 Appendix MA0253-MA0265, # 24 Appendix MA0266-MA0281, # 25 Appendix MA0282-MA0312, # 26 Appendix MA0313-MA0359, # 27 Appendix MA0360-MA0365, # 28 Appendix MA0366, # 29 Appendix MA0367-MA0400, # 30 Appendix MA0401-MA0474, # 31 Appendix MA0475-MA0483, # 32 Certificate)(Rogowski, Patricia) (Entered: Jul. 7, 2010).

Redacted Version of 190 Appendix by MEMC Electronic Materials Inc.. (Attachments: # 1 Appendix MA0484-MA0489, # 2 Appendix MA0490-MA0515, # 3 Appendix MA0516-MA0534, # 4 Appendix MA0535-MA0541, # 5 Appendix MA0542-MA0550, # 6 Appendix MA0551-MA0561, # 7 Appendix MA0562-MA0564, # 8 Appendix MA0565-MA0569, # 9 Appendix MA0570-MA0574, # 10 Appendix MA0575-MA0576, # 11 Appendix MA0577-MA0601, # 12 Appendix MA0602-MA0603, # 13 Appendix MA0604-MA0605, # 14 Appendix MA0606-MA0609, # 15 Appendix MA0610-MA0612, # 16 Appendix MA0613-MA0625, # 17 Appendix MA0626-MA0628, # 18 Appendix MA0629-MA0630, # 19 Appendix MA0631-MA0653, # 20 Appendix MA0654-MA0685, # 21 Appendix MA0686-MA0701, # 22 Appendix MA0702-MA0732, # 23 Appendix MA0733-MA0742, # 24 Appendix MA0743-MA0750, # 25 Appendix MA0751-MA0766, # 26 Appendix MA0767-MA0772, # 27 Appendix MA0773-MA0780, # 28 Appendix MA0781-MA0807, # 29 Appendix MA0808-MA0824, # 30 Appendix MA0825-MA0831.1, # 31 Appendix MA0832-MA0838, # 32 Appendix MA0839-MA0844, # 33 Appendix MA0845-MA0858, # 34 Appendix MA0859-MA0868, # 35 Appendix MA0869-MA0877, # 36 Appendix MA0878-MA0884, # 37 Appendix MA0885-MA0887, # 38 Appendix MA0888-MA0891, # 39 Appendix MA0892-MA0909, # 40 Appendix MA0910-MA0931, # 41 Certificate of Service)(Rogowski, Patricia) (Entered: Jul. 7, 2010).

Redacted Version of 198 Opening Brief in Support,, *SOITEC/CEA Parties' Opening Brief in Support of Motion for Summary Judgment: Non-Infringement* by Commissariat a LEnergie Atomique, SOITCE Silicon on Insulator Technologies SA, SOITEC U.S.A., Inc.. (Kraft, Denise) (Entered: Jul. 8, 2010).

Redacted Version of 197 Sealed Motion for Summary Judgment *SOITEC/CEA Parties' Motion for Summary Judgment: Non-Infringement (Filed Under Seal)*Sealed Motion for Summary Judgment *SOITCE/CEA Parties' Motion for Summary Judgment: Non-Infringement (Filed Under Seal) SOITCE/CEA Parties' Motion for Summary Judgment: Non-Infringement* by Commissariat a LEnergie Atomique, SOITCE Silicon on Insulator Technologies SA, SOITCE U.S.A., Inc.. (Kraft, Denise) (Entered: Jul. 8, 2010).

Redacted Version of 192 Appendix, *Plaintiffs' Omnibus Appendix to Daubert Motion and Motions for Partial Summary Judgment Filed on Jul. 2, 2010—vol. VI of XIX* by Commissariat a LEnergie Atomique, SOITEC Silicon on Insulator Technologies SA, SOITEC U.S.A., Inc.. (Kraft, Denise) (Entered: Jul. 9, 2010).

Redacted Version of 193 Appendix, *Plaintiffs' Omnibus Appendix to Daubert Motion and Motions for Partial Summary Judgment Filed on Jul. 2, 2010—vol. VIII of XIX* by Commissariat a LEnergie Atomique, SOITEC Silicon on Insulator Technologies SA, Soitec U.S.A., Inc.. (Kraft, Denise) (Entered: Jul. 9, 2010).

Redacted Version of 194 Appendix, *Plaintiffs' Omnibus Appendix to Daubert Motion and Motions for Partial Summary Judgment* Filed on Jul. 2, 2010—vol. X of XIX by Commissariat a LEnergie Atomique, SOITEC Silicon on Insulator Technologies SA, SOITEC U.S.A., Inc.. (Kraft, Denise) (Entered: Jul. 9, 2010).

Redacted Version of 195 Appendix, *Plaintiffs' Omnibus Appendix to Daubert Motion and Motions for Partial Summary Judgment* Filed on Jul. 2, 2010—vol. XVII of XIX by Commissariat a LEnergie Atomique, SOITEC Silicon on Insulator Technologies SA, SOITEC U.S.A., Inc.. (Kraft, Denise) (Entered: Jul. 9, 2010).

Redacted Version of 196 Appendix, *Plaintiffs' Omnibus Appendix to Daubert Motion and Motions for Partial Summary Judgment* Filed on Jul. 2, 2010—vol. XIX of XIX by Commissariat a LEnergie Atomique, SOITEC Silicon on Insulator Technologies SA, SOITEC U.S.A., Inc.. (Kraft, Denise) (Entered: Jul. 9, 2010).

Claim Construction Answering Brief re 168 Claim Construction Opening Brief, filed by MEMC Electronic Materials Inc.. (Attachments: # 1 Certificate of Service)(Rogowski, Patricia) (Entered: Jul. 9, 2010).

Appendix re 228 Claim Construction Answering Brief by MEMC Electronic Materials Inc.. (Attachments: # 1 Appendix DA0782_DA0783, # 2 Appendix DA0784-DA0785, # 3 Appendix DA0786, # 4 Appendix DA0787-DA0810, # 5 Appendix DA0811-DA0834, # 6 Appendix DA0835-DA0845, # 7 Appendix DA0846-DA0855, # 8 Certificate of Service)(Rogowski, Patricia) (Entered: Jul. 9, 2010).

Claim Construction Answering Brief re 168 Claim Construction Opening Brief, 228 Claim Construction Answering Brief *Plaintiffs S.O.I.TEC on Insulator Technologies, S.A. and Commissariat a Energie Atomique's Answering Claim Construction Brief* filed by Commissariat a LEnergie Atomique, SOITEC Silicon on Insulator Technologies SA, SOITEC U.S.A., Inc.. (Attachments: # 1 Certificate of Service)(Kraft, Denise) (Entered: Jul. 9, 2010).

Appendix re 230 Claim Construction Answering Brief, *Appendix to Plaintiffs S.O.I.TEC on Insulator Technologies, S.A. and Commissariat a Energie Atomique's Answering Claim Construction Brief* by Commissariat a LEnergie Atomique, SOITEC Silicon on Insulator Technologies SA. (Attachments: # 1 Appendix PA-0001-PA-0050, # 2 Appendix PA-0051-PA-0083, # 3 Certificate of Service)(Kraft, Denise) (Entered: Jul. 9, 2010).

Redacted Version of 183 Appendix, *Joint Appendix of Exhibits to Opening and Answering Claim Construction Briefs vol. IV of VI* by Commissariat a LEnergie Atomique, SOITEC Silicon on Insulator Technologies SA. (Kraft, Denise) (Entered: Jul. 12, 2010).

Redacted Version of 170 Exhibit to a Document, *Exhibit A to Declaration of Marcus T. Hall in Support of Plaintiffs S.O.I. TEC Silicon on Insulator Technologies, S.A. and Commissariat a L'Energie Atomique's Opening Claim Construction Brief* by Commissariat a LEnergie Atomique, SOITEC Silicon on Insulator Technologies SA. (Kraft, Denise) (Entered: Jul. 12, 2010).

Redacted Version of 171 Exhibit to a Document, *Exhibit B to Declaration of Marucs T. Hall in Support of Plaintiffs S.O.I. TEC Silicon on Insulator Technologies, S.A. and Commissariat a L'Energie Atomique's Opening Claim Construction Brief* by Commissariat a LEnergie Atomique, SOITEC Silicon on Insulator Technologies SA. (Kraft, Denise) (Entered: Jul. 12, 2010).

Redacted Version of 172 Exhibit to a Document, *Exhibit C to Declaration of Marcus T. Hall in Support of Plaintiffs S.O.I. TEC Silicon on Insulator Technologies, S.A. and Commissariat a L'Energie Atomique's Opening Claim Construction Brief* by Commissariat a LEnergie Atomique, SOITEC Silicon on Insulator Technologies SA. (Kraft, Denise) (Entered: Jul. 12, 2010).

Answering Brief in Opposition re 186 Motion in Limine *SOITEC/CEA Parties' Motion to Exclude the Expert Report of Dr. Pascal Bellon and Any Related Testimony* filed by MEMC Electronic Materials Inc..Reply Brief due date per Local Rules is Jul. 29, 2010. (Rogowski, Patricia) (Entered: Jul. 19, 2010).

Answering Brief in Opposition re 208 Motion for Partial Summary Judgment *Plaintiffs' Motion for Partial Summary Judgment That the Bruel Patent Does Not Anticipate the Aspar Patents* filed by MEMC Electronic Materials Inc.. Reply Brief due date per Local Rules is Jul. 29, 2010. (Rogowski, Patricia) (Entered: Jul. 19, 2010).

Answering Brief in Opposition re 202 Motion for Partial Summary Judgment *SOITEC/CEA Parties Motion for Partial Summary Judgment That the Patents in Suit Satisfy the Written Description Requirement* filed by MEMC Electronic Materials Inc..Reply Brief due date per Local Rules is Jul. 29, 2010. (Rogowski, Patricia) (Entered: Jul. 19, 2010).

Answering Brief in Opposition re 204 Motion for Partial Summary Judgment *Plaintiffs' Motion for Partial Summary Judgment That The Certificate of Correction for the '396 Patent is Valid* filed by MEMC Electronic Materials Inc..Reply Brief due date per Local Rules is Jul. 29, 2010. (Rogowski, Patricia) (Entered: Jul. 19, 2010).

Answering Brief in Opposition re 210 Motion for Partial Summary Judgment *SOITEC's Motion for Partial Summary Judgment of Invalidity of United States Patent No. 5,834,812 for Lack of Enablement* filed by MEMC Electronic Materials Inc..Reply Brief due date per Local Rules is Jul. 29, 2010. (Rogowski, Patricia) (Entered: Jul. 19, 2010).

Answering Brief in Opposition re 212 Motion for Partial Summary Judgment *SOITEC's Motion for Partial Summary Judgment for Invalidity of Asserted Claims of United States Patent No. 5,834,812 in View of Prior Art* filed by MEMC Electronic Materials Inc..Reply Brief due date per Local Rules is Jul. 29, 2010. (Rogowski, Patricia) (Entered: Jul. 19, 2010).

Appendix re 247 Answering Brief in Opposition,, *Appendix to Plaintiffs' Answering Brief in Opposition to Defendant's Motion for Partial Summary Judgment of Invalidity of the Asserted Asper Claims (PA-1103-PA-1156)* by Commissariat a LEnergie Atomique, SOITEC Silicon on Insulator Technologies SA. (Attachments: # 1 Exhibit PA-1103-PA-1109—Filed Under Seal, # 2 Exhibit PA-1110-PA-1118—Filed Under Seal, # 3 Exhibit PA-1119-PA-1130—Filed Under Seal, # 4 Exhibit PA-1131-PA-1143—Filed Under Seal, # 5 Exhibit PA-1144-PA-1156, # 6 Certificate of Service)(Kraft, Denise) (Entered: Jul. 19, 2010).
Appendix re 250 Answering Brief in Opposition, *Appendix to Plaintiffs' Answering Brief in Opposition to Defendant's Motion for Summary Judgment of Non-Infringement* by Commissariat a LEnergie Atomique, SOITEC Silicon on Insulator Technologies SA. (Attachments: # 1 Exhibit PA-1190-PA-1191, # 2 Certificate of Service)(Kraft, Denise) (Entered: Jul. 19, 2010).
Redacted Version of 241 Answering Brief in Opposition, to *Plaintiffs' Motion for Partial Summary Judgment that the Best Mode Requirement is Satisfied for the Claims of the '009 and '396 Patents* by MEMC Electronic Materials Inc.. (Rogowski, Patricia) (Entered: Jul. 26, 2010).
Redacted Version of 249 Answering Brief in Opposition, *to Plaintiffs' Motion for Summary Judgment on the Infringement of U.S. Patent No. 5,834,812* by MEMC Electronic Materials Inc.. (Rogowski, Patricia) (Entered: Jul. 26, 2010).
Redacted Version of 253 Answering Brief in Opposition, *to Plaintiffs' Motion for Partial Summary Judgment that the Aspar Patents Are Not Invalid for Inequitable Conduct* by MEMC Electronic Materials Inc.. (Rogowski, Patricia) (Entered: Jul. 26, 2010).
Redacted Version of 240 Appendix by MEMC Electronic Materials Inc.. (Attachments: # 1 Appendix MA0932-MA0985, # 2 Appendix MA0986-MA1039.22, # 3 Appendix MA1040-MA1144, # 4 Appendix MA1145-MA1200, # 5 Appendix MA1201-MA1265, # 6 Appendix MA1265.1-MA1338, # 7 Appendix MA1339-MA1547, # 8 Appendix MA1548-MA1627, # 9 Appendix MA1628-MA1693, # 10 Appendix MA1694-MA1953, # 11 Appendix MA1954-MA2127, # 12 Appendix MA2128-MA2206, # 13 Appendix MA2207-MA2253, # 14 Appendix MA2254-MA2273, # 15 Appendix MA2274-MA2333, # 16 Appendix MA2334-MA2337, # 17 Appendix MA2338-MA2342, # 18 Appendix MA2343-MA2346, # 19 Appendix MA2347-MA2351, # 20 Certificate of Service)(Rogowski, Patricia) (Entered: Jul. 26, 2010) (2 parts).
Redacted Version of 261 Answering Brief in Opposition, to *Plaintiffs' Motion for Partial Summary Judgment that the Best Mode Requirement is Satisfied for the Claims of the '009 and '396 Patents* (Corrected Version of D.I. 241) by MEMC Electronic Materials Inc.. (Rogowski, Patricia) (Entered: Jul. 26, 2010).
Redacted Version of 250 Answering Brief in Opposition, *to Soitec's Brief in Opposition to Defendant's Motion for Summary Judgment of Non-Infringement* by Commissariat a LEnergie Atomique, SOITEC Silicon on Insulator Technologies SA. (Attachments: # 1 Certificate of Service)(Kraft, Denise) (Entered: Jul. 26, 2010).
Redacted Version of 247 Answering Brief in Opposition,, to *Plaintiffs' Answering Brief in Opposition to Defendant's Motion for Partial Summary Judgment of in validity of the Asserted Aspar Claims* by Commissariat a LEnergie Atomique, SOITEC Silicon on Insulator Technologies SA. (Attachments: # 1 Certificate of Service)(Kraft, Denise) (Entered: Jul. 26, 2010).
Redacted Version of 254 Appendix,, to *Appendix to Plaintiffs' Answering Brief in Opposition to Defendant's Motion for Partial Summary Judgment of Invalidity of the Asserted Aspar Claims* (PA-1103-PA-1143 by Commissariat a LEnergie Atomique, SOITEC Silicon on Insulator Technologies SA. (Kraft, Denise) (Entered: Jul. 26, 2010).
Redacted Version of 251 Appendix,, to *Appendix to Plaintiffs' Answering Brief in Opposition to Defendant's Motion for Summary Judgment of Non-Infringement* by Commissariat a LEnergie Atomique, SOITEC Silicon on Insulator Technologies SA. (Kraft, Denise) (Entered: Jul. 26, 2010).
Reply Brief re 204 Motion for Partial Summary Judgment *Plaintiffs' Motion for Partial Summary Judgment That the Certificate of Correction for the '396 Patent is Valid Reply Brief in Support of Plaintiffs' Motion for Partial Summary Judgment That the Certificate of Correction for the '396 Patent is Valid* filed by Commissariat a LEnergie Atomique, SOITEC Silicon on Insulator Technologies SA. (Attachments: # 1 Certificate of Service)(Kraft, Denise) (Entered: Jul. 30, 2010).

Declaration re 268 Reply Brief, *Declaration of Marcus T. Hall in Support of Reply Brief in Support of Plaintiffs' Motion for Partial Summary Judgment That the Certificate of Correction for the '396 Patent is Valid* by Commissariat a LEnergie Atomique, SOITEC Silicon on Insulator Technologies SA. (Attachments: # 1 Exhibit A, # 2 Certificate of Service)(Kraft, Denise) (Entered: Jul. 30, 2010).
Appendix re 268 Reply Brief, *Omnibus Appendix to Plaintiffs' Reply Briefs in Support of Plaintiffs' Daubert Motion and Motions for Partial Summary Judgment* (PA-1192-PA-1261) by Commissariat a LEnergie Atomique, SOITEC Silicon on Insulator Technologies SA. (Attachments: # 1 Exhibit PA-1199-PA-1204, # 2 Exhibit PA-1205-PA-1206, # 3 Exhibit PA-1206.1, # 4 Exhibit PA-1231-PA-1237, # 5 Exhibit PA-1268-PA-1245, # 6 Exhibit PA-1246-PA-1257, # 7 Exhibit PA-1258-PA-1261, # 8 Certificate of Service)(Kraft, Denise) (Entered: Jul. 30, 2010).
Reply Brief re 210 Motion for Partial Summary Judgment *SOITEC's Motion for Partial Summary Judgment of Invalidity of United States Patent No. 5,834,812 for Lack of Enablement Reply Brief in Support of SOITEC's Motion for Partial Summary Judgment of Invalidity of United States Patent No. 5,834,812 for Lack of Enablement* filed by SOITEC Silicon on Insulator Technologies SA, SOITEC U.S.A., Inc.. (Attachments: # 1 Certificate of Service)(Kraft, Denise) (Entered: Jul. 30, 2010).
Reply Brief re 212 Motion for Partial Summary Judgment *SOITEC's Motion for Partial Summary Judgment for Invalidity of Asserted Claims of United States Patent No. 5,834,812 in View of Prior Art Reply Brief in Support of SOITEC's Motion for Partial Summary Judgment for Invalidity of Asserted Claims of United States Patent No. 5,834,812 in View of Prior Art* filed by SOITEC Silicon on Insulator Technologies SA, SOITEC U.S.A., Inc.. (Attachments: # 1 Exhibit A, # 2 Exhibit B, # 3 Certificate of Service)(Kraft, Denise) (Entered: Jul. 30, 2010).
Reply Brief re 202 Motion for Partial Summary Judgment *SOITEC/CEA Parties Motion for Partial Summary Judgment That the Patents in Suit Satisfy the Written Description Requirement Reply Brief in Support of SOITEC/CEA Parties' Motion for Partial Summary Judgment That the Patents in Suit Satisfy the Written Description Requirement* filed by Commissariat a LEnergie Atomique, SOITEC Silicon on Insulator Technologies SA. (Attachments: # 1 Certificate of Service)(Kraft, Denise) (Entered: Jul. 30, 2010).
Redacted Version of 269 Appendix, *To Reply Brief in Support of MEMC's Motion for Partial Summary Judgment of Invalidity of the Asserted ASPAR Patent Claims* by MEMC Electronic Materials Inc.. (Attachments: # 1 Appendix Table of Contents, # 2 Appendix MA2453_MA2479, # 3 Certificate of Service)(Rogowski, Patricia) (Entered: Aug. 3, 2010).
Redacted Version of 273 Appendix *Reply Brief in Support of MEMC's Motion for Summary Judgment of Non-Infringement* by MEMC Electronic Materials Inc.. (Attachments: # 1 Appendix Table of Contents, # 2 Appendix MA2352-MA2361, # 3 Appendix MA2362-MA2371, # 4 Appendix MA2372-MA2381, # 5 Appendix MA2382-MA2391, # 6 Appendix MA2392-MA2399, # 7 Appendix MA2400-MA2404, # 8 Appendix MA2405-MA2422, # 9 Appendix MA2423-MA2425, # 10 Appendix MA2426-MA2427, # 11 Appendix MA2428-MA2430, # 12 Appendix MA2431-MA2440, # 13 Appendix MA2441-MA2448, # 14 Appendix MA2449-MA2452, # 15 Appendix MA2452.1-MA2452.9, # 16 Certificate of Service)(Rogowski, Patricia) (Entered: Aug. 3, 2010).
Redacted Version of 267 Reply Brief *In Support of MEMC's Motion for Partial Summary Judgment of Invalidity of the Asserted Aspar Patent Claims* by MEMC Electronic Materials Inc.. (Rogowski, Patricia) (Entered: Aug. 3, 2010).
Redacted Version of 271 Reply Brief *In Support of MEMC's Motion for Summary Judgment of Non-Infringement* by MEMC Electronic Materials Inc.. (Rogowski, Patricia) (Entered: Aug. 3, 2010).
Redacted Version of 274 Appendix,, Omnibus Appendix to Plaintiffs' Reply Briefs in Support of Plaintiffs' Daubert Motion and Motions for Partial Summary Judgment (PA-1192-PA-1198 and PA-1207-PA-1230 Filed Under Seal) by Commissariat a LEnergie Atomique, SOITEC Silicon on Insulator Technologies SA. (Kraft, Denise) (Entered: Aug. 6, 2010).
Redacted Version of 277 Reply Brief, in Support of SOITEC/CEA Parties' Motion to Exclude the Expert Report of Dr. Pascal Belton and Any Related Testimony by Commissariat a LEnergie Atomique, SOITEC Silicon on Insulator Technologies SA. (Attachments: # 1 Certificate of Service)(Kraft, Denise) (Entered: Aug. 6, 2010).
Redacted Version of 278 Reply Brief,, in Support of SOITEC/CEA Parties' Motion for Summary Judgment: Non-Infringement (Filed Under Seal) by Commissariat a LEnergie Atomique, SOITEC Silicon on Insulator Technologies SA. (Attachments: # 1 Certificate of Service)(Kraft, Denise) (Entered: Aug. 6, 2010).
Redacted Version of 279 Reply Brief,, in Support of Plaintiffs' Motion for Partial Summary Judgment That the Best Mode Requirement is Satisfied for the Claims of the '009 and '396 Patents (Filed Under Seal) by Commissariat a LEnergie Atomique, SOITEC Silicon on Insulator Technologies SA. (Attachments: # 1 Certificate of Service)(Kraft, Denise) (Entered: Aug. 6, 2010).
Redacted Version of 281 Reply Brief, in Support of Plaintiffs' Motion for Partial Summary Judgment That the Bruel Patent Does Not Anticipate the Aspar Patents (Filed Under Seal) by Commissariat a LEnergie Atomique, SOITEC Silicon on Insulator Technologies SA. (Attachments: # 1 Certificate of Service)(Kraft, Denise) (Entered: Aug. 6, 2010).
Redacted Version of 282 Reply Brief,, in Support of SOITEC/CEA Parties' Motion for Partial Summary Judgment That the Aspar Patents Are Not Invalid for Inequitable Conduct (Filed Under Seal) by Commissariat a LEnergie Atomique, SOITEC Silicon on Insulator Technologies SA. (Attachments: # 1 Certificate of Service)(Kraft, Denise) (Entered: Aug. 6, 2010).
Notice of Service of CD of documents MEMC0782194-MEMC0782500 and FH-1 0001-FH-8 0067 by MEMC Electronic Materials Inc..(Rogowski, Patricia) (Entered: Sep. 16, 2010).
Redacted Version of 301 Sealed Motion for Reconsideration Request to Modify Protective Order by Commissariat a LEnergie Atomique, SOITEC Silicon on Insulator Technologies SA. (Attachments: # 1 Certificate of Service)(Kraft, Denise) (Entered: Sep. 24, 2010).
Redacted Version of 302 Declaration, of Michael L. Brody in Support of Motion to Reconsider Request to Modify Protective Order by Commissariat a LEnergie Atomique, SOITEC Silicon on Insulator Technologies SA. (Attachments: # 1 Certificate of Service)(Kraft, Denise) (Entered: Sep. 24, 2010).
Redacted Version of 303 Exhibit to a Document Exhibit A to Michael L. Brody in Support of Motion to Reconsider Request to Modify Protective Order by Commissariat a LEnergie Atomique, SOITEC Silicon on Insulator Technologies SA. (Kraft, Denise) (Entered: Sep. 24, 2010).
Redacted Version of 304 Exhibit to a Document Exhibit B to Michael L. Brody in Support of Motion to Reconsider Request to Modify Protective Order by Commissariat a LEnergie Atomique, SOITEC Silicon on Insulator Technologies SA. (Kraft, Denise) (Entered: Sep. 24, 2010).
Redacted Version of 305 Exhibit to a Document Exhibit C to Michael L. Brody in Support of Motion to Reconsider Request to Modify Protective Order by Commissariat a LEnergie Atomique, SOITEC Silicon on Insulator Technologies SA. (Kraft, Denise) (Entered: Sep. 24, 2010).
Redacted Version of 306 Exhibit to a Document Exhibit D to Michael L. Brody in Support of Motion to Reconsider Request to Modify Protective Order by Commissariat a LEnergie Atomique, SOITEC Silicon on Insulator Technologies SA. (Kraft, Denise) (Entered: Sep. 24, 2010).
Proposed Pretrial Order [Proposed] Joint Pretrial Order (Filed Under Seal) by Commissariat a LEnergie Atomique, SOITEC Silicon on Insulator Technologies SA, SOITEC U.S.A., Inc.. (Attachments: # 1 Exhibit 1 (Sealed), # 2 Exhibit 2A (Sealed), # 3 Exhibit 2B (Sealed), # 4 Exhibit 3A (Sealed), # 5 Exhibit 3B (Sealed), # 6 Exhibit 4A (Sealed), # 7 Exhibit 4B (Sealed), # 8 Exhibit 4C (Sealed), # 9 Exhibit 5A (Sealed), # 10 Exhibit 5B (Sealed), # 11 Exhibit 6A (Sealed), # 12 Exhibit 6B (Sealed), # 13 Exhibit 7A (Sealed), # 14 Exhibit 7B (Sealed), # 15 Certificate of Service)(Kraft, Denise) (Entered: Oct. 7, 2010).
Proposed Voir Dire by MEMC Electronic Materials Inc.. (Attachments: # 1 Certificate of Service)(Rogowski, Patricia) (Entered: Oct. 8, 2010).
Verdict Sheet by MEMC Electronic Materials Inc.. (Attachments: # 1 Certificate of Service)(Rogowski, Patricia) (Entered: Oct. 8, 2010).

Proposed Voir Dire by Commissariat a LEnergie Atomique, SOITEC Silicon on Insulator Technologies SA, SOITEC U.S.A., Inc.. (Attachments: # 1 Certificate of Service)(Kraft, Denise) (Entered: Oct. 8, 2010).
Verdict Sheet by Commissariat a LEnergie Atomique, SOITEC Silicon on Insulator Technologies SA, SOITEC U.S.A., Inc.. (Attachments: # 1 Certificate of Service)(Kraft, Denise) (Entered: Oct. 8, 2010).
Proposed Jury Instructions by Commissariat a LEnergie Atomique, SOITEC Silicon on Insulator Technologies SA, SOITEC U.S.A., Inc.. (Kraft, Denise) (Entered: Oct. 8, 2010).
Redacted Version of 315 Proposed Pretrial Order,, Redacted Version of [Proposed] Joint Pretrial Order by Commissariat a LEnergie Atomique, SOITEC Silicon on Insulator Technologies SA, SOITEC U.S.A., Inc.. (Attachments: # 1 Exhibit 1, # 2 Exhibit 2A, # 3 Exhibit 2B, # 4 Exhibit 3A, # 5 Exhibit 3B, # 6 Exhibit 4A, # 7 Exhibit 4B, # 8 Exhibit 4C, # 9 Exhibit 5A, # 10 Exhibit 5B, # 11 Exhibit 6A, # 12 Exhibit 6B, # 13 Exhibit 7A, # 14 Exhibit 7B, # 15 Certificate of Service)(Kraft, Denise) (Entered: Oct. 13, 2010).
Memorandum Opinion. Signed by Judge Sue L. Robinson on Oct. 13, 2010. (nmf) (Entered: Oct. 13, 2010).
Order denying 141 Motion for Discovery; denying 186 Motion in Limine; granting in part and denying in part 187 Motion for Partial Summary Judgment; granting 197 Motion for Summary Judgment; granting 199 Motion for Summary Judgment ; granting 202 Motion for Partial Summary Judgment; denying 204 Motion for Partial Summary Judgment; denying 206 Motion for Partial Summary Judgment; granting in part and denying in part 208 Motion for Partial Summary Judgment; denying 210 Motion for Partial Summary Judgment; denying 212 Motion for Partial Summary Judgment; granting in part and denying in part 213 Motion for Partial Summary Judgment. Signed by Judge Sue L. Robinson on Oct. 13, 2010. (nmf) (Entered: Oct. 13, 2010).
Memorandum Order re: claim construction. Signed by Judge Sue L. Robinson on Oct. 13, 2010. (nmf) (Entered: Oct. 13, 2010) Oral Order by Judge Sue L. Robinson on Oct. 14, 2010 that the responses to the issues raised in the exhibits to the joint pre-trial order are to be stricken from the record. (These filings, formerly D.I. Nos. 318 and 323 have been deleted from the docket.) (nmf) (Entered: Oct. 14, 2010).
Amended Order denying 141 Motion for Discovery; denying 186 Motion in Limine; granting in part and denying in part 187 Motion for Partial Summary Judgment; granting 197 Motion for Summary Judgment ; granting 199 Motion for Summary Judgment ; granting 202 Motion for Partial Summary Judgment; denying 204 Motion for Partial Summary Judgment; denying 206 Motion for Partial Summary Judgment; granting in part and denying in part 208 Motion for Partial Summary Judgment; denying 210 Motion for Partial Summary Judgment; denying 212 Motion for Partial Summary Judgment; *granting* 213 Motion for Partial Summary Judgment. Signed by Judge Sue L. Robinson on Oct. 14, 2010. (nmf) (Entered: Oct. 14, 2010) Minute Entry for proceedings held before Judge Sue L. Robinson—Final Pretrial Conference held on Oct. 14, 2010. (Court Reporter V. Gunning.) (nmf) (Entered: Oct. 15, 2010) So Ordered, re 315 Proposed Pretrial Order. Signed by Judge Sue L. Robinson on Oct. 14, 2010. (nmf) (Entered: Oct. 15, 2010).
Motion for Reargument re 327 Memorandum and Order—Reargument of Claim Construction of One Claim Term of U.S. Patent 6,809,009—filed by MEMC Electronic Materials Inc.. (Rogowski, Patricia) (Entered: Oct. 18, 2010).
Second Amended Order re: 325 denying 141 Motion for Discovery; denying 186 Motion in Limine; granting in part and denying in part 187 Motion for Partial Summary Judgment; granting 197 Motion for Summary Judgment ; granting 199 Motion for Summary Judgment **with respect to the '484 patent and with respect to its current process, and denied in other respects; granting 202 Motion for Partial Summary Judgment; denying 204 Motion for Partial Summary Judgment; denying 206 Motion for Partial Summary Judgment; granting in part and denying in part 208 Motion for Partial Summary Judgment; denying 210 Motion for Partial Summary Judgment; denying 212 Motion for Partial Summary Judgment; granting 213 Motion for Partial Summary Judgment. Signed by Judge Sue L. Robinson on Oct. 19, 2010. (nmf) (Entered: Oct. 19, 2010).

Memorandum Order granting 329 Motion for Reargument re 327 Memorandum and Order—Reargument of Claim Construction of One Claim Term of U.S. Patent 6,809,009. Signed by Judge Sue L. Robinson on Oct. 19, 2010. (nmf) (Entered: Oct. 19, 2010).
Stipulation MEMC's Declaratory Judgment counterclaim asserting invalidity of United States Reissued Patent No. 39,484 in Civil Action No. 1:08-292-SLR is dismissed without prejudice by Commissariat a LEnergie Atomique, SOITEC Silicon On Insulator Technologies SA, SOITEC U.S.A., Inc.. (Kraft, Denise) (nmf, ). (Entered: Oct. 21, 2010).
Stipulation of Fact re 331 Memorandum and Order, 327 Memorandum and Order, 325 Memorandum Opinion by Commissariat a LEnergie Atomique, SOITEC Silicon on Insulator Technologies SA, SOITEC U.S.A., Inc.. (Kraft, Denise) (Entered: Oct. 21, 2010).
Letter to the Honorable Sue L. Robinson from Denise Seastone Kraft regarding Mutually agreed upon narrowing of the issue for trail—re 333 Stipulation, 332 Stipulation,. (Kraft, Denise) (Entered: Oct. 21, 2010) Correcting Entry: The pdf of D.I. 332 has been replaced with the correct pdf of the stipulation per request of filer. (nmf) (Entered: Oct. 22, 2010) So Ordered, re 333 Stipulation filed by SOITEC Silicon on Insulator Technologies SA, SOITEC U.S.A., Inc., Commissariat a LEnergie Atomique, 332 Stipulation, filed by SOITEC on Insulator Technologies SA, SOITEC U.S.A., Inc., Commissariat a LEnergie Atomique. Signed by Judge Sue L. Robinson on Oct. 22, 2010. (nmf) (Entered: Oct. 22, 2010).
Voir Dire Questions. Read in Open Court Oct. 25, 2010.(nmf) (Entered: Oct. 25, 2010).
Preliminary Jury Instructions. Read in Open Court Oct. 25, 2010. (nmf) (Entered: Oct. 25, 2010) Minute Entry for proceedings held before Judge Sue L. Robinson: Jury Trial Day 1 held on Oct. 25, 2010. (Court Reporter Valerie Gunning, Brian Gaffigan.) (dlk) (Entered: Oct. 26, 2010).
Plaintiff's Bench Memorandum. Filed in Court Oct. 26, 2010. (nmf) (Entered: Oct. 26, 2010) Minute Entry for proceedings held before Judge Sue L. Robinson—Jury Trial (Day 2) held on Oct. 26, 2010. (Court Reporter Valerie Gunning, Kevin Maurer.) (dlk) (Entered: Oct. 26, 2010) Minute Entry for proceedings held before Judge Sue L. Robinson—Jury Trial—Day 3, held on Oct. 27, 2010. (Court Reporter Valerie Gunning/Kevin Maurer.) (nms) (Entered: Oct. 27, 2010).
Statement—Bench Memorandum Supporting MEMC's Proffer of Admissions by SOITEC in Prior Lawsuit Involving the '564 Patent submitted at trial by MEMC Electronic Materials Inc.. (Attachments: # 1 Exhibit A)(Rogowski, Patricia) (Entered: Oct. 28, 2010) Minute Entry for proceedings held before Judge Sue L. Robinson—Jury Trial—Day 4 held on Oct. 28, 2010. (Court Reporter Valerie Gunning/Kevin Maurer.) (nms) (Entered: Nov. 1, 2010).
Final Jury Instructions read in open Court by Judge Robinson. (lid) (Entered: Nov. 1, 2010) Minute Entry for proceedings held before Judge Sue L. Robinson—Jury Trial held on Nov. 1, 2010. (Day 5) (Court Reporter V. Gunning.) (lid) (Entered: Nov. 2, 2010) Minute Entry for proceedings held before Judge Sue L. Robinson—Jury Trial completed on Nov. 2, 2010. (Day 6) (Court Reporter V. Gunning.) (lid) (Entered: Nov. 2, 2010).
Redacted Version of 342 Jury Verdict. (lid) (Entered: Nov. 2, 2010).
Statement Bench Memorandum in Support of Plaintiffs' Motion for Judgment as a Matter of Law of No Unenforceability of the '009 Patent Due to Inequitable Conduct submitted at trial by Commissariat a LEnergie Atomique, SOITEC Silicon on Insulator Technologies SA, SOITEC U.S.A., Inc.. (Attachments: # 1 Certificate of Service)(Kraft, Denise) (Entered: Nov. 2, 2010).
Answering Brief in Opposition re 301 Sealed Motion for Reconsideration Request to Modify Protective Order (MEMC's Opposition to Plaintiffs' Motion for Reargument Re: Modification of the Protective Order) filed by MEMC Electronic Materials Inc..Reply Brief due date per Local Rules is Nov. 22, 2010. (Attachments: # 1 Exhibit 1 through 5, # 2 Certificate of Service)(Rogowski, Patricia) (Entered: Nov. 12, 2010).
Judgment in favor of defendant MEMC Electronic Materials, Inc. and against plaintiffs S.O.I.TEC Silicon on Insulator Technologies, S.A. and Commisseriat a LEnergie Atomique et aux Energies Alternatives as to the 812 patent. It Is Further Ordered that judgment be and is hereby entered in favor of plaintiffs S.O.I.TEC Silicon on Insulator Technologies, S.A. and Commisseriat a LEnergie Atomique et aux Energies Alternatives and against defendant MEMC Electronic Materials, Inc. as to the 009 patent. Signed by Judge Sue L. Robinson on Nov. 15, 2010. (nmf) (Entered: Nov. 15, 2010).
Stipulation Setting Post-Trial Briefing Schedule re 348 Judgment by Commissariat a LEnergie Atomique, MEMC Electronic Materials Inc., SOITEC Silicon on Insulator Technologies SA. (Rogowski, Patricia) (Entered: Nov. 15, 2010).
Motion for Reargument re 348 Judgment,, (MEMCS Motion for Reargument of the Courts Order re: The Unenforceability of the 009 Patent)—filed by MEMC Electronic Materials Inc.. (Attachments: # 1 Exhibit 1)(Rogowski, Patricia) (Entered: Nov. 16, 2010) So Ordered—re 349 Stipulation. Set Post Trail Briefing Schedual: (Opening Brief due Dec. 8, 2010., Answering Brief due Dec. 29, 2010., Reply Brief due Jan. 12, 2010.). Signed by Judge Sue L. Robinson on Nov. 17, 2010. (lid) (Entered: Nov. 17, 2010).
Motion for Leave to File Reply in Support of Plaintiff's Motion for Reargument—filed by Commissariat a LEnergie Atomique, SOITEC Silicon on Insulator Technologies SA. (Attachments: # 1 Text of Proposed Order, # 2 Certificate of Service)(Kraft, Denise) (Entered: Nov. 23, 2010).
Opening Brief in Support re 301 Sealed Motion for Reconsideration Request to Modify Protective Order, 351 Motion for Leave to File Reply in Support of Plaintiff's Motion for Reargument filed by Commissariat a LEnergie Atomique, SOITEC Silicon on Insulator Technologies SA.Answering Brief/Response due date per Local Rules is Dec. 10, 2010. (Attachments: # 1 Appendix A, # 2 Certificate of Service)(Kraft, Denise) (Entered: Nov. 23, 2010).
Stipulation to Extend Time Respond to MEMC's Motion for Reargument of the Court's Order Re: Unenforceability of the '009 Patent to Dec. 3, 2010—filed by Commissariat a LEnergie Atomique, SOITEC Silicon on Insulator Technologies SA, SOITEC U.S.A., Inc.. (Attachments: # 1 Certificate of Service)(Kraft, Denise) (Entered: Nov. 24, 2010) So Ordered—re 353 Stipulation to Extend Time. Set Briefing Schedule: re 350 Motion for Reargument re 348 Judgment,. (Answering Brief due Dec. 3, 2010.). Signed by Judge Sue L. Robinson on Nov. 30, 2010. (lid) (Entered: Nov. 30, 2010).
Stipulation to Extend Time to file Motions and Opening Post-Trial Briefs to Dec. 13, 2010—filed by Commissariat a LEnergie Atomique, SOITEC Silicon on Insulator Technologies SA, SOITEC U.S.A., Inc.. (Kraft, Denise) (Entered: Dec. 3, 2010).
Reply Brief re 350 Motion for Reargument re 348 Judgment,, (MEMCS Motion for Reargument of the Courts Order re: The Unenforceability of the 009 Patent) Plaintiffs' Opposition to MEMC's Motion for Reargument of the Court's Order Re: The Unenforceability of the '009 Patent filed by Commissariat a LEnergie Atomique, SOITEC Silicon on Insulator Technologies SA, SOITEC U.S.A., Inc.. (Attachments: # 1 Exhibit A, # 2 Certificate of Service)(Kraft, Denise) (Entered: Dec. 3, 2010) So Ordered—re 354 Stipulation to Extend Time. Set Briefing Schedule: (Post Trial Opening Brief due Dec. 13, 2010.). Signed by Judge Sue L. Robinson on Dec. 6, 2010. (lid) (Entered: Dec. 6, 2010).
Exhibit re 355 Reply Brief, Exhibit B to Plaintiffs' Opposition to MEMC's Motion for Reargument of the Court's Order Re: The Unenforceability of the '009 Patent by Commissariat a LEnergie Atomique, SOITEC Silicon on Insulator Technologies SA, SOITEC U.S.A., Inc.. (Kraft, Denise) (Entered: Dec. 6, 2010).
Answering Brief in Opposition re 351 Motion for Leave to File Reply in Support of Plaintiff's Motion for Reargument filed by MEMC Electronic Materials Inc..Reply Brief due date per Local Rules is Dec. 20, 2010. (Rogowski, Patricia) (Entered: Dec. 10, 2010).
Stipulation to Extend Time Stipulation and Order for Plaintiffs to file Motions and Opening Post-Trial Briefs to Dec. 14, 2010—filed by Commissariat a LEnergie Atomique, SOITEC Silicon on Insulator Technologies SA, SOITEC U.S.A., Inc.. (Kraft, Denise) (Entered: Dec. 13, 2010).
Motion for Judgment as a Matter of Law—MEMC's Renewed Motion for Judgment as a Matter of Law or in the Alternative for a New Trial—filed by MEMC Electronic Materials Inc.. (Rogowski, Patricia) (Entered: Dec. 13, 2010).
Opening Brief in Support re 359 Motion for Judgment as a Matter of Law—MEMC's Renewed Motion for Judgment as a Matter of Law or in the Alternative for a New Trial filed by MEMC Electronic Materials Inc..Answering Brief/Response due date per Local Rules is Dec. 30, 2010. (Attachments: # 1 Exhibit 1, # 2 Certificate of Service)(Rogowski, Patricia) (Entered: Dec. 13, 2010).

Motion for Judgment as a Matter of Law Plaintiffs' Renewed Motion for Judgment as a Matter of Law or in the Alternative for a New Trial—filed by Commissariat a LEnergie Atomique, SOITEC Silicon on Insulator Technologies SA. (Attachments: # 1 Text of Proposed Order, # 2 Certificate of Service)(Kraft, Denise) (Entered: Dec. 14, 2010).

Opening Brief in Support re 361 Motion for Judgment as a Matter of Law Plaintiffs' Renewed Motion for Judgment as a Matter of Law or in the Alternative for a new Trial filed by Commissariat a LEnergie Atomique, SOITEC Silicon on Insulator Technologies SA.Answering Brief/Response due date per Local Rules is Jan. 3, 2011. (Attachments: # 1 Certificate of Service)(Kraft, Denise) (Entered: Dec. 14, 2010).

Motion for Injunctive Relief Plaintiffs' Motion for Injunctive Relief and to Lift Stay on Damages Discovery—filed by Commissariat a LEnergie Atomique, SOITEC Silicon on Insulator Technologies SA. (Attachments: # 1 Text of Proposed Order, # 2 Certificate of Service)(Kraft, Denise) (Entered: Dec. 14, 2010).

Stipulation to Extend Time due date for Answering and Reply Post-Trial Briefs to Jan. 7, 2011 for Answering Brief and Jan. 21, 2011 for Reply Brief—filed by MEMC Electronic Materials Inc.. (Rogowski, Patricia) (Entered: Dec. 15, 2010) So Ordered—re 365 Stipulation to Extend Time. Set Briefing Schedule: (Answering Post trial Brief due Jan. 7, 2011., Reply post trial Brief due Jan. 21, 2011.). Signed by Judge Sue L. Robinson on Dec. 16, 2010. (lid) (Entered: Dec. 17, 2010).

Stipulation to Extend Time Post-Trial Answering Briefs to Jan. 12, 2011—filed by MEMC Electronic Materials Inc.. (Rogowski, Patricia) (Entered: Jan. 6, 2011).

Notice of Appearance by Aleine Michelle Porterfield on behalf of Commissariat a LEnergie Atomique, SOITEC Silicon on Insulator Technologies SA, SOITEC U.S.A., Inc. (Attachments: # 1 Certificate of Service)(Porterfield, Aleine) (Entered: Jan. 7, 2011).

Joint Stipulation to Extend Time Post-trial Answering Briefs and Post-trial Reply Briefs to Jan. 14, 2011 and Jan. 28, 2011—filed by MEMC Electronic Materials Inc.. (Rogowski, Patricia) (Entered: Jan. 12, 2011).

Answering Brief in Opposition re 359 Motion for Judgment as a Matter of Law—*MEMC's Renewed Motion for Judgment as a Matter of Law or in the Alternative for a New Trial* filed by Commissariat a LEnergie Atomique, SOITEC Silicon on Insulator Technologies SA, SOITEC U.S.A., Inc..Reply Brief due date per Local Rules is Jan. 24, 2011. (Attachments: # 1 Certificate of Service)(Kraft, Denise) (Entered: Jan. 14, 2011).

Answering Brief in Opposition re 361 Motion for Judgment as a Matter of Law *Plaintiffs' Renewed Motion for Judgment as a Matter of Law or in the Alternative for a New Trial* (*MEMCS Answering Brief in Opposition to Plaintiffs Renewed Motion for Judgment as a Matter of Law or in the Alternative for a New Trial*) filed by MEMC Electronic Materials Inc..Reply Brief due date per Local Rules is Jan. 24, 2011. (Attachments: # 1 Certificate of Service)(Rogowski, Patricia) (Entered: Jan. 14, 2011).

Declaration re 378 Answering Brief in Opposition, (*Declaration of Robert M. Evans, Jr. in Support of MEMCS Opposition to Plaintiffs Renewed Motion for Judgment as a Matter of Law or in the Alternative for a New Trial*) by MEMC Electronic Materials Inc.. (Attachments: # 1 Exhibit 1, # 2 Exhibit 2, # 3 Certificate of Service)(Rogowski, Patricia) (Entered: Jan. 14, 2011).

Redacted Version of 376 Answering Brief in Opposition, *to Plaintiffs' Motion for Injunctive Relief and to Lift Stay on Damages Discovery* by MEMC Electronic Materials Inc.. (Attachments: # 1 Certificate of Service)(Rogowski, Patricia) (Entered: Jan. 20, 2011).

Redacted Version of 377 Appendix *to MEMC's Answering Brief in Opposition to Plaintiffs' Motion for Injunctive Relief and to Lift Stay on Damages Discovery* by MEMC Electronic Materials Inc.. (Attachments: # 1 Exhibit 1-7, # 2 Exhibit 8, # 3 Exhibit 9, # 4 Exhibit 10, # 5 Exhibit 11, # 6 Exhibit 12-13, # 7 Exhibit 14, # 8 Exhibit 15, # 9 Exhibit 16, # 10 Exhibit 17, # 11 Exhibit 18, # 12 Exhibit 19, # 13 Certificate of Service)(Rogowski, Patricia) (Entered: Jan. 20, 2011).

Joint Stipulation to Extend Time of Post-Trial Reply Briefs to Tuesday, Feb. 1, 2011—filed by Commissariat a LEnergie Atomique, SOITEC Silicon on Insulator Technologies SA, SOITEC U.S.A., Inc.. (Kraft, Denise) (Entered: Jan. 28, 2011).

Joint Stipulation to Extend Time of Post-Trial Reply Briefs to Friday, Feb. 4, 2011—filed by Commissariat a LEnergie Atomique, SOITEC Silicon on Insulator Technologies SA, SOITEC U.S.A., Inc.. (Kraft, Denise) (Entered: Jan. 31, 2011).

Redacted Version of 364 Opening Brief in Support,,,, *Redacted Version of Opening Brief in Support of Plaintiffs' Motion for Injunctive Relief and to Lift Stay on Damages Discovery* by Commissariat a LEnergie Atomique, SOITEC Silicon on Insulator Technologies SA, SOITEC U.S.A., Inc.. (Attachments: # 1 Exhibit A, # 2 Exhibit B, # 3 Exhibit C, # 4 Exhibit D, # 5 Exhibit E, # 6 Exhibit F, # 7 Exhibit G, # 8 Exhibit H, # 9 Exhibit I, # 10 Exhibit J, # 11 Exhibit K, # 12 Exhibit L, # 13 Exhibit M, # 14 Exhibit N, # 15 Exhibit 0, # 16 Exhibit P, # 17 Exhibit Q, # 18 Exhibit R, # 19 Exhibit S)(Kraft, Denise) (Entered: Feb. 2, 2011).

Reply Brief re 359 Motion for Judgment as a Matter of Law— *MEMC's Renewed Motion for Judgment as a Matter of Law or in the Alternative for a New Trial* filed by MEMC Electronic Materials Inc.. (Attachments: # 1 Certificate of Service)(Rogowski, Patricia) (Entered: Feb. 4, 2011).

Reply Brief re 361 Motion for Judgment as a Matter of Law *Plaintiffs' Renewed Motion for Judgment as a Matter of Law or in the Alternative for a New Trial* filed by Commissariat a LEnergie Atomique, SOITEC Silicon on Insulator Technologies SA, SOITEC U.S.A., Inc.. (Attachments: # 1 Certificate of Service)(Kraft, Denise) (Entered: Feb. 4, 2011).

Declaration re 387 Reply Brief, *Declaration of Michael L. Brody in Support of Reply Brief in Support of Plaintiffs' Renewed Motion for Judgment as a Matter of Law or in the Alternative for a New Trial* by Commissariat a LEnergie Atomique, SOITEC Silicon on Insulator Technologies SA, SOITEC U.S.A., Inc.. (Attachments: # 1 Exhibit A, # 2 Certificate of Service)(Kraft, Denise) (Entered: Feb. 4, 2011).

Motion to Strike 386 Reply Brief, *Motion by Plaintiffs' to Strike Reply Brief in Support of MEMC's Renewed Motion for Judgment as a Matter of Law or, In the Alternative, a New Trial* (D.I. 386)—filed by Commissariat a LEnergie Atomique, SOITEC Silicon on Insulator Technologies SA, SOITEC U.S.A., Inc.. (Attachments: # 1 Certificate of Service)(Kraft, Denise) (Entered: Feb. 8, 2011).

Opening Brief in Support re 390 Motion to Strike 386 Reply Brief, *Motion by Plaintiffs' to Strike Reply Brief in Support of MEMC's Renewed Motion for Judgment as a Matter of Law or, In the Alternative, a New Trial* (D.I. 386) Motion to Strike 386 Reply Brief, *Motion by Plaintiffs' to Strike Reply Brief in Support of MEMC's Renewed Motion for Judgment as a Matter of Law or, In the Alternative, a New Trial* (D.I. 386) filed by Commissariat a LEnergie Atomique, SOITEC Silicon on Insulator Technologies SA, SOITEC U.S.A., Inc..Answering Brief/Response due date per Local Rules is Feb. 25, 2011. (Attachments: # 1 Certificate of Service)(Kraft, Denise) (Entered: Feb. 8, 2011).

Declaration re 391 Opening Brief in Support,, *Declaration of Marcus T. Hall in Support of Plaintiffs' Opening Brief in Support of Motion to Strike Reply Brief in Support of MEMC's Renewed Motion for Judgment as a Matter of Law or, In the Alternative, a New Trial* (D.I. 386) by Commissariat a LEnergie Atomique, SOITEC Silicon on Insulator Technologies SA, SOITEC U.S.A., Inc.. (Attachments: # 1 Exhibit A, # 2 Certificate of Service)(Kraft, Denise) (Entered: Feb. 8, 2011).

Redacted Version of 389 Reply Brief, *Redacted Version of Reply Brief in Support of Plaintiffs' Motion for Injunctive Relief and to Lift Stay on Damages Discovery* by Commissariat a LEnergie Atomique, SOITEC Silicon on Insulator Technologies SA, SOITEC U.S.A., Inc.. (Kraft, Denise) (Entered: Feb. 9, 2011).

Answering Brief in Opposition re 390 Motion to Strike 386 Reply Brief, *Motion by Plaintiffs' to Strike Reply Brief in Support of MEMC's Renewed Motion for Judgment as a Matter of Law or, In the Alternative, a New Trial* (D.I. 386) Motion to Strike 386 Reply Brief, *Motion by Plaintiffs' to Strike Reply Brief in Support of MEMC's*

*Renewed Motion for Judgment as a Matter of Law or, In the Alternative, a New Trial* (D.I. 386) filed by MEMC Electronic Materials Inc..Reply Brief due date per Local Rules is Feb. 28, 2011. (Attachments: # 1 Exhibit 1-3, # 2 Certificate of Service)(Rogowski, Patricia) (Entered: Feb. 18, 2011).

Reply Brief re 390 Motion to Strike 386 Reply Brief, *Motion by Plaintiffs' to Strike Reply Brief in Support of MEMC's Renewed Motion for Judgment as a Matter of Law or, In the Alternative, a New Trial* (D.I. 386) Motion to Strike 386 Reply Brief, *Motion by Plaintiffs' to Strike Reply Brief in Support of MEMC's Renewed Motion for Judgment as a Matter of Law or, In the Alternative, a New Trial* (D.I. 386) filed by Commissariat a LEnergie Atomique, SOITEC Silicon on Insulator Technologies SA, SOITCE U.S.A., Inc.. (Attachments: # 1 Certificate of Service)(Kraft, Denise) (Entered: Feb. 28, 2011).

French Preliminary Search Report, dated Feb. 17, 2010—(2 pgs).

Gomes, et al., "*Preparation of Silica-Based Hybrid Materials by Gamma Irradiation*"—Nuclear Instruments and Methods in Physics Research B 248 (2006)—(pp. 291-296).

Bruel, M., "*Silicon on Insulator Material Technology*"—Electronics Letters. vol. 31—No. 14 (Jul. 6,1995) (pp. 1201-1202).

Feijoo, et al., "*Prestressing of Bonded Wafers*"—Proceedings of the First International Symposium on: Semiconductor Wafer Bonding: Science, Technology, and Applications—Electronics and Dielectric Science and Technology Divisions—Proceedings vol. 92-7—Copyright 1992 by The Electrochemical Society, Inc., (pp. 228-238).

Feng, et al., "*Generalized Formula for Curvature Radius and Layer Stresses Caused by Thermal Strain in Semiconductor Multilayer Structures*"—*J. Appl. Phys 54* —(Jan. 1, 1983)—© 1983 American Institute of Physics (pp. 83-85).

* cited by examiner

METHOD OF TRANSFERRING A THIN LAYER ONTO A TARGET SUBSTRATE HAVING A COEFFICIENT OF THERMAL EXPANSION DIFFERENT FROM THAT OF THE THIN LAYER

RELATED APPLICATIONS

This application claims the benefit of priority to French Patent Application No. 0954126, filed Jun. 18, 2009, which is incorporated by reference herein.

FIELD OF THE INVENTION

The invention concerns the transfer of a thin layer from a source substrate onto a target substrate having a coefficient of thermal expansion significantly different from that of the source substrate.

BACKGROUND

A conventional method for such layer transfer is known as the "Smart Cut™" method; it consists mainly in carrying out the following steps (see in particular the French Patent Application No. FR-2 681 472 or its equivalent U.S. Pat. No. 5,374,564 and its various developments and improvements):

creation by ionic implantation of a buried weakened zone within the source substrate, delimiting with the free surface the future thin layer to be transferred, assembly of the source substrate and the target substrate at said free surface, and input of thermal and/or mechanical energy to provoke a fracture in the weakened zone within the source substrate.

During fabrication by this "Smart Cut™" method of a heterostructure (in particular, a structure made up of at least two different materials, generally in a plurality of layers, and having a thickness typically between 1 µm and 1 cm inclusive), control of internal stresses is very important if the materials of the heterostructure have significantly different coefficients of thermal expansion and it is required to induce the fracture at a temperature significantly different from that at which bonding was effected (for example when it is required to use a heat treatment to induce some or all of the fracture in the weakened zone).

For example, in the case of the transfer of a film of silicon from a source substrate (of which at least a surface portion is in silicon) onto a target substrate the coefficient of thermal expansion of which is very different from that of the silicon source substrate (for example a fused silica target substrate), the two solid substrates are conventionally bonded at room temperature, for example by molecular bonding. When, to transfer the film, the choice is made to use an input of thermal energy, it is known that the bonding interface is then consolidated; however, this heat treatment also has the effect that internal stresses, which can be very high, are generated as a consequence of the difference between the coefficients of expansion on either side of this bonding interface; it follows from this that when the transfer of the silicon film is effected (in particular, when the fracture induced by the "Smart Cut™" method occurs), the two substrates (or a portion of the two substrates if the fracture does not extend over the whole area of the substrates) are brutally separated and then immediately relax. This stress jump, if it is of too high a magnitude, risks damaging one or the other of the two parts of the heterostructure separated in this way (formed, in the example considered here, by the silica substrate carrying the transferred thin film of silicon and the silicon substrate in which the fracture has been provoked).

There would be a benefit in being able to minimize the stress jump that occurs on the separation of a heterostructure at a temperature different from its creation temperature.

To minimize any such stress jump, thought may be given to creating the heterostructure at a higher temperature, preferably at least approximately at the temperature at which the fracture is subsequently to be provoked. However, when the heterostructure is produced by molecular bonding, the bonding energy decreases greatly when bonding above 200° C., although this is a low temperature at which application of the "Smart Cut™" technology can prove difficult, simply by input of thermal energy, in a silicon/fused silica system, for example (to transfer a silicon film onto a fused silica substrate); it follows from this that, when it is required to provoke fracture only by input of thermal energy, it is required in practice to proceed at a temperature much higher than 200° C. Now, if the bonding energy is too low, the stresses of thermal origin can be sufficient to provoke unsticking of the structure at the interface (rather than in the weakened zone) or at least lead to poor functioning of the "Smart Cut™" technology: the bonding interface may then not withstand the vertical pressure imposed by the development of microcavities that this method generates (on this subject see "Silicon on insulator material technology", M. Bruel, Electron. Lett. Vol. 31-No. 14 (1995) p. 1201).

To minimize the stress jump it has already been proposed to bond the parts of the heterostructure under conditions such that the stress regime at the interface falls below a given threshold when this heterostructure is brought to the temperature at which it is wished to provoke the fracture in a weakened zone in one of the wafers near the bonding interface. Thus French Patent Application No. FR-2 848 336 or its equivalent U.S. Patent Publication No. 2006/0205179 proposes to effect the bonding of two wafers that have been subject beforehand to deformation. To be more precise, the above document teaches imposing a stress on the wafers at the moment of bonding at room temperature by bending the two plates before molecular bonding; if the curvature is carefully chosen, it is possible to minimize or even to eliminate internal stresses generated by thermal annealing of the heterostructure at the fracture temperature. However, to enable separation by the "Smart Cut™" method during thermal annealing of short duration, this method generally calls for bonding the structures with fairly high radii of curvature which, from the technological point of view, can prove relatively difficult to achieve on an industrial scale; moreover, the conditions of the future fracture must be known at the time that bonding is effected. On the other hand, this technology has the advantage that the molecular bonding can be effected at room temperature and thus makes it possible to have a good bonding energy at the moment of the transfer.

It follows from this that it is therefore possible to transfer a thin layer at a temperature as high as may be required from one of the wafers to the other wafer, the fracture occurring in the weakened zone previously formed, whereas the bonding interface between this thin layer and the wafer to which it is henceforth fixed can have a high bonding energy. It must nevertheless be noted that, on returning to room temperature, the thin layer may be stressed in traction or in compression because its coefficient of thermal expansion is different from that of the wafer to which it has been firmly attached by molecular bonding; because the target wafer is in practice more solid than the thin layer, it is hardly deformed when the temperature changes after fracture, imposing a change in the dimensions of the thin layer because of the change of temperature.

This kind of phenomenon had already been exploited in the case of a homostructure (in particular, a structure formed of layers or substrates in the same material); Feijoo et al. have proposed to impose a stress within a homostructure at room temperature by application of a deformation just before the formation of this homostructure by bonding (see D. Feijoo, I. Ong, K. Mitani, W. S. Yang, S. Yu and U. M. Gösele, "Prestressing of bonded wafers", Proceedings of the 1st international symposium on semiconductor wafer bonding, Science, Technology and Applications, Vol. 92-7, The Electrochemical Society (1992) p. 230). To be more precise, in the above paper, a homostructure consists of two silicon wafers that are bonded with a certain radius of curvature (the paper states that the plates are bonded and unbonded several times during deformation). The authors propose thinning one of the silicon crystals thereafter at room temperature by mechanical means (lapping) so as to be able to impose a high stress in the thinned silicon film after return of the other plate to a plane shape.

It should be noted that the above document does not envisage obtaining the thin layer by fracture within one of the plates of the homostructure; a fortiori, the above document does not address in any way the problem of the separation of a heterostructure at a temperature different from the creation temperature (in fact, there would have been no particular problem with regard to a homostructure, since there is no thermal effect on the stress state at the interface).

SUMMARY

An object of the invention is to minimize the stress jump between two substrates during transfer of a thin layer from one of the substrates to the other by fracture in a previously weakened zone, even by simple input of thermal energy, at any temperature, without having to provide for stressing by deformation at the moment of bonding between the two substrates. It is evident that it might be of benefit to be able to proceed to the assembly by bonding at any temperature, for example at room temperature, and thus without having to sacrifice the bonding energy level, without having to impose deformation beforehand, and thus for example flat, and without having to know in advance the conditions of the future fracture effecting the transfer.

To this end, the invention proposes a method of transferring a thin layer from a source substrate of which a surface layer along a free surface is in a first material to a target substrate of which at least one surface layer along a free surface is in a second material different from the first material, wherein:

there is formed within the surface layer of the source substrate a weakened zone delimiting with its free surface a future thin layer, the free surface of the source substrate is assembled to the free surface of the target substrate in a stack of alternating layers formed of the first and second materials so that there are layers of the first and second materials on either side of the interface formed by the assembly of said free surfaces brought into intimate contact, the cumulative thickness of the layers of the first material situated on a first side of this interface being equal to the cumulative thickness of the layers of this first material situated on the other side of this interface and the cumulative thickness of the layers of the second material situated on this first side of the interface being equal to the cumulative thickness of the layers of this second material situated on the other side of this interface, the layers having thicknesses at least equal to 50 microns and at least equal to 1000 times the depth at which the weakened zone is formed, fracture in the weakened zone is provoked by input of at least partially thermal energy to detach the thin layer.

It is to be noted that the invention minimizes the stress jump that occurs during fracture in the weakened zone without seeking to minimize the stresses in the heterostructure; in contrast to the prior art solution that sought to minimize the stress regime on respective opposite sides of the weakened zone at the moment of fracture, the invention aims to generate stresses which are substantially the same before and after fracture: there is therefore no sudden variation of stress during fracture; it is the sharp variations of stress that are liable to degrade the layers of the heterostructure, not the absolute value of the stress.

According to preferred features of the invention, where appropriate in combination:

said stack is produced from a material such that each of the two parts situated on either side of the interface has a plane of symmetry parallel to said interface;

said stack is formed only of layers formed of one or the other of the first and second materials;

one of the parts of the stack includes between two other layers of the second material having substantially equal thicknesses a layer of the first material having a thickness substantially equal to twice the thickness of these other layers and the other part of the stack includes between two other layers formed of the first material having substantially equal thicknesses a layer of the second material having a thickness substantially equal to twice the thickness of these other layers;

the first part includes a double layer of the first material sandwiched between two identical layers of the second material and the other part includes a double layer of the second material sandwiched between two identical layers of the first material;

after fracture in the weakened zone, separation is provoked at a bonding interface within the part to which the thin layer has been transferred;

separation is provoked at an interface with a lower bonding energy formed within the assembly; it may be noted that the fact that this detachment is not effected on the side of the transferred film has the benefit that there is no risk of damage (in contrast to mechanical transfer);

the part of the stack the thin layer of which has been separated is used in a new stack after forming a new weakened zone delimiting with the free surface liberated by the fracture a future thin layer;

the weakened zone is formed by ionic implantation;

the first material is silicon.

BRIEF DESCRIPTION OF DRAWING

Objects, features and advantages of the invention emerge from the following description, given by way of illustrative and nonlimiting example with reference to the appended drawings, in which.

DETAILED DESCRIPTION

Figure 1:
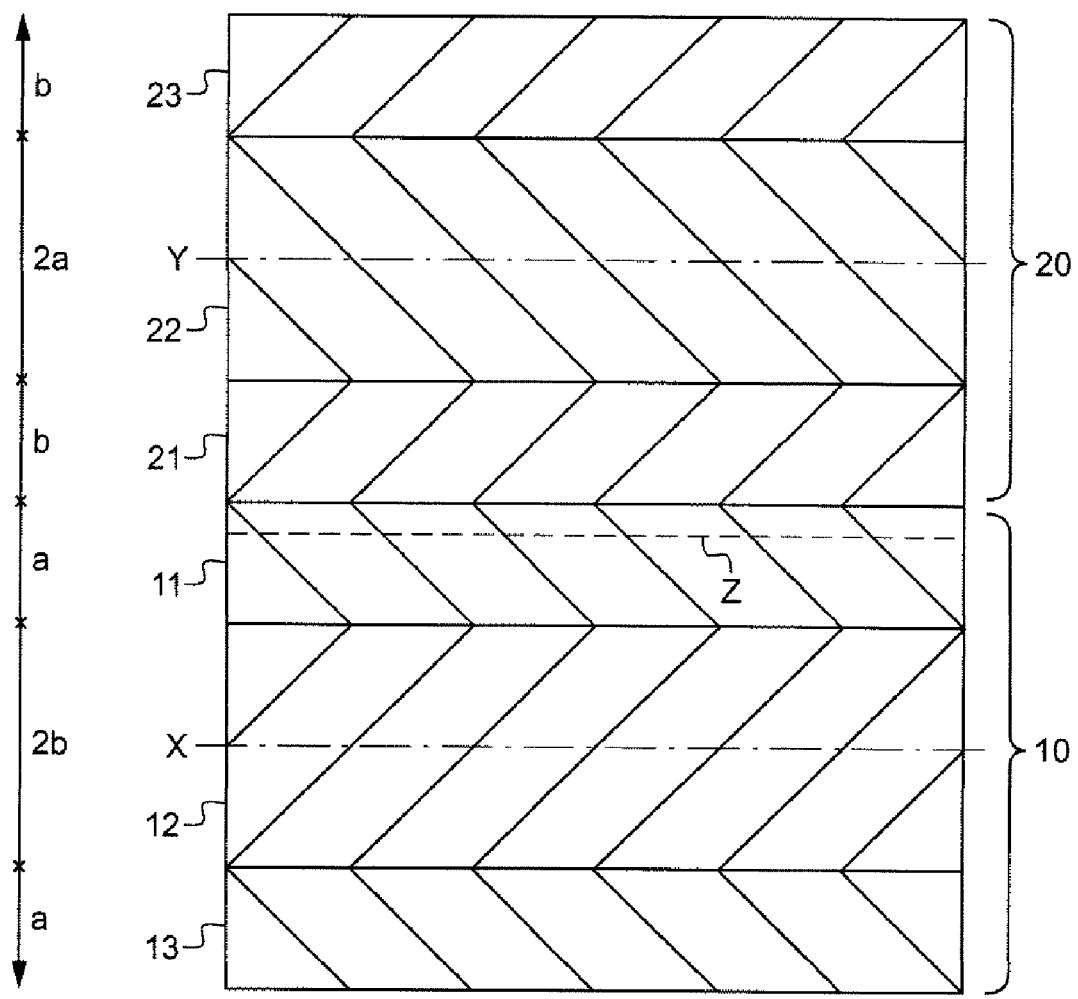
FIG. 1 is a diagram representing a stack of a first embodiment of the invention.
Figure 2:
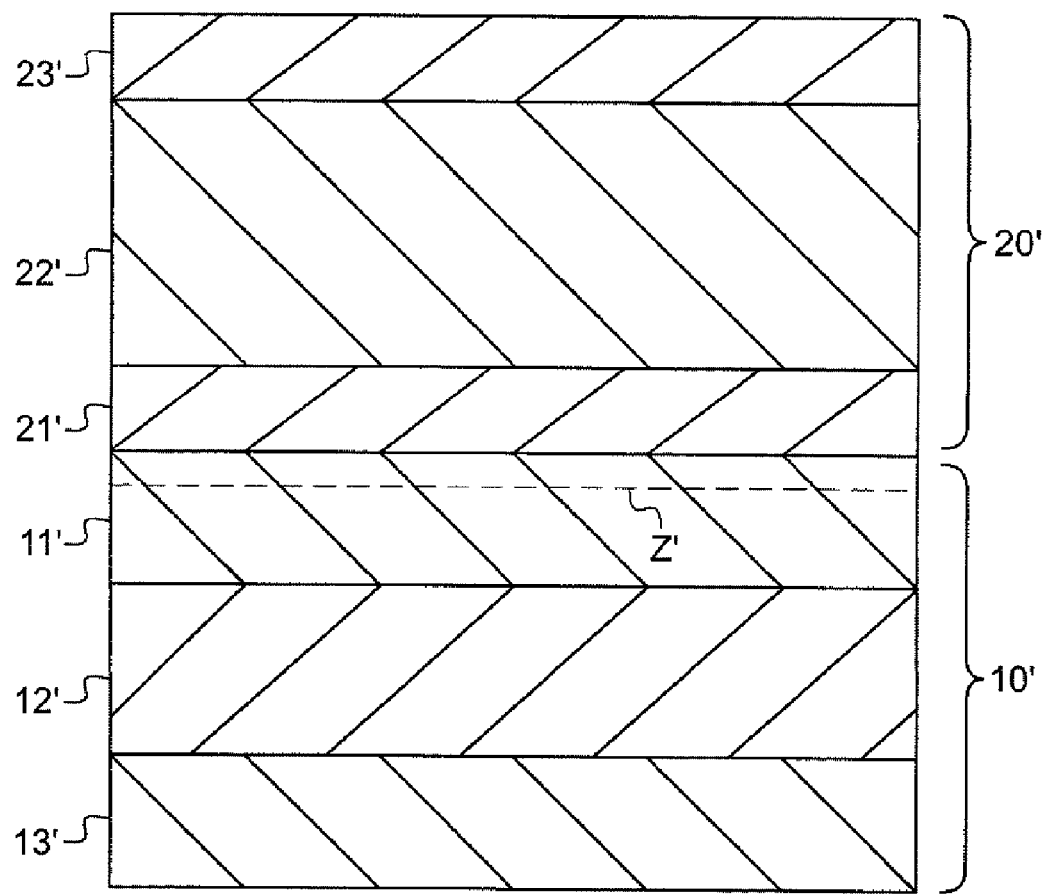
FIG. 2 is a diagram representing a stack of a second embodiment of the invention, FIG. 3 consists of graphs representing the evolution of the stresses in the layers of the FIG. 1 part of the stack, above the weakened zone, as a function of temperature before and then after fracture, FIG. 4 consists of graphs representing the evolution of the stresses in the layers of the FIG. 1 part of the stack, below the weakened zone, as a function of temperature before and then after fracture, FIG. 5 consists of graphs representing the evolution of the stresses on either side of the source substrate on top of which is a target substrate to which a thin layer of the source substrate must be transferred as a function of temperature before and then after fracture, and FIG. 6 consists of graphs representing the evolution of the stresses on either side of the target substrate to which the thin layer from FIG. 5 must be transferred as a function of temperature before and then after fracture.

FIGS. 1 and 2 represent two examples of stacks making it possible, according to the invention, to proceed reliably to the transfer, by input of at least partially thermal energy, of a thin layer from a target substrate to a source substrate, even when the substrates have significantly different coefficients of thermal expansion.

It is in fact clear that when two layers of different materials are bonded to each other and are then subjected to the input of thermal energy, this input of thermal energy generates, at the level of and parallel to the bonding interface, tensile stresses in the surface layer the coefficient of thermal expansion of which is lower and compressive stresses in the surface layers of the other layer the coefficient of thermal expansion of which is higher (the layer that expands more tends to stretch the one that expands less, and the latter tends to prevent the natural expansion of this layer that expands more).

As these two embodiments show, the invention aims to enable transfer of a thin layer from a first layer in a first material to another layer in a second material, these first and second materials having significantly different coefficients of thermal expansion and these layers being situated in a median position of the stack concerned. These stacks are not designed to minimize the stresses existing along the surfaces freed by the fracture at the level of a weakened zone within the first layer, but to reduce the variations at the moment of fracture of the stresses existing locally on either side of this weakened zone. In other words, the invention aims to reduce the stress jumps occurring at the moment of fracture at the same time as accepting the existence of these stresses at a non-negligible level.

These stacks are produced at any temperature relative to the temperature at which it is intended to provoke the fracture; the simplest way is to proceed at room temperature. Furthermore, no prestressing is intentionally applied to the layers of this stack at the moment of their assembly by bonding. Since the layers are in practice plane, the assembly is in practice carried out flat.

In the FIG. 1 example, the objective is to transfer a thin layer from a source layer 11 in a material A to a target layer 21 in a material B. Each of these layers has a free surface and the thin layer is to be transferred from one of these layers to the other after the respective free surfaces of these layers have been brought into intimate contact. These layers have a thickness of at least 50 microns, preferably at least 100 microns (they are thus not thin layers, but rather layers commonly referred to as "thick" layers).

Beforehand, a weakened layer Z has been produced at a chosen distance below the surface of the layer 11 which is then brought into intimate contact with a surface of the layer 21. This weakened layer is typically produced by implantation (in practice by ionic bombardment) of one or more species, notably implantation of hydrogen, helium, or even other gases or heavier elements. The chosen distance between the free surface of the target layer and the weakened zone is in practice at most equal to $1/100^{th}$ of the thickness of that layer; the future thin layer (which is delimited between this surface and this weakened zone) preferably has a thickness of at most $1/1000^{th}$ of that of the layer. FIG. 1 does not conform to this ratio for obvious reasons of legibility.

The layer 11 can be merely a surface layer of a source substrate formed of at least one other underlying layer; likewise, the layer 21 can be merely a surface layer of a target substrate formed of at least one other higher layer.

According to the invention, before the separation step during which fracture is to be provoked in the weakened layer Z, the source substrate and the target substrate are assembled at their free surfaces within a stack of alternate layers formed of the first or the second material such that, on either side of the interface formed by bringing the free surfaces into intimate contact:

the cumulative thickness of layers formed of the first material are substantially equal, the cumulative thickness of the layers formed of the second material are substantially equal.

This stack is advantageously such that each of the two parts of the stack situated on either side of the interface between the layers 11 and 21 has a plane of symmetry diagrammatically represented by the chain-dotted lines X-X and Y-Y.

There can be thin intermediate layers between the layers in material A or material B, but the stack is preferably formed only of layers formed of one or the other of these materials A and B (if there are intermediate attachment layers, their cumulative thickness does not represent more than 1% of the total thickness of the stack).

To be more precise, it is clear from FIG. 1 that the stack is formed: of a lower part 10 formed of the layer 11 in material A on top of a layer 12 in material B on top of a layer 13 in material A, the layer 12 having a thickness twice that of the layer 11 and the layer 13 having the same thickness as the layer 11, an upper part 20 formed of the layer 21 in material B on top of which is a layer 22 in material A on top of which is a layer 23 formed of the material B, the thickness of the layer 22 being twice that of the layer 21 and the layer 23 having the same thickness as this layer 21.

As a result, the layer 11 from which it is wished to transfer a thin layer to the layer 21 is sandwiched between layers (12 and 21) in material B and the layer 21 is also sandwiched between layers (11 and 22). It follows from this that, during a temperature variation after assembly, each of the layers 11 and 21 is loaded in a similar manner along its upper and lower faces, whence an approximately homogeneous stress field.

It follows from this that during a heat treatment applied after assembly is advantageously effected at room temperature the stresses existing in the layer 11 on either side of the weakened zone Z are similar, with the result that the fracture does not involve any stress jump in the two parts of the layer 11 separated by the fracture of sufficient magnitude to be liable to degrade one of these parts.

It may be noted that if the mechanical calculations developed by Z-C Feng et al. (Zhe-Chuan Feng and Hong-du Liu J; Appl. Phys. 54 (1), 1983, p. 83 "Generalized formula for curvature radius and layer stresses caused by thermal strain in semiconductor multilayer structures"), it is possible to predict the stresses that will appear within the layers 10+20 of the stack (forming a heterostructure) before and after separation by fracture in the weakened zone.

It may be noted that the stack may be considered to be formed of a stack of four pairs of layers A-B (starting from the bottom, the FIG. 1 stack can in fact be described as being the succession of a pair A-B, a pair B-A, a pair B-A and then a pair A-B).

In the FIG. 1 stack the layers 11 and 21 (and thus the layers 13 and 23) have equal thickness a=b, and the layers 12 and 22 have equal thicknesses 2a=2B, the breakdown into pairs A-B corresponds to pairs of layers of the same thickness and the stack may be represented as the assembly of a lower sub-stack ABBA and an upper stack BAAB, and the fracture in the weakened layer leads to the formation of a lower assembly ABBA' and an upper assembly aBAAB (A' representing what remains of the layer 11 after separation of the thin layer "a").

The invention nevertheless applies also to the case of layers having different thicknesses, as shown diagrammatically in FIG. 2 where the thickness b is ⅔ the thickness a. Designating the layers by the same references as in FIG. 1 with the addition of a "prime" suffix, it is found that the upper intermediate layer 22' has a thickness that is three times the thickness of the layer 21' or 23' and the intermediate layer 12' has a thickness hardly greater than that of the layer 11' or 13'.

The aforementioned calculations nevertheless make it possible to verify that, even with such a difference, stress fields are produced enabling fracture without stress jumps of great magnitude at the moment of fracture.

Figure 3:
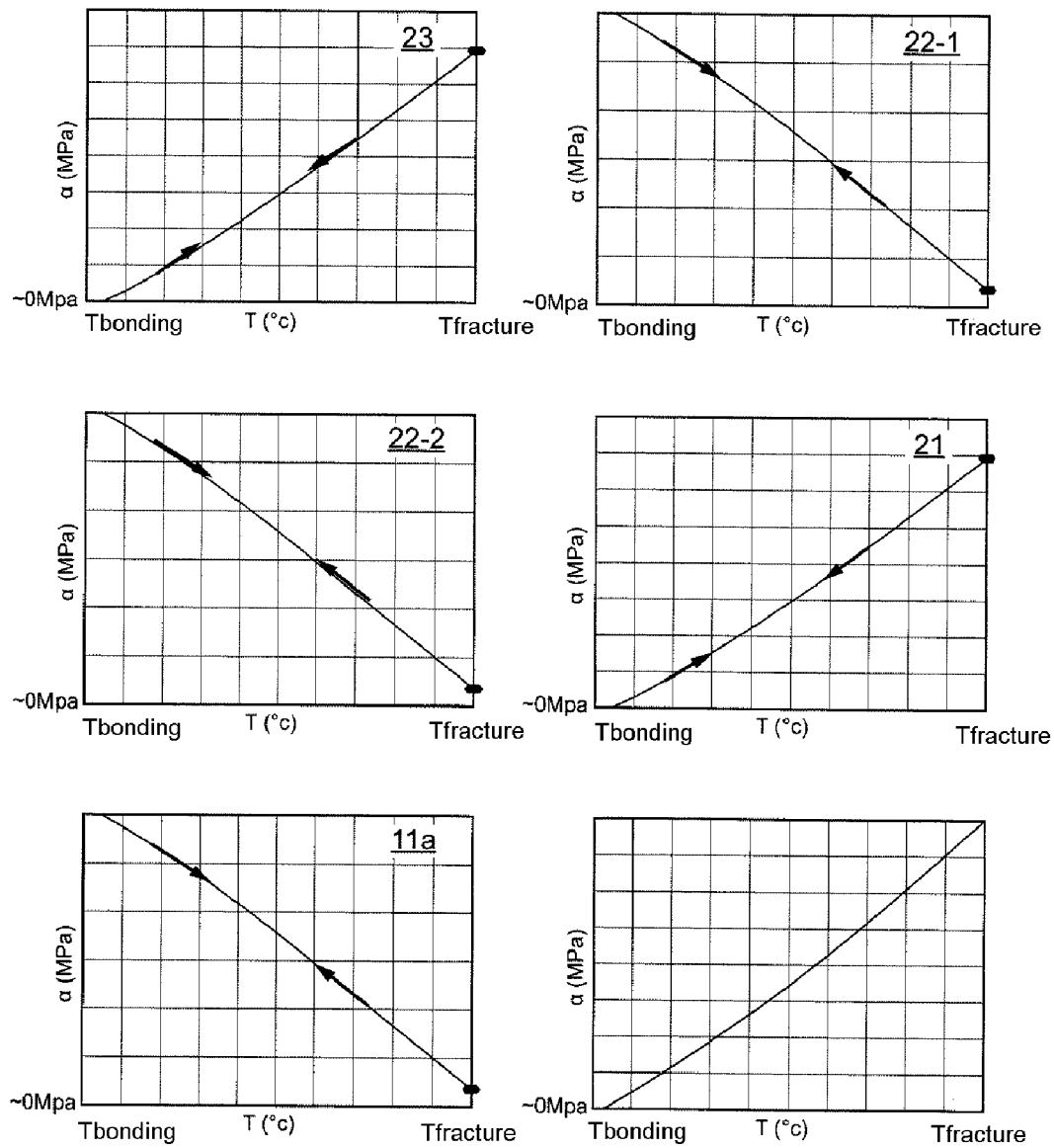
Figure 4:
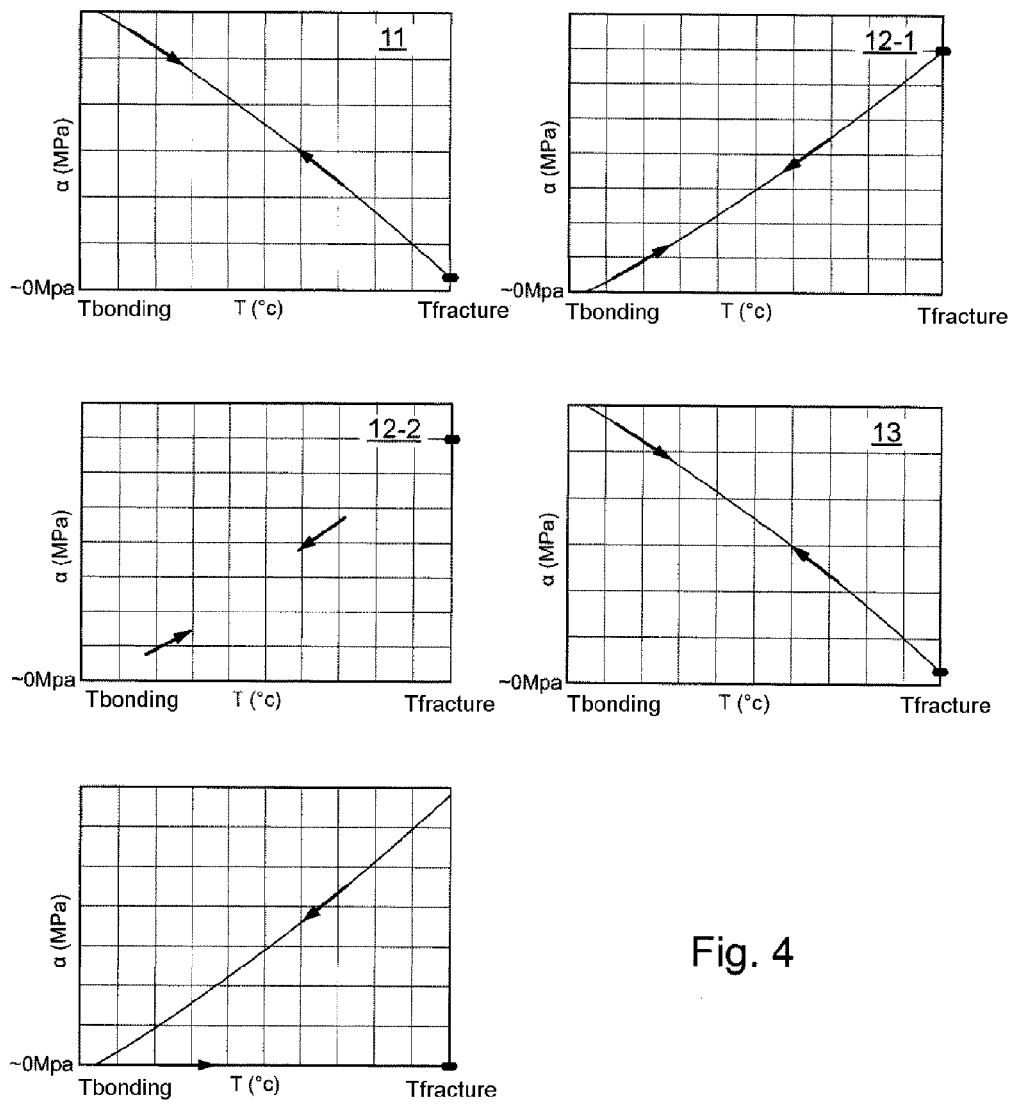

FIGS. 3 and 4 represent curves of variation of the stress within the various layers after assembly at room temperature during the increase in temperature for fracture heat treatment (the fracture is represented diagrammatically by an asterisk on the right-hand side of the frames of these curves) and then during return to room temperature.

To be more precise, FIG. 3 groups curves corresponding to each of the layers of the upper part of the FIG. 1 stack, starting from the top, in the case where the intermediate layer 22 is itself formed of two identical layers 22-1 and 22-2, and with the transferred thin layer 11a.

As for FIG. 4, it groups curves corresponding to each of the layers of the lower part of the FIG. 1 stack, starting from the layer 11, in the case where the intermediate layer 12 is itself formed of two identical layers 12-1 and 12-2.

These curves are calculated in the following case:
the layers 11, 13, 22-1 and 22-2 are in silicon and have thicknesses equal to 750 microns,
the layers 21, 23 and 12-1 and 12-2 are in fused silica and have thicknesses of 1200 microns.

It is seen that, because the silicon expands more than the fused silica, a rise in temperature generates, parallel to the interface between the layers, tensile stressing of the silica by the silicon and therefore compressive stressing of the silica by the silicon; in other words, the silica layers are the seat of positive (tension) stresses along similar well-defined curves within the layers 23, 21, 12-1 and 12-2; in contrast, the silicon layers are the seat of negative (compression) stresses along similar well-defined curves within the layers 22-1, 22-2, 11a, 11 and 13.

The arrows directed toward the right indicate the direction of travel of the curves during an increase in temperature and the arrows directed toward the left indicate the direction of travel of the same curves during cooling; it is seen that the same curves are traveled in the heating direction and during cooling although fracture has occurred at the maximum temperature with separation of the structure into two sub-structures.

In fact, the stresses are not exactly identical within the layers because a film is taken off one of the substrates, which very slightly unbalances the two sub-structures, with the result that there is a small stress jump on fracture in the weakened zone of the layer 11; however, in the example considered of an alternation of silicon and silica layers and a thin layer with a thickness of less than $1/1000^{th}$ of the thickness of the silicon and silica layers, the jump is only of the order of 0.1 MPa, which does not degrade the layers (including the thin layer) at the time of fracture. This jump also influences slightly the evolution of the sag of each structure, but this changes very little (less than 0.5 micron).

It is interesting to note that the layers of the stack remain substantially plane during temperature variations, including during fracture, which facilitates manipulation of the layers separately or in combination (as and when they are assembled) during these heat treatments.

As mentioned hereinabove, the source substrate can consist of the layer 11 alone or be formed of the layers 11 and 12-1 or even layers 11 and 12 or layers 11, 12 and 13. Likewise, the target substrate can consist of the layer 21 alone, the layers 21 and 22-2 or even the layers 21 and 22 or the layers 21, 22 and 23. It is clear that in each case it is possible, possibly by adding layers, to produce the FIG. 1 (or FIG. 2) stack as a function of the relative thicknesses of the layers.

In the case where, after transfer and fracture, it is required to recover the target substrate with the transferred layer, it is useful to be able to detach the layer(s) added to this target substrate to form the stack.

To this end, this starting target substrate is advantageously assembled to the adjacent layer necessary for forming the required stack with a reduced bonding energy imparted to the bonding interface, for example by roughening one or both of the surfaces assembled in this way. Consequently, after cooling of the assembly 11a-21-22-23 obtained after fracture, detachment at the reduced energy interface can easily be obtained, for example by inserting a blade into the interface to be freed; it is to be noted that, if this is done at room temperature, there is no stress jump at the moment of detachment. If, on the other hand, the choice is made to effect such detachment at a temperature different from room temperature (thus at a temperature different from that at which the stack was produced), the stress jump, if any, generated will have no significant consequence for the thin layer since this stress jump, if any, will take place at a face of the target substrate opposite the transferred thin layer. It may be noted that since the low-energy bonding is effected at a distance from the weakened zone, the rupture can be effectively localized to this weakened zone, provided that the low-energy bonding is nevertheless sufficient to resist the overall stresses generated at the various interfaces during the heat treatment.

In fact, detachment at the aforementioned bonding interface can be controlled under good conditions even if the bonding energy is not to be downgraded, since mechanical detachment remains possible up to high bonding energies such as 0.5 J/m².

As for the lower part of the stack, including the source substrate, it can be re-used directly to transfer a new thin layer from the layer 11 by bonding it to a target substrate analogous to the starting one, after further weakening treatment, and adding to it the part of the stack that has been detached at the aforementioned bonding level.

As has also been mentioned, it is possible for attachment of the layers formed of the materials A and B to be facilitated by the interposition of attachment layers. This remains entirely valid provided that the cumulative thickness of the intermediate layers not formed of A or B remains less than about 0.1% of the thickness of the layer concerned.

Clearly the advantages of the invention are retained when it is wished to provoke the fracture by application of mechanical energy (fluid, blade, vibrations, ultrasound), as well as heat treatment.

Figure 5:
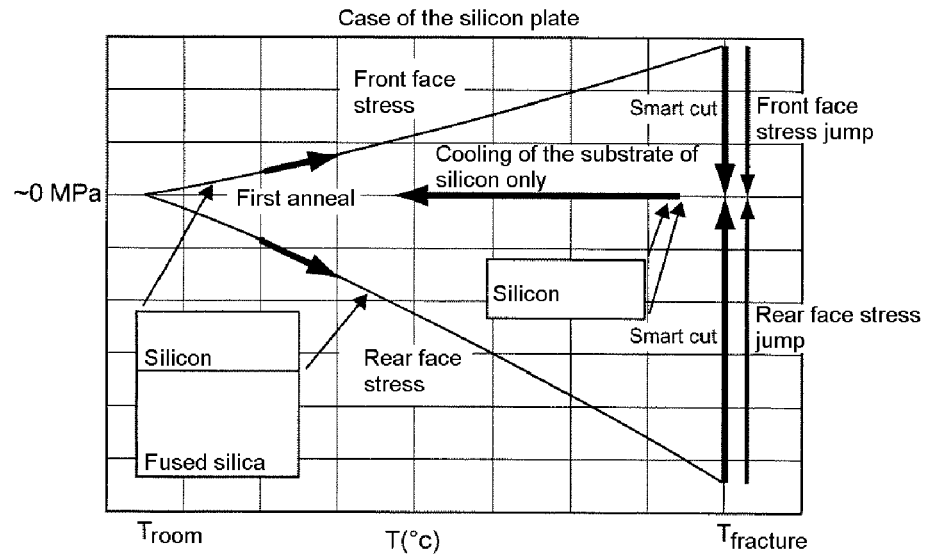
Figure 6:
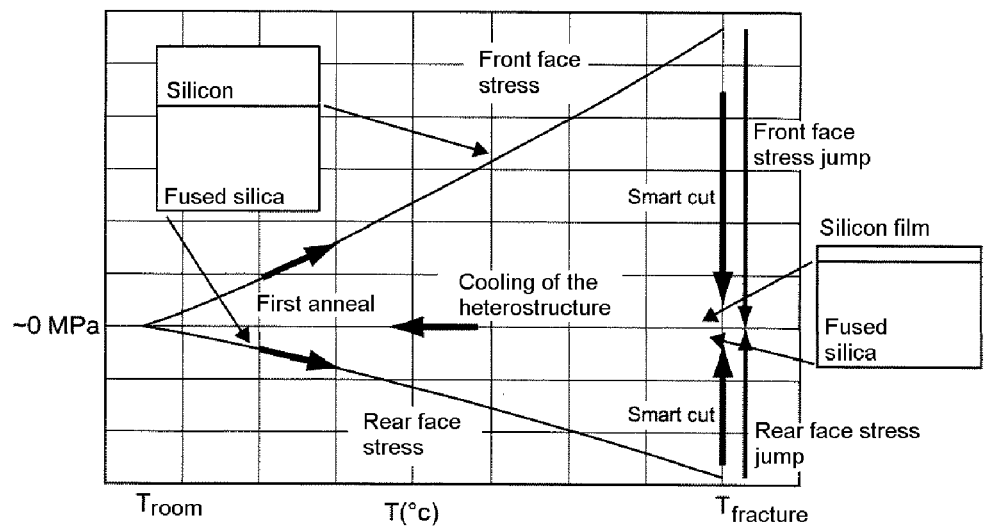

FIGS. 5 and 6 represent, by way of comparison, curves representing the variations of the stresses along the opposed faces of a source layer and a target layer similar to the aforementioned layers 11 and 21 alone, in the absence of the additional layers 12 and 13, on the one hand, and 22 and 23, on the other hand.

Clearly the advantages of the invention may be obtained even in the event of a slight departure from the aforementioned dimensional conditions; thus some of these advantages are preserved up to differences of some 20% of the recommended thicknesses.

EXAMPLE

Layers of silicon and fused silica are used.

Four silicon substrates and four fused silica substrates are prepared by preparing the two surfaces of each substrate for molecular bonding. The two faces of one of the silicon substrates are roughened by chemical treatment with SCI (H2O/H2O2/NH4OH solution, in relative proportions 5-1-1) for 20 minutes at 70° C. The rear face of this substrate is then polished so that the bonding energy on the rear face is not downgraded.

Another silicon substrate is implanted with hydrogen ions at a dose of $6.10^{16}$ at/cm² and at an energy of 76 keV. A stack B-A-A(rough)-B-A(implanted)-B-B-A is then constructed by successive molecular bonding.

An annealing treatment is applied for one hour at 500° C., which provokes separation of the assembly into two structures, respectively B-A-A(rough)-B-a(film of A) and A(less the thin layer)-B-B-A.

The required final product B-a is then detached by inserting a blade at the level of the previously roughened bonding interface of A(rough) and B-a. The FIGS. 3 and 4 curves correspond to calculations corresponding to the example described above, taking:

Young's modulus of silicon: 130 GPa
Young's modulus of silica: 70 GPa
Poisson's coefficient of silicon: 0.3
Poisson's coefficient of silica: 0.17
thickness of each layer of silicon: 750 microns
thickness of each layer of silica: 1200 microns
coefficient of thermal expansion of silica: $0.55.10^{-6}$
coefficient of thermal expansion of Si: varying between $2.4 \cdot 10^{-6}$ and $4.2 \cdot 10^{-6}$ along an increasing curve with the concave side facing down and toward the right, as indicated in the literature.

The invention claimed is:

1. A method of transferring a thin layer from a source substrate to a target substrate, wherein the source substrate includes a surface layer along a free surface thereof, the surface layer comprising a first material, and wherein the target substrate includes at least one surface layer along a free surface thereof, the one surface layer comprising a second material different from the first material, the method comprising:

forming within the surface layer of the source substrate a weakened zone delimiting a thin layer with respect to the free surface;

assembling the free surface of the source substrate with the free surface of the target substrate in a stack of alternating layers comprising the first and second materials so that layers of the first and second materials are on either side of an interface formed by bringing the free surfaces into intimate contact, wherein a cumulative thickness of the layers of the first material on a first side of the interface is substantially equal to a cumulative thickness of the layers of the first material on an opposite side of the interface and a cumulative thickness of the layers of the second material on the first side of the interface is substantially equal to a cumulative thickness of the layers of the second material on the opposite side of the interface, each of the alternating layers having thicknesses of at least 50 microns and at least 1000 times the depth at which the weakened zone is formed in the surface layer; and applying at least partially thermal energy to fracture the weakened zone and to detach the thin layer.

2. The method according to claim 1, wherein the alternating layers on one side of the interface comprise a first part, and the alternating layers on the opposite side of the interface comprise a second part, and wherein the stack of alternating layers is produced from a combination of materials, such that each of the first and second parts have a plane of symmetry parallel to the interface.

3. The method according to claim 1, wherein the alternating layers on one side of the interface comprise a first part, and the layers on an opposite side of the interface comprise a second part, and wherein one of the first and second parts of the stack comprises two layers of the second material having substantially equal thicknesses with a layer of the first material between the two layers and having a thickness substantially equal to twice the thickness of the two layers of the second material, and the other of the first and second parts of the stack comprises two layers of the first material having substantially equal thicknesses with a layer of the second material between the two layers of the first material and having a thickness substantially equal to twice the thickness of the two layers of the first material.

4. The method according to claim 3, wherein the first part includes a double layer of the first material sandwiched between two identical layers of the second material and the second part includes a double layer of the second material sandwiched between two identical layers of the first material.

5. The method according to claim 1, wherein, after fracturing the weakened zone, a separation is provoked at a bonding interface within the stack of alternating layers associated with the target substrate.

6. The method according to claim 5, wherein separation is provoked at an interface with a low bonding energy formed within the stack of alternating layers.

7. The method according to claim 5, wherein the stack of alternating layers associated with the source substrate is used in a new stack after forming a new weakened zone delimited with respect a free surface liberated by detaching the thin layer.

8. The method according to claim 1, wherein forming the weakened zone comprises performing ionic implantation.

9. The method according to claim 1, wherein the first material comprises silicon.

10. A method of transferring a thin layer from a source substrate to a target substrate, wherein the source substrate includes a surface layer along a free surface thereof, the surface layer comprising a first material, and wherein the target substrate includes at least one surface layer along a free surface thereof, the one surface layer comprising a second material different from the first material, the method comprising:

forming within the surface layer of the source substrate a weakened zone delimiting a thin layer with respect to the free surface;

assembling the free surface of the source substrate with the free surface of the target substrate in a stack of alternating layers comprising the first and second materials so that layers of the first and second materials are on either side of an interface formed by bringing the free surfaces into intimate contact, wherein a cumulative thickness of the layers of the first material on a first side of the interface is substantially equal to a cumulative thickness of the layers of the first material on an opposite side of the interface and a cumulative thickness of the layers of the second material on the first side of the interface is substantially equal to a cumulative thickness of the layers of the second material on the opposite side of the interface, each of the alternating layers having thicknesses of at least 50 microns and at least 1000 times the depth at which the weakened zone is formed in the surface layer; and applying at least partially thermal energy to fracture the weakened zone and to detach the thin layer, wherein the stack of alternating layers comprises only layers formed of one or the other of the first and second materials.

* * * * *